(12) United States Patent
Kitagawa

(10) Patent No.: US 10,319,844 B2
(45) Date of Patent: Jun. 11, 2019

(54) SEMICONDUCTOR DEVICE

(71) Applicant: KABUSHIKI KAISHA TOSHIBA, Minato-ku, Tokyo (JP)

(72) Inventor: Mitsuhiko Kitagawa, Ishikawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 51 days.

(21) Appl. No.: 15/446,642

(22) Filed: Mar. 1, 2017

(65) Prior Publication Data

US 2018/0083129 A1  Mar. 22, 2018

(30) Foreign Application Priority Data

Sep. 16, 2016 (JP) .................. 2016-182065

(51) Int. Cl.
*H01L 21/74* (2006.01)
*H01L 29/06* (2006.01)
(Continued)

(52) U.S. Cl.
CPC ........ *H01L 29/7395* (2013.01); *H01L 21/743* (2013.01); *H01L 29/0696* (2013.01); *H01L 29/083* (2013.01); *H01L 29/0804* (2013.01); *H01L 29/0813* (2013.01); *H01L 29/0821* (2013.01); *H01L 29/1004* (2013.01); *H01L 29/1095* (2013.01); *H01L 29/36* (2013.01);
(Continued)

(58) Field of Classification Search
CPC ............. H01L 29/0813; H01L 29/7395; H01L 29/7397
See application file for complete search history.

(56) References Cited

U.S. PATENT DOCUMENTS 5,381,026 A   1/1995  Shinohe et al.
6,153,495 A   11/2000 Kub et al.
(Continued)

FOREIGN PATENT DOCUMENTS

JP   2002-334993 A   11/2002
JP   2008-300474 A   12/2008
(Continued)

*Primary Examiner* — Amar Movva
(74) *Attorney, Agent, or Firm* — Foley & Lardner LLP

(57) ABSTRACT

A semiconductor device includes a first electrode, a first semiconductor region disposed on and electrically connected to the first electrode, a second semiconductor region disposed on the first semiconductor region and having a carrier concentration lower than that of the first semiconductor region, a third semiconductor region disposed on the second semiconductor region, a fourth semiconductor region disposed on the third semiconductor region, a fifth semiconductor region disposed on the second semiconductor region and separated from the third semiconductor region in a direction, a gate electrode disposed on the second semiconductor region, facing the third semiconductor region via an insulating layer in the direction and positioned between the third and fourth semiconductor regions, a second electrode disposed on and electrically connected to the fourth semiconductor region, and a third electrode disposed on the fifth semiconductor region, separated from the second electrode, and electrically connected to the fifth semiconductor region.

5 Claims, 57 Drawing Sheets

(51) Int. Cl.
*H01L 29/08* (2006.01)
*H01L 29/10* (2006.01)
*H01L 29/36* (2006.01)
*H01L 29/40* (2006.01)
*H01L 29/66* (2006.01)
*H01L 29/78* (2006.01)
*H01L 29/94* (2006.01)
*H01L 29/739* (2006.01)

(52) U.S. Cl.
CPC ...... *H01L 29/407* (2013.01); *H01L 29/66181* (2013.01); *H01L 29/7397* (2013.01); *H01L 29/7813* (2013.01); *H01L 29/945* (2013.01)

(56) References Cited

U.S. PATENT DOCUMENTS

| | | | |
|---|---|---|---|
| 6,323,509 B1 | 11/2001 | Kusunoki | |
| 6,844,592 B2 | 1/2005 | Yamaguchi et al. | |
| 7,307,312 B2 | 12/2007 | Suzuki et al. | |
| 7,872,282 B2 | 1/2011 | Iwamoto et al. | |
| 8,395,230 B2 | 3/2013 | Hozumi et al. | |
| 8,581,298 B2 | 11/2013 | Kitagawa | |
| 8,860,171 B2 | 10/2014 | Kitagawa | |
| 9,024,382 B2 | 5/2015 | Kitagawa | |
| 9,178,028 B2 | 11/2015 | Kitagawa | |
| 2008/0315297 A1 | 12/2008 | Takashita et al. | |
| 2012/0267680 A1* | 10/2012 | Oya | H01L 29/0696 257/139 |
| 2015/0021656 A1* | 1/2015 | Kitagawa | H01L 29/0834 257/139 |

FOREIGN PATENT DOCUMENTS

| | | |
|---|---|---|
| JP | 2010-225833 A | 10/2010 |
| JP | 2010-251517 A | 11/2010 |
| JP | 4725040 B2 | 7/2011 |
| JP | 2011-176249 A | 9/2011 |
| JP | 5251102 B2 | 7/2013 |
| JP | 2015-033198 A | 2/2015 |

* cited by examiner

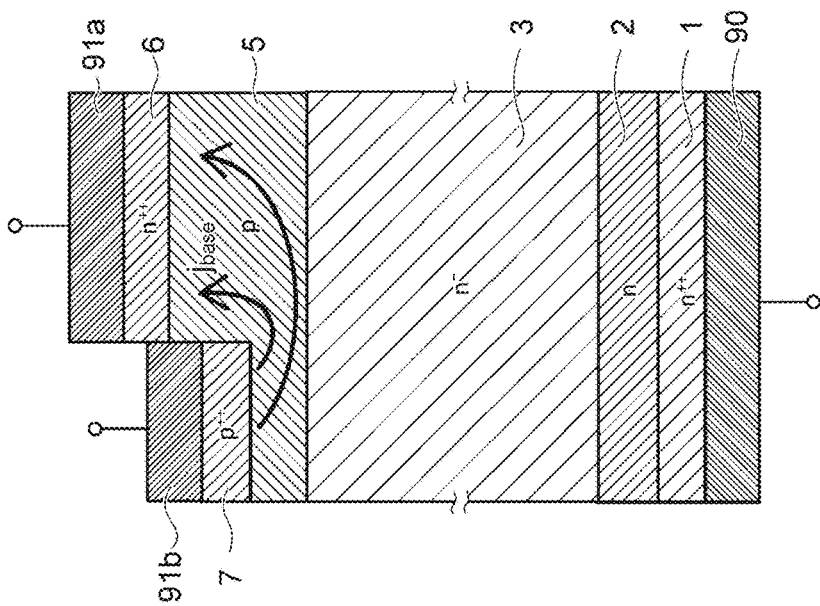
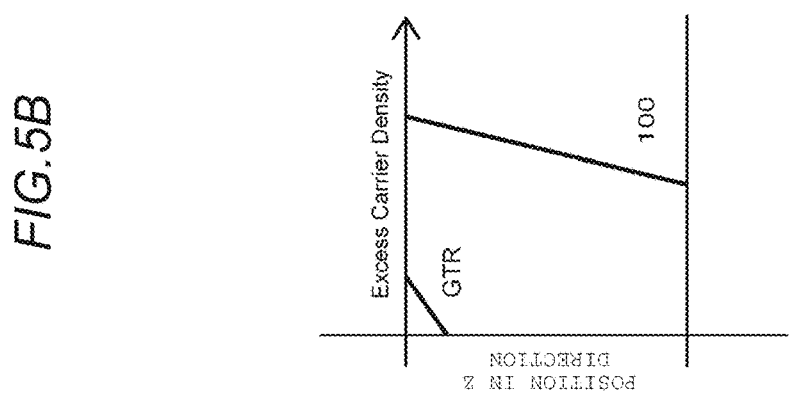
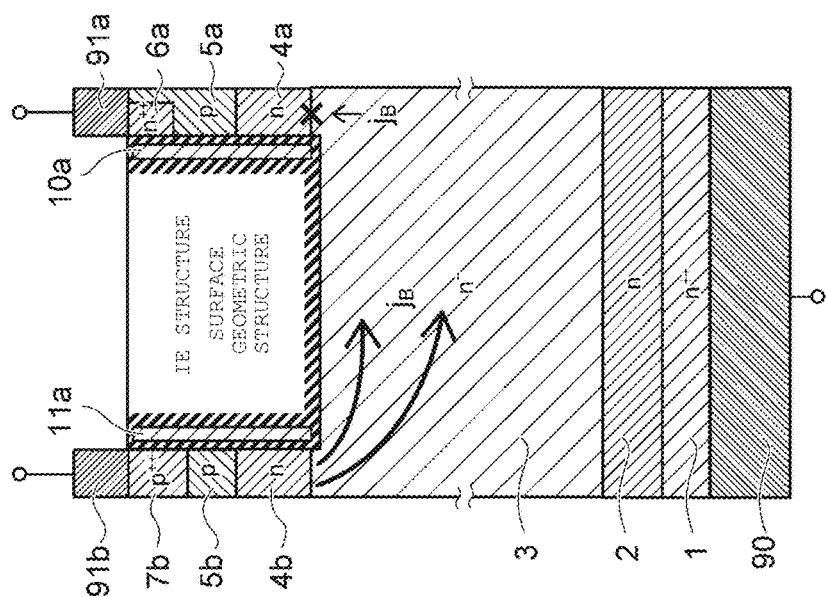

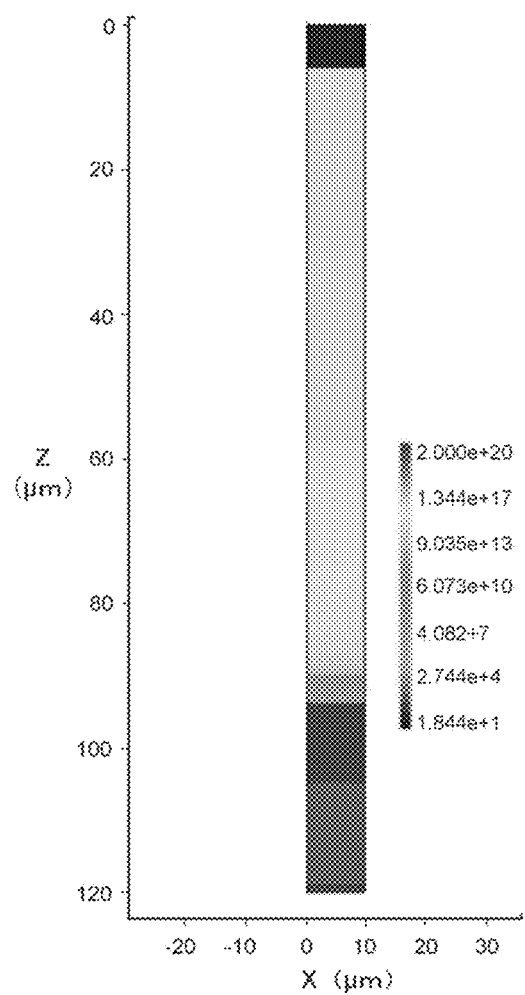
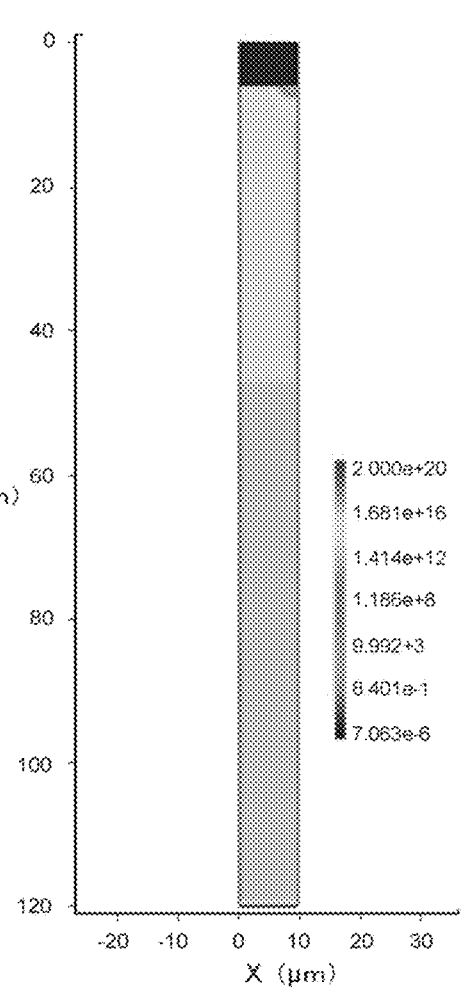
FIG. 11A — HOLE CONCENTRATION FOR FORWARD DIRECTION (Vd = 3V)
FIG. 11B — HOLE CONCENTRATION FOR REVERSE DIRECTION (Vd = -3V)

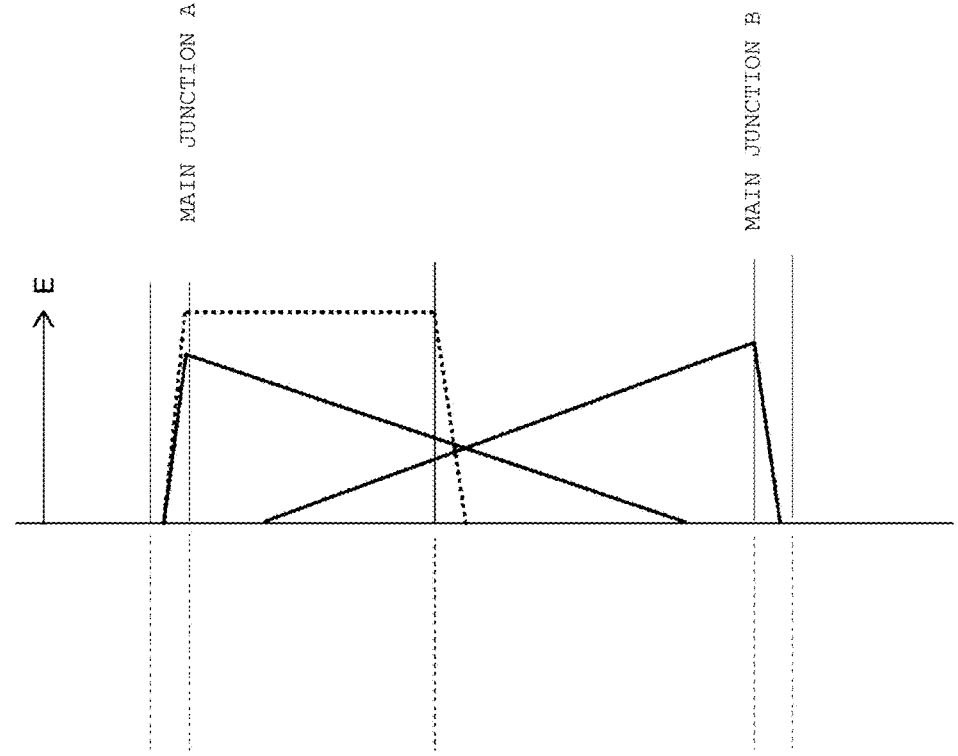
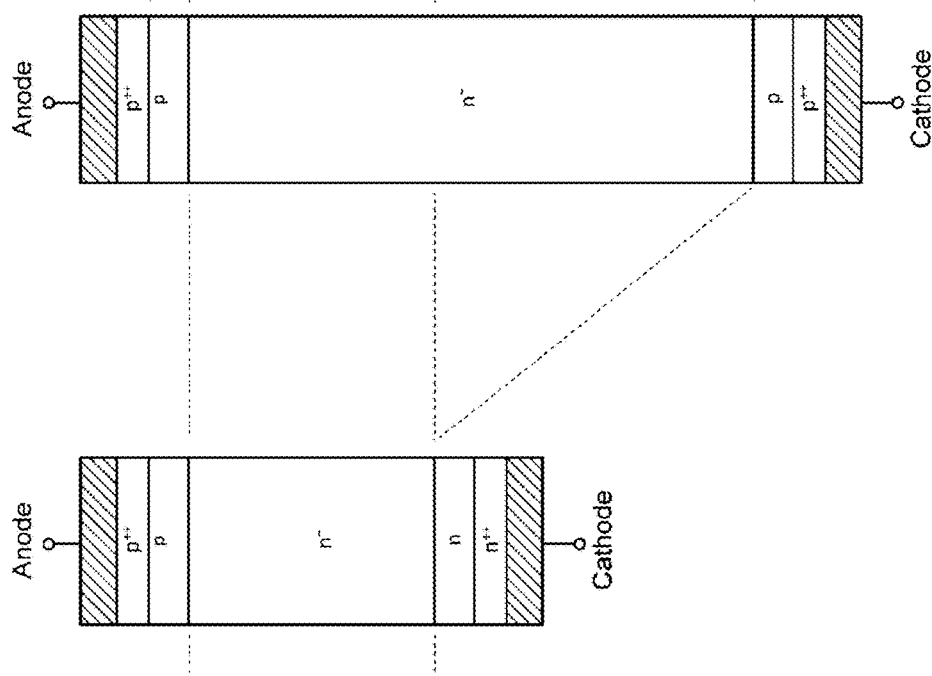
FIG. 30A
FIG. 30B
FIG. 30C

SEMICONDUCTOR DEVICE

CROSS-REFERENCE TO RELATED APPLICATION

This application claims the benefit of and priority to Japanese Patent Application No. 2016-182065, filed Sep. 16, 2016, the entire contents of which are incorporated herein by reference.

FIELD

Embodiments described herein relate generally to a semiconductor device.

BACKGROUND

In recent years, a metal-oxide-semiconductor field-effect transistor (MOSFET), an insulated gate bipolar transistor (IGBT), an injection enhanced gate transistor (IEGT), and the like are used as semiconductor devices for power control. The MOSFET is a unipolar-type semiconductor device using either electrons or holes as carriers, and accordingly, there is no built-in potential therein in a conduction direction. For this reason, while the MOSFET can be electrically conducted even with an applied voltage lower than that of a bipolar-type semiconductor device such as the IGBT or IEGT, the conduction capability thereof is lower than that of the bipolar-type semiconductor device.

SUMMARY

In some embodiments according to one aspect, A semiconductor device may include a first electrode, a first semiconductor region of a first conductivity type, a second semiconductor region of the first conductivity type, a third semiconductor region of a second conductivity type, a fourth semiconductor region of the first conductivity type, a second electrode, a fifth semiconductor region of the second conductivity type, a third electrode, and a first gate electrode. The first semiconductor region may be disposed on the first electrode and may be electrically connected to the first electrode. The second semiconductor region may be disposed on the first semiconductor region and have a carrier concentration of the first conductivity type lower than a carrier concentration of the first semiconductor region. The third semiconductor region may be disposed on the second semiconductor region. The fourth semiconductor region may be disposed on the third semiconductor region. The second electrode may be disposed on the fourth semiconductor region and may be electrically connected to the fourth semiconductor region. The fifth semiconductor region may be disposed on the second semiconductor region and may be separated from the third semiconductor region in a first direction. The third electrode may be disposed on the fifth semiconductor region, may be separated from the second electrode, and may be electrically connected to the fifth semiconductor region. The first gate electrode may be disposed on the second semiconductor region, face the third semiconductor region via a first gate insulating layer in the first direction, and may be positioned between the third semiconductor region and the fifth semiconductor region.

In some embodiments according to another aspect, a semiconductor device may include a first semiconductor region of a first conductivity type, a second semiconductor region of a second conductivity type, a third semiconductor region of the first conductivity type, a first electrode, a second electrode, a third electrode, a fourth semiconductor region of the second conductivity type, a fifth semiconductor region of the first conductivity type, a first gate electrode, a second gate electrode, a sixth semiconductor region of the second conductivity type, a seventh semiconductor region of the first conductivity type, a sixth semiconductor region of the second conductivity type, and a third gate electrode. The second semiconductor region may be disposed on the first semiconductor region. The third semiconductor region of the first conductivity type may be selectively disposed on the second semiconductor region. The first electrode may be disposed on the third semiconductor region and may be electrically connected to the second semiconductor region and the third semiconductor region. The fourth semiconductor region may be disposed on the first semiconductor region and may be separated from the second semiconductor region in a first direction. The fifth semiconductor region may be selectively disposed on the fourth semiconductor region. The second electrode that may be disposed on the fifth semiconductor region, may be separated from the first electrode, and may be electrically connected to the fourth semiconductor region and the fifth semiconductor region. The first gate electrode may be disposed on the first semiconductor region and face the second semiconductor region via a first gate insulating layer in the first direction. The second gate electrode may be disposed between the fourth semiconductor region and the first gate electrode and face the fourth semiconductor region via a second gate insulating layer. The sixth semiconductor region may be disposed under the first semiconductor region. The seventh semiconductor region may be selectively disposed under the sixth semiconductor region. The third electrode may be disposed under the seventh semiconductor region and may be electrically connected to the sixth semiconductor region and the seventh semiconductor region. The third gate electrode may be disposed under the first semiconductor region and face the sixth semiconductor region via a third gate insulating layer in the first direction.

In some embodiments according to still another aspect, a semiconductor device may include a first semiconductor region of a first conductivity type, a second semiconductor region of a second conductivity type, a plurality of first gate electrodes, a plurality of third semiconductor regions, a first electrode, a second electrode, a third electrode, a fourth semiconductor region of the first conductivity type, a second gate electrode, a fifth semiconductor region of a second conductivity type, a fourth electrode, a sixth semiconductor region of the second conductivity type, a fifth electrode and a sixth electrode. The second semiconductor region may be disposed on the first semiconductor region. The plurality of first gate electrodes may be disposed in the first semiconductor region and in the second semiconductor region via a first gate insulating layer. The plurality of third semiconductor regions may be disposed on the second semiconductor region and face the plurality of first gate electrodes via the first gate insulating layer. The first electrode may be disposed on the second semiconductor region and a part of the plurality of third semiconductor regions and may be electrically connected to the part of the plurality of third semiconductor regions. The second electrode may be disposed on the second semiconductor region and another part of the plurality of third semiconductor regions, may be separated from the first electrode, and may be electrically connected to the another part of the plurality of third semiconductor regions. The third electrode may be disposed on the second semiconductor region and further another part of the plurality of third semiconductor regions, may be separated from the first electrode and the second electrode, and may be electrically connected to the further another part of the plurality of third semiconductor regions. The fourth semiconductor region of the first conductivity type may be disposed under the first semiconductor region and may have a carrier concentration of the first conductivity type higher than a carrier concentration of the first semiconductor region. The second gate electrode may be disposed in the first semiconductor region and in the fourth semiconductor region via a second gate insulating layer and may be positioned under the first electrode. The fifth semiconductor region may be disposed under the fourth semiconductor region and face the second gate electrode via the second gate insulating layer. The fourth electrode may be disposed in the first semiconductor region and in the fourth semiconductor region via a first insulating layer and may be positioned under the second electrode. The sixth semiconductor region may be disposed under the fourth semiconductor region and face the fourth electrode via the first insulating layer. The fifth electrode may be disposed in the first semiconductor region and in the fourth semiconductor region via a second insulating layer and may be positioned under the third electrode. The sixth electrode may be disposed under the fourth semiconductor region, the fifth semiconductor region, and the sixth semiconductor region and may be electrically connected to the fourth semiconductor region, the fifth semiconductor region, and the sixth semiconductor region.

Other aspects and embodiments of the disclosure are also encompassed. The foregoing summary and the following detailed description are not meant to restrict the disclosure to any particular embodiment but are merely meant to describe some embodiments of the disclosure.

DESCRIPTION OF THE DRAWINGS

FIG. 5A is a cross-sectional view that illustrates a part of the semiconductor device according to some embodiments, FIG. 5B illustrates graphs for a comparison of an excess carrier concentration in the semiconductor device according to some embodiments and a semiconductor device according to a reference example, and FIG. 5C is a cross-sectional view that illustrates a part of the semiconductor device according to the reference example.

FIG. 11A and FIG. 11B are simulation results that illustrate hole concentrations in an ON state in a case where the semiconductor device according to some embodiments is electrically conducted in a forward direction and a reverse direction.

FIG. 30A, FIG. 30B, and FIG. 30C are diagrams that illustrates a cross-sectional structure and a breakdown voltage of the semiconductor device according to the reference example.

DETAILED DESCRIPTION

Figure 1:
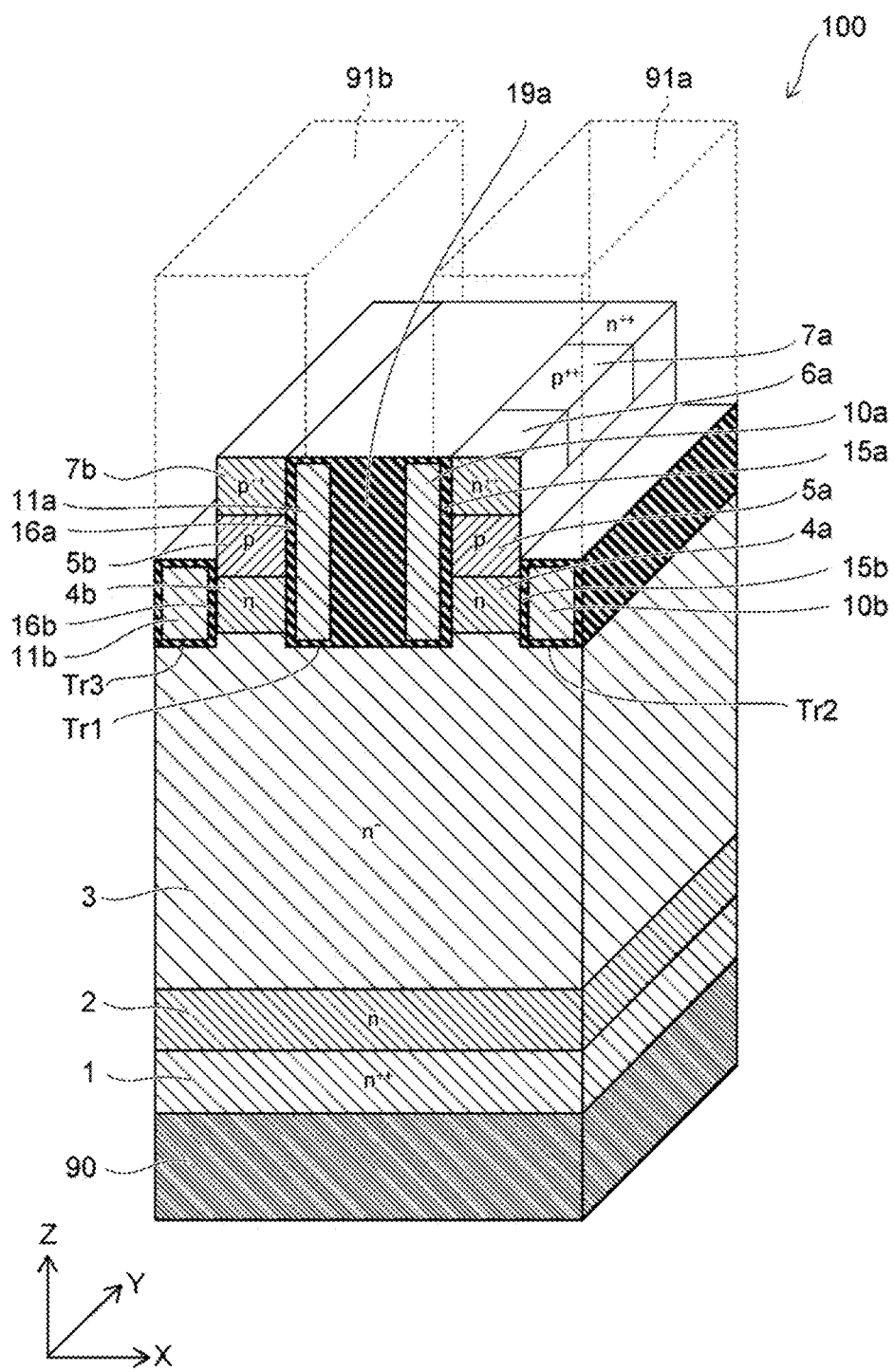
FIG. 1 is a perspective cross-sectional view that illustrates a part of a semiconductor device according to some embodiments.

An example embodiment provides a semiconductor device capable of improving a conduction capability.

According to one embodiment, a semiconductor device may include a first electrode, a first semiconductor region of a first conductivity type, a second semiconductor region of the first conductivity type, a third semiconductor region of a second conductivity type, a fourth semiconductor region of the first conductivity type, a second electrode, a fifth semiconductor region of the second conductivity type, a third electrode, and a first gate electrode. The first semiconductor region may be disposed on the first electrode and is electrically connected to the first electrode. The second semiconductor region may be disposed on the first semiconductor region. A carrier concentration of the first conductivity type of the second semiconductor region may be lower than a carrier concentration of the first conductivity type of the first semiconductor region. The third semiconductor region may be disposed on the second semiconductor region. The fourth semiconductor region may be disposed on the third semiconductor region. The second electrode may be disposed on the fourth semiconductor region and may be electrically connected to the fourth semiconductor region. The fifth semiconductor region may be disposed on the second semiconductor region and may be separated from the third semiconductor region in a first direction. The third electrode may be disposed on the fifth semiconductor region and may be separated from the second electrode. The third electrode may be electrically connected to the fifth semiconductor region. The first gate electrode may be disposed on the second semiconductor region. The first gate electrode may face the third semiconductor region via a first gate insulating layer in the first direction. The first gate electrode may be positioned between the third semiconductor region and the fifth semiconductor region.

Hereinafter, embodiments of the present disclosure will be descried with reference to the drawings.

Here, the drawings are schematic or conceptual ones, and the relation between the thickness and the width of each portion, the ratio between the sizes of portions, and the like are not the same as those of practical applications.

In addition, even in a case where the same portion is illustrated, the dimension or the ratio thereof may be differently illustrated in the drawings. In the present disclosure and the drawings, a same reference sign is assigned to an element that is similar to that described in advance, and detailed description thereof will not be presented as appropriate.

In the description of each embodiment, an XYZ orthogonal coordinate system will be used. A direction from a collector electrode 90 (or 90a) toward an emitter electrode 91 (or 91a) will be set as a Z direction, and two directions that are perpendicular to the Z direction and are orthogonal to each other will be set as an X direction (as a first direction) and a Y direction (as a second direction). By perpendicular or orthogonal, the terms can refer to precisely 90° as well as a range of variation of less than or equal to ±5° relative to 90°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element.

In description presented below, notations $n^{++}$, $n^+$, n, and $n^-$ and $p^{++}$, $p^+$, p, and $p^-$ represent relative impurity (or dopant) concentrations in each conductivity type. In other words, a notation to which "+" is attached represents an impurity (or dopant) concentration relatively higher than that to which none of "+" and "−" is attached, and a notation to which "−" is attached represents an impurity concentration relatively lower than that to which none thereof is not attached. In addition, a notation to which multiple "+"s are attached represents a higher impurity concentration as the number thereof is increased.

In each embodiment described below, p-type and n-type semiconductor regions may be inverted.

FIG. 1 is a perspective cross-sectional view that illustrates a part of a semiconductor device 100 according to some embodiments. In FIG. 1, an emitter electrode 91a (or a cathode 91a) and a current gate electrode 91b (e.g., an anode 91b) are illustrated as being transmitted.

As illustrated in FIG. 1, the semiconductor device 100 includes: an $n^{++}$ type collector region 1, an n-type barrier region 2, an $n^-$ type semiconductor region 3, n-type barrier regions 4a and 4b, a p-type base region 5a, a p-type anode region 5b, $n^{++}$ type contact regions 6a and 6b, $p^{++}$ type contact regions 7a and 7b, gate electrodes 10a, 10b, 11a, and 11b, gate insulating layers 15a, 15b, 16a, and 16b, a collector electrode 90; an emitter electrode 91a, and a current gate electrode 91b.

In some embodiments, on a rear surface of the semiconductor device 100, the collector electrode 90 is disposed. In some embodiments, the $n^{++}$ type collector region 1 is disposed on the collector electrode 90 and is electrically connected to the collector electrode 90.

In some embodiments, the n-type barrier region 2 is disposed on the $n^{++}$ type collector region 1.

In some embodiments, the $n^-$ type semiconductor region 3 is disposed on the n-type barrier region 2.

In some embodiments, the n-type barrier region 4a is disposed on a part of the $n^-$ type semiconductor region 3.

In some embodiments, the p-type base region 5a is disposed on the n-type barrier region 4a.

In some embodiments, the $n^{++}$ type contact region 6a and the $p^{++}$ type contact region 7a are selectively disposed on the p-type base region 5a.

In some embodiments, the emitter electrode 91a is in contact with an upper surface and one side surface of the $n^{++}$ type contact region 6a, an upper surface and one side surface of the $p^{++}$ type contact region 7a, and one side surface of the p-type base region 5a and is electrically connected to such semiconductor regions.

In some embodiments, the gate electrodes 10a and 10b are disposed on the $n^-$ type semiconductor region 3 respectively via the gate insulating layers 15a and 15b. In some embodiments, a length of the gate electrode 10b in the Z direction is shorter than a length of the gate electrode 10a in the Z direction. In some embodiments, the n-type barrier region 4a and the p-type base region 5a are positioned between the gate electrodes 10a and 10b in the X direction and respectively face the gate electrodes 10a and 10b via the gate insulating layers 15a and 15b.

In some embodiments, the n-type barrier region 4b is disposed on another part of the $n^-$ type semiconductor region 3 and is separated from the n-type barrier region 4a in the X direction.

In some embodiments, the p-type anode region 5b is disposed on the n-type barrier region 4b.

In some embodiments, the $p^{++}$ type contact region 7b is disposed on the p-type anode region 5b.

In some embodiments, the current gate electrode 91b is in contact with an upper surface and one side surface of the $p^{++}$ type contact region 7b and one side surface of the p-type anode region 5b and is electrically connected to such semiconductor regions.

In some embodiments, the gate electrodes 11a and 11b are disposed on the $n^-$ type semiconductor region 3 respectively via the gate insulating layers 16a and 16b. In some embodiments, a length of the gate electrode 11b in the Z direction is shorter than a length of the gate electrode 11a in the Z direction. In some embodiments, the n-type barrier region 4b and the p-type anode region 5b are positioned between the gate electrodes 11a and 11b in the X direction and respectively face the gate electrodes 11a and 11b via the gate insulating layers 16a and 16b.

In some embodiments, between the gate electrodes 10a and 10b and the emitter electrode 91a, the gate insulating layers 15a and 15b are respectively disposed, and such electrodes are separated from each other. Similarly, in some embodiments, between the gate electrodes 11a and 11b and current gate electrode 91b, the gate insulating layers 16a and 16b are respectively disposed, and such electrodes are separated from each other.

In some embodiments, the gate electrode 10a is positioned between the n-type barrier region 4a and the p-type base region 5a and the gate electrode 11a in the X direction. In some embodiments, the gate electrode 11a is positioned between the n-type barrier region 4b and the p-type anode region 5b and the gate electrode 10a in the X direction. In some embodiments, between the gate electrodes 10a and 11a, an insulating part 19a id disposed, and the gate electrodes 10a and 11a are separated from each other in the X direction.

In some embodiments, the n-type barrier region 4a and the p-type base region 5a are disposed between a trench Tr1 having the gate electrodes 10a and 11a, the gate insulating layers 15a and 16a, and the insulating part 19a disposed therein and a trench Tr2 having the gate electrode 10b and the gate insulating layer 15b disposed therein. In some embodiments, the n-type barrier region 4b and the p-type anode region 5b are disposed between the trench Tr1 and a trench Tr3 in which the gate electrode 11b and the gate insulating layer 16b are disposed.

In some embodiments, the n-type barrier regions 4a and 4b, the p-type base region 5a and the p-type anode region 5b, the $p^{++}$ type contact regions 7b, and the gate electrodes 10a to 11b extend in the Y direction. In some embodiments, the $n^{++}$ type contact region 6a and the $p^{++}$ type contact region 7a are alternately disposed on the p-type base region 5a in the Y direction.

In the semiconductor device 100, for example, the structure illustrated in FIG. 1 is repetitively disposed in the X direction.

Next, an example of the material of each constituent element will be described.

In some embodiments, the $n^{++}$ type collector region 1, the n-type barrier region 2, the $n^-$ type semiconductor region 3, the n-type barrier regions 4a and 4b, the p-type base region 5a and the p-type anode region 5b, the $n^{++}$ type contact regions 6a and 6b, and the $p^{++}$ type contact regions 7a and 7b contain silicon or silicon carbide as a semiconductor material. In a case where silicon is used as the semiconductor material, arsenic, phosphorus, or antimony may be used as an n-type impurity and boron may be used as a p-type impurity.

In some embodiments, the gate electrodes 10a to 11b contain a conductive material such as polysilicon.

In some embodiments, the gate insulating layers 15a to 16b and the insulating part 19a contain an insulating material such as silicon oxide.

In some embodiments, the collector electrode 90, the emitter electrode 91a, and the current gate electrode 91b contain a metal such as aluminum.

Next, the operation of the semiconductor device 100 according to some embodiments and problems solved thereby and effects thereof will be described.

Figure 2:
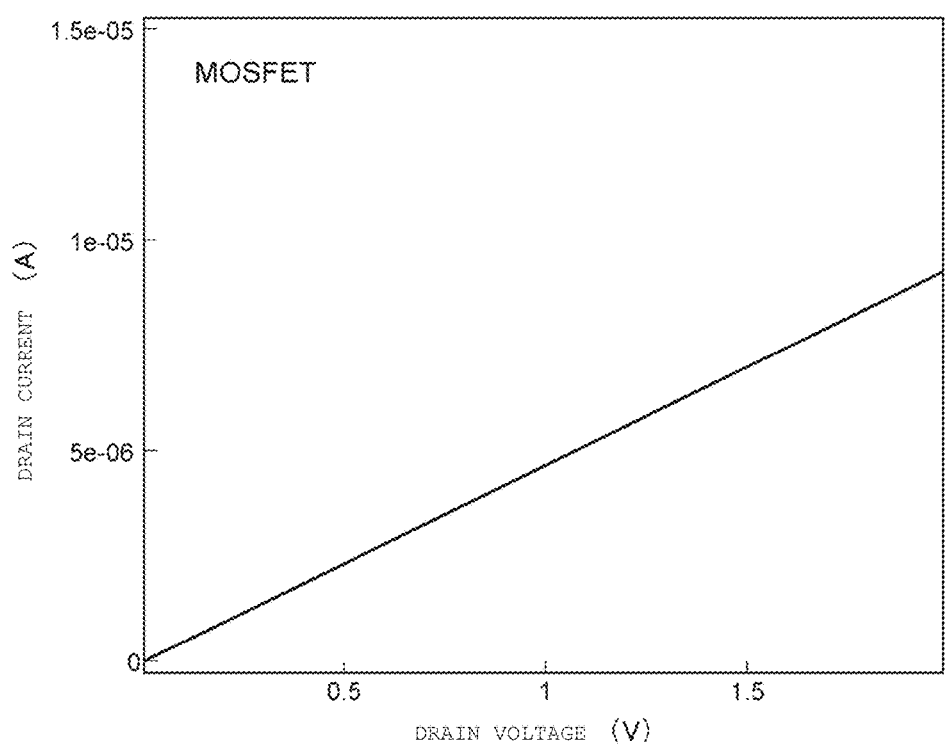
FIG. 2 is a simulation result that illustrates current-voltage characteristics of a MOSFET.

FIG. 2 is a simulation result that illustrates current-voltage characteristics of a MOSFET.

Figure 3:
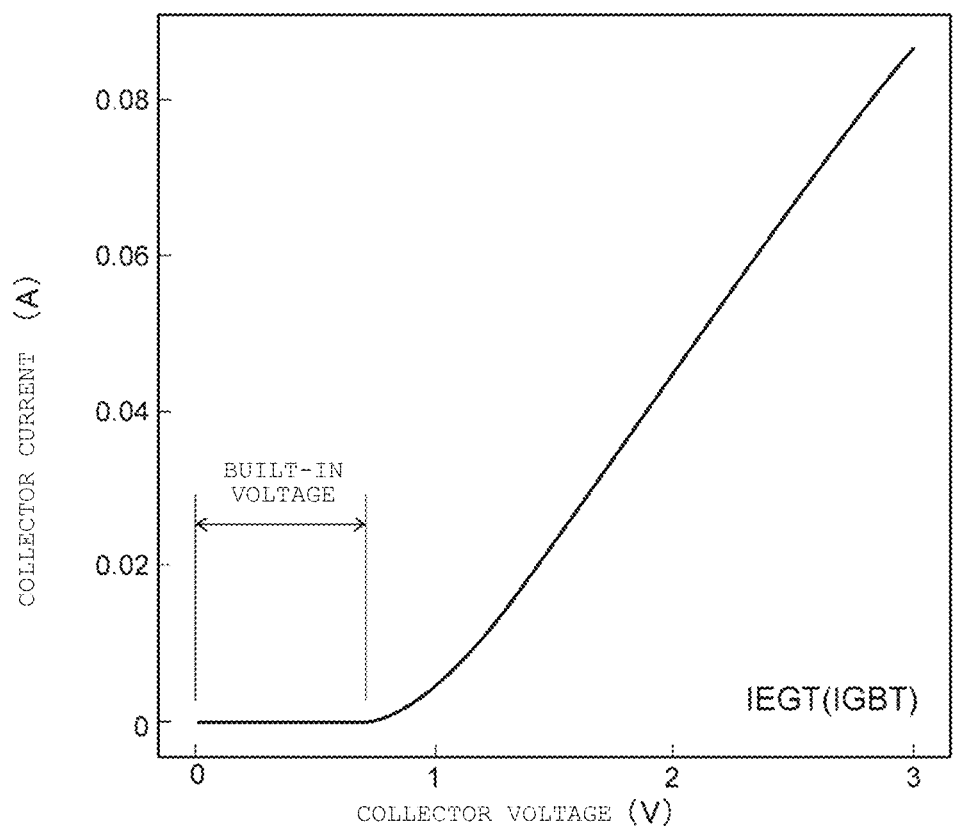
FIG. 3 is a simulation result that illustrates current-voltage characteristics of an IEGT (IGBT).

FIG. 3 is a simulation result that illustrates current-voltage characteristics of an IEGT (or IGBT).

In a MOSFET configured for a high breakdown voltage, a decrease in the resistance of a high-resistance base layer (corresponding to the n$^-$ type semiconductor region 3) at the time of conduction is of significance in the configuration. However, the thickness and the resistance of the high-resistance base layer are almost determined at a time point at which the voltage rating of elements is determined. In a unipolar device (e.g., MOSFET) having only electrons as carriers, as the current density increases, space charge increases. As a result, like the current-voltage characteristics of the MOSFET illustrated in FIG. 2, there is an upper limit in the flowing current.

In a bipolar device having electrons and holes as the carriers, by using a plasma state (e.g., conductivity modulation) of electrons and holed generated inside the high-resistance base layer, there is no limit on the space charge, a current that is much larger than that of the MOSFET (or a unipolar device) can be caused to flow. From this, an element performing a bipolar operation such as a pin diode, an IEGT (or IGBT) or a thyristor can control power much higher than that of the MOSFET (or a unipolar device).

FIG. 2 and FIG. 3 are results of simulating the current-voltage characteristics of the MOSFET and the IEGT (or IGBT) having the same high-resistance base layer (for example, a thickness of about 100 μm, an n-type impurity concentration of $1.0 \times 10^{13}$, and 1500 V configuration). For example, by comparing a drain current and a collector current in a case where the drain voltage and the collector voltage are 2.0 V, it can be understood that the IEGT has a capability of causing a flowing current that is about 1,000 times of that of the MOSFET.

However, elements such as a diode, an IEGT (or IGBT), and a thyristor, as illustrated in FIG. 3, have a disadvantage that a current does not flow in a case where a collector voltage that is a target for a conductivity modulation characteristic is less than built-in potential. In some embodiments, the built-in potential is about 0.7 V in the case of silicon (Si) and has a larger value in the case of wide band gap semiconductor. For example, the built-in potential of silicon carbide (SiC) is about 3.5 V.

For this reason, in a voltage use region of the built-in potential of the semiconductor material or less, the advantages of the pin diode, the IEGT (or IGBT), and the thyristor element are not taken, and the MOSFET that is a unipolar device having a conduction characteristic of about 1/10 to 1/1000 or a current-driven bipolar transistor (a GTR or the like) may be used. In the case of a wide band gap such as silicon carbide (SiC) having built-in potential that is much higher than that of silicon, a parallel connection of a MOSFET and an IGBT on an application circuit may be used.

Here, the operating principle of the semiconductor device according to some embodiments will be described with reference to FIG. 4A and FIG. 4B.

Figure 4A:
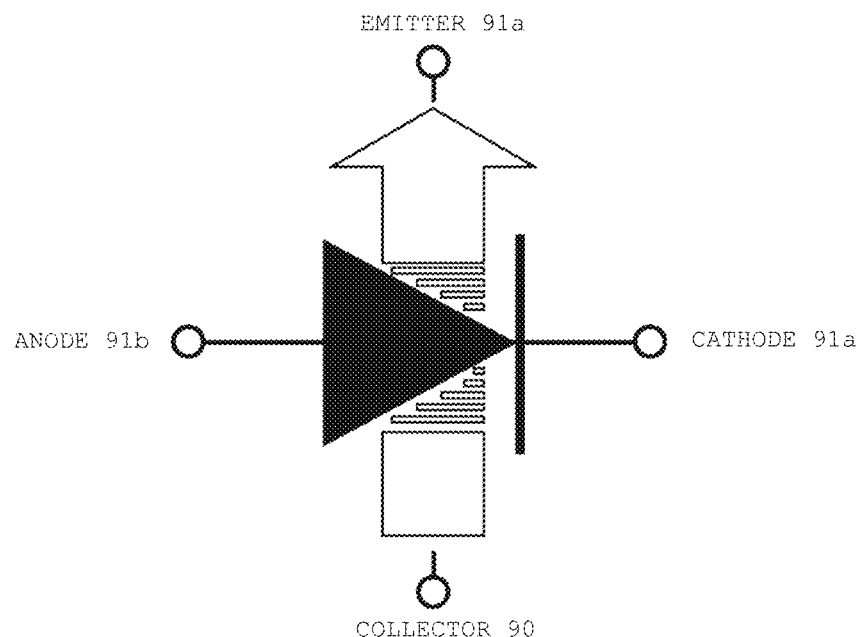
FIG. 4A and FIG. 4B are conceptual diagrams that illustrate the operating principle of the semiconductor device according to some embodiments.
Figure 4B:
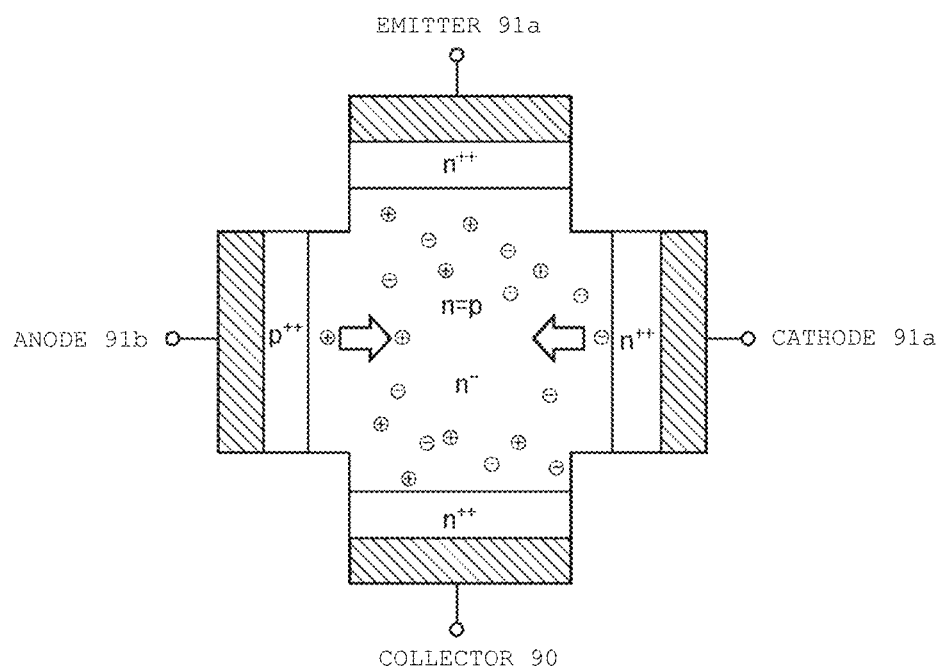

FIG. 4A and FIG. 4B are conceptual diagrams that illustrate the operating principle of the semiconductor device according to some embodiments.

In a diode or a thyristor, a built-in potential voltage (0.7 V) is generated in a direction in which a current flows. This is potential used for accumulating and maintaining deep carrier plasma in the high-resistance base and is unavoidable. However, in a direction (a direction between the collector and the emitter) perpendicular to the direction (a direction between the anode and the cathode) of the current in the diode or the thyristor, built-in potential is not present. By generating carrier plasma of a same level as that of the thyristor in the high-resistance base with high efficiency by using an anode-to-cathode current that is sufficiently lower than a main current and simultaneously causing the main current to flow in a direction between the collector and the emitter, the problem of the built-in voltage of the thyristor can be solved.

Next, a specific operation of the semiconductor device according to some embodiments will be described with reference to FIG. 1. When a positive voltage of a threshold or more is applied to the gate electrodes 10a and 10b, an inversion layer of electrons is formed in the p-type base region 5a near the gate insulating layers 15a and 15b. In this state, when a positive voltage with respect to the emitter electrode 91a is applied to the collector electrode 90, a MOSFET included in the semiconductor device 100 enters into an ON state, and a forward current flows from the collector electrode 90 to the emitter electrode 91a. This state is the operation of a general unipolar MOSFET. The conductivity modulation of the n$^-$ type semiconductor region 3 does not occur, and a large conduction capability as in a bipolar device at the time of conductivity modulation is not acquired.

Some embodiments of the present disclosure (e.g., the embodiment illustrated in FIG. 1) are quite different from a conventional unipolar MOSFET in the following points. In some embodiments, the current gate electrode 91b used for injecting minority carriers (holes) into the n$^-$ type semiconductor region 3 is included. In some embodiments, based on an injection enhanced (IE) effect acquired using a geometric shape of the trenches Tr1 to Tr3, the n-type barrier regions 4a and 4b, and the like, the injection current that is a very low current is configured to cause high conductivity modulation to occur.

In some embodiments, when a positive voltage of the built-in potential between the p-type anode region 5b and the n-type barrier region 4b or more with respect to the emitter electrode 91a is applied to the current gate electrode 91b, a forward current flows through a p-i-n diode formed by the p-type anode region 5b and the n$^{++}$ type contact region 6a in a bipolar mode. At this time, holes are injected from the p-type anode region 5b into the n$^-$ type semiconductor region 3, and simultaneously, electrons are injected from the n$^{++}$ type contact region 6a into the n$^-$ type semiconductor region 3 through an n-type MOSFET channel of the p-type base region 5a. At this time, right below the trench Tr1 corresponding to a high-resistance i layer of the p-i-n diode formed between the p-type anode region 5b and the n$^{++}$ type contact region 6a and between the trenches Tr1 to Tr3, deep conductivity modulation (e.g., accumulation of excess carrier plasma) accompanied with the conduction of the p-i-n diode described above occurs. The deep conductivity modulation (e.g., accumulation of excess carrier plasma) accompanied with the conduction of the p-i-n diode is amplified based on the IE effect depending on the shape of the trenches Tr1 to Tr3. In some embodiments, holes injected from the p-type anode region 5b are blocked by a trench groove geometric shape of the n$^{++}$ type contact region 6a, and electrons injected from the n$^{++}$ type contact region 6a are blocked by a trench groove geometric shape of the p-type anode region 5b. As a result, immediately below the trench Tr1 corresponding to the high-resistance i layer of the p-i-n diode described above and between the trenches Tr1 to Tr3, accumulation of excess carrier plasma having a density that is one digit to five digits greater than the impurity concentration of the n$^-$ type semiconductor region 3 can be caused to occur. In this way, according to the accumulation of plasma in the n$^-$ type semiconductor region 3 of high resistance included in the semiconductor device 100, a state is formed in which resistance of one digit to five digits is formed. At this time, an electric potential difference of the collector electrode 90 with respect to the emitter electrode 91a is not present yet or a sufficiently small change with respect to the built-in voltage.

In some embodiments, in this state, when a positive voltage with respect to the emitter electrode 91a is applied to the collector electrode 90, a forward current flows between the emitter electrode 91a and the collector electrode 90 of the semiconductor device 100. At this time, the n$^-$ type semiconductor region 3 of the semiconductor device 100 operates in a bipolar mode in which a deep conductivity modulation state occurs also in a case where the voltage applied to the collector is 0 V to the built-in voltage or less.

In some embodiments, in a case where a negative voltage is applied to the gate electrodes 11a and 11b, hole-accumulated layer is formed in the p-type anode region 5b, and an inversion layer of holes is formed in the n-type barrier region 4b near the gate insulating layers 16a and 16b, and the injection of holes into the n$^-$ type semiconductor region 3 is further promoted.

Here, the "deep conductivity modulation state" and the "accumulation of plasma" or the "accumulation of excess carrier plasma" are used for the same meaning.

In addition, the "built-in potential" is used as the same meaning as a "difference between Fermi levels of the p-type impurity diffusion region and the n-type impurity diffusion region" or a "threshold voltage (a voltage of a point at which a current starts to rise in a forward current-voltage waveform) of a current for which a forward current of a pin (or pn) diode starts to flow".

In this way, in the semiconductor device according to some embodiments, when conduction between the emitter electrode 91a and the collector electrode 90 is formed by the MOSFET, by injecting holes from the current gate electrode 91b to the n$^-$ type semiconductor region 3, conductivity modulation can be caused to occur. In other words, similar to a unipolar device, regardless of no presence of built-in potential between the emitter electrode 91a and the collector electrode 90, similar to the bipolar device, according to deep conductivity modulation in the n$^-$ type semiconductor region 3, the semiconductor device according to some embodiments has a high conduction capability and a low on resistance.

In addition, since there is no built-in potential, and conduction can be formed also for a low collector voltage, some embodiments of the present disclosure (e.g., the embodiment illustrated in FIG. 1) can be appropriately used for a semiconductor device, particularly, using wide band gap semiconductor. The reason for this is that, since wide band gap semiconductor has built-in potential higher than silicon, when the wide band gap semiconductor is used for a bipolar device, a higher drain voltage may be required. Examples of such wide band gap semiconductor include gallium nitride (GaN), gallium oxide (Ga$_2$O$_3$), and diamond in addition to silicon carbide.

The semiconductor device according to some embodiments, based on the IE effect occurring between the emitter electrode 91a and the current gate electrode 91b in accordance with the trenches Tr1 to Tr3 disposed on the emitter electrode 91a side and the n-type barrier regions 4a and 4b, can effectively cause deep conductivity modulation to occur in the n$^-$ type semiconductor region 3 by using a drive current (e.g., a fraction to 1-several hundredth) smaller than that of a giant transistor (GTR: e.g., power bipolar transistor). In the semiconductor device according to some embodiments, carrier plasma of about $1.0 \times 10^{14}$ to $1.0 \times 10^{18}$ cm$^{-3}$ more than that of the GTR can be accumulated, and a larger current can be controlled.

This point will be described in detail with reference to FIGS. 5A to 5C.

FIG. 5A is a cross-sectional view that illustrates apart of the semiconductor device 100 according to some embodiments.

FIG. 5B illustrates graphs for a comparison of an excess carrier concentration in the semiconductor device according to some embodiments and a semiconductor device according to a reference example.

FIG. 5C is a cross-sectional view that illustrates apart of the semiconductor device according to the reference example.

In FIG. 5A, a semiconductor device having a function similar to that of the semiconductor device 100 illustrated in FIG. 1 is illustrated. In FIG. 5B, in the semiconductor devices illustrated in FIGS. 5A and 5C, concentrations of excess carriers at each position in the Z direction are illustrated. In FIG. 5C, a part of the GTR is illustrated as a semiconductor device according to the reference example.

In the semiconductor device according to the reference example illustrated in FIG. 5C, a collector electrode 90, an n$^{++}$ type collector region 1, an n-type barrier region 2, an n$^-$ type semiconductor region 3, a p-type base region 5, an n$^{++}$ type contact region 6, a p$^{++}$ type contact region 7, an emitter electrode 91a, and a current gate electrode 91b are disposed. As illustrated in FIG. 5C, in the GTR, holes injected from the p$^{++}$ type contact region 7 to the p-type base region 5 (e.g., J$_{base}$ in FIG. 5C) flow from the p-type base region 5 to the n$^{++}$ type semiconductor region 6. In other words, excess carriers injected from the p-type base region 5 are not accumulated in the n$^-$ type semiconductor region 3 and have small contribution to conductivity modulation.

As illustrated in FIG. 5A, in the semiconductor device 100 according to some embodiments, based on the IE effect (an effect of accumulation of excess carriers on the emitter electrode 91a side) according to the tranches Tr1 to Tr3 disposed on the emitter electrode 91a aide and the n-type barrier regions 4a and 4b, holes injected from the p-type anode region 5b (e.g., J$_B$ in FIG. 5A) are suppressed to flow to the emitter electrode 91a, and a current flowing from the current gate electrode 91b to the emitter electrode 91a can be suppressed. In the semiconductor device according to some embodiments, excess carriers are efficiently accumulated in the n$^-$ type semiconductor region 3, and the contribution of the holes injected from the p-type base region 5 to the conductivity modulation can be increased.

For this reason, as illustrated in FIG. 5B, in the semiconductor device 100 and the semiconductor device according to the reference example, there is a large difference in the concentrations of excess carriers.

The difference in the concentrations of excess carriers in the semiconductor device 100 according to some embodiments and the semiconductor device according to the reference example will be described in detail with reference to FIGS. 6 to 8.

Figure 6:
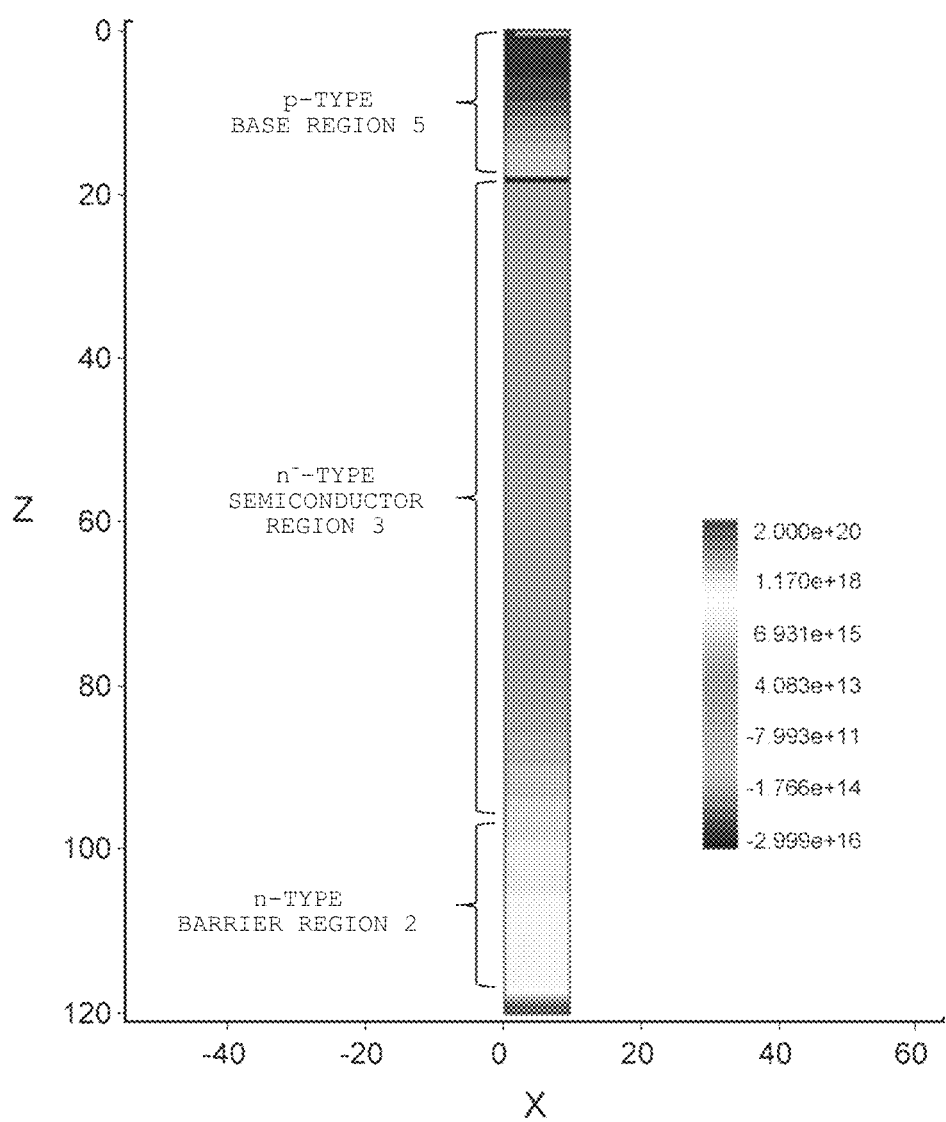
FIG. 6 is a cross-sectional structure of the semiconductor device according to the reference example used for a simulation.

FIG. 6 is a cross-sectional structure of the semiconductor device according to the reference example used for a simulation.

Figure 7:
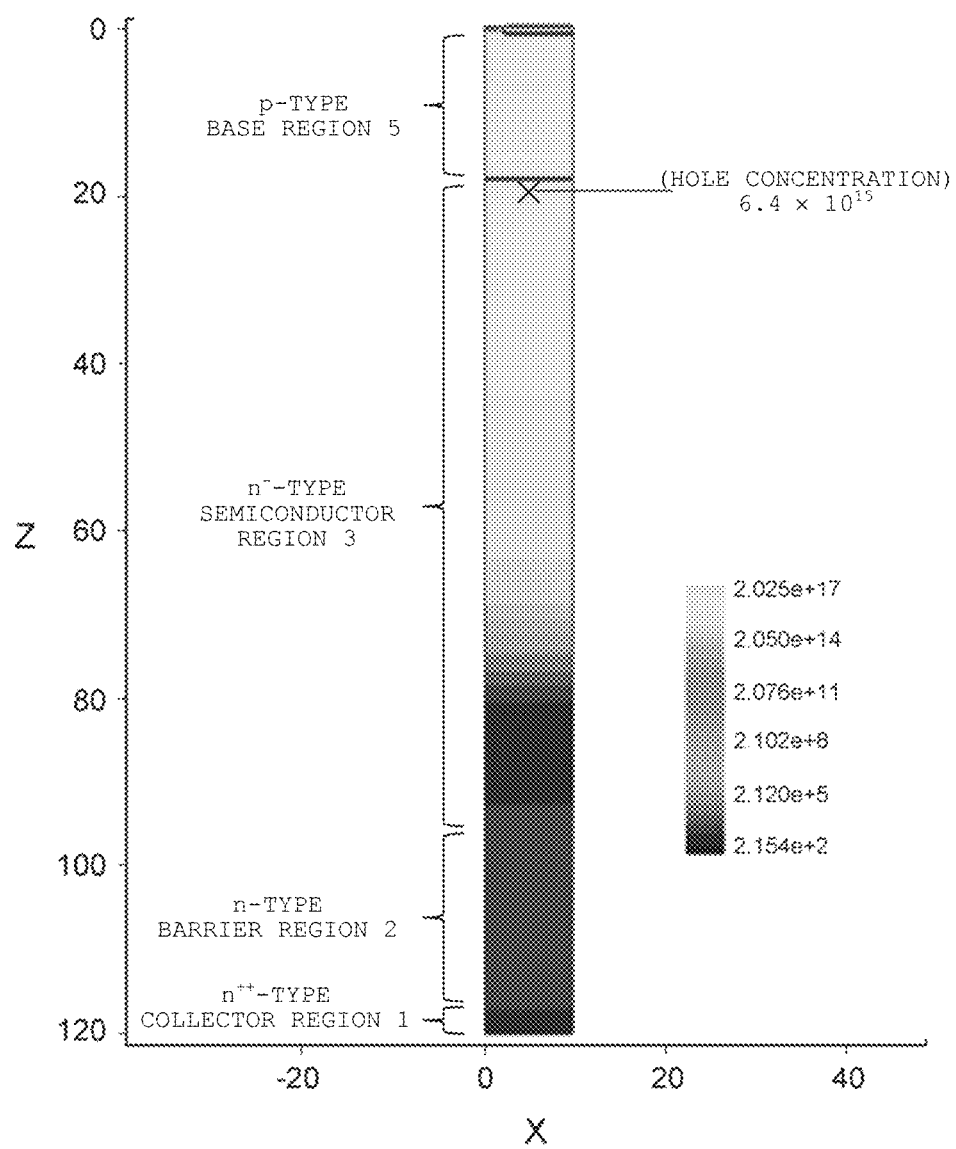
FIG. 7 is a simulation result that illustrates the distribution of holes in an ON state of the semiconductor device according to the reference example.

FIG. 7 is a simulation result that illustrates the distribution of holes in an ON state of the semiconductor device according to the reference example.

Figure 8:
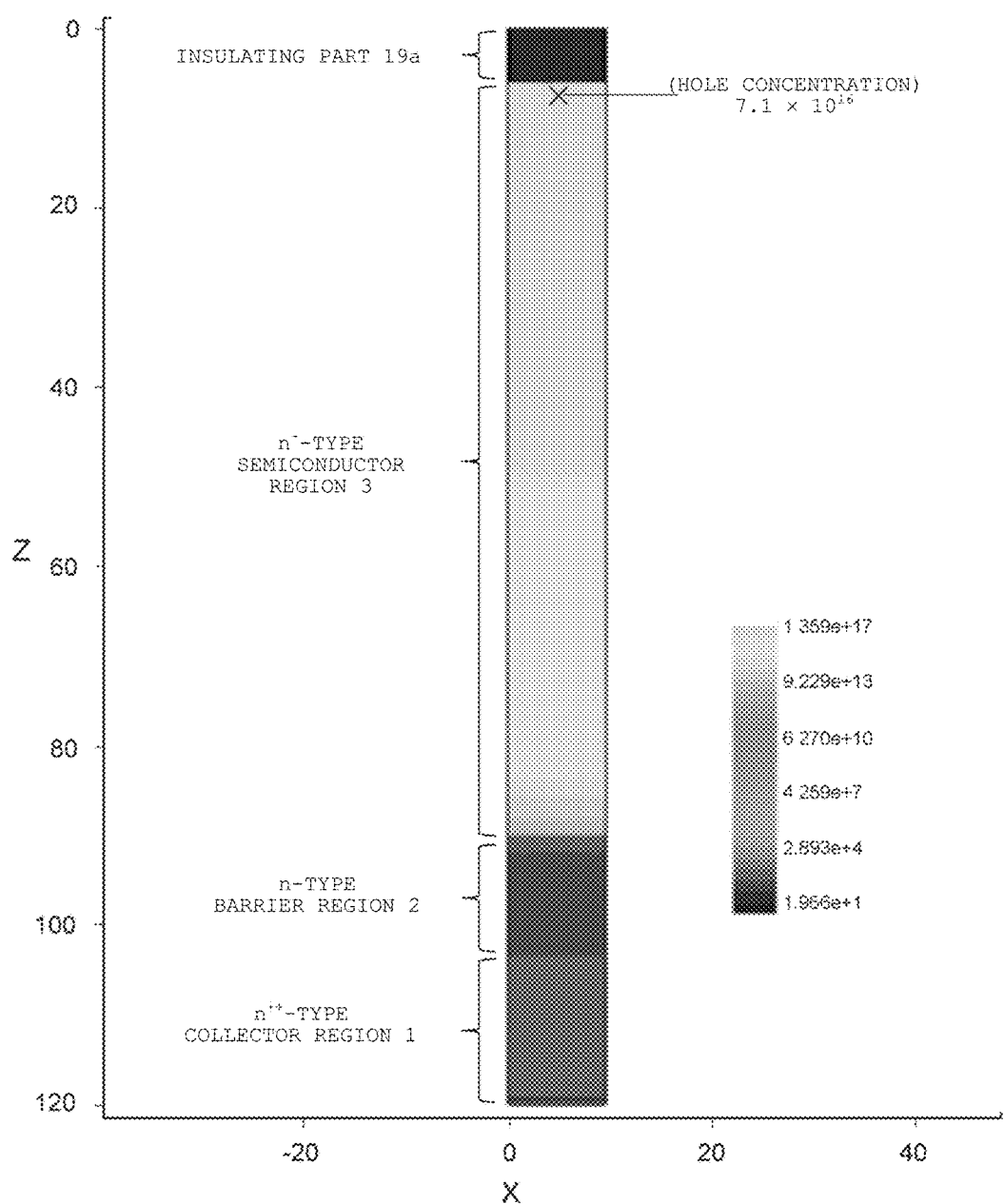
FIG. 8 is a simulation result that illustrates the distribution of holes in an ON state of the semiconductor device according to some embodiments.

FIG. 8 is a simulation result that illustrates the distribution of holes in an ON state of the semiconductor device 100 according to some embodiments.

In FIG. 6, impurity concentrations in the n⁻ type semiconductor region 3 and the p-type base region 5 of the GTR illustrated in FIG. 5C are illustrated. In FIG. 6, in each of the n⁻ type semiconductor region 3 and the p-type base region 5, a brighter color represents a lower impurity concentration of each conductivity type, and a darker color represents a higher impurity concentration.

In FIG. 7 and FIG. 8, distributions of holes in a case where a voltage of 3.0 V is applied to the collector electrode side in the ON state are illustrated. A brighter color represents a higher hole concentration, and a darker color represents a lower hole concentration. In the simulation result of the semiconductor device according to some embodiments (e.g., the embodiment illustrated in FIG. 8), a distribution of holes below the insulating part 19a (trench Tr1) is illustrated.

In such simulation results, both the GTR and the semiconductor device 100 are configured to acquire an element breakdown voltage of 1500 V. More specifically, the thickness of the n⁻ type semiconductor region 3 is set to 100 μm, the impurity concentration of the n⁻ type semiconductor region 3 is set to $1\times10^{13}$ cm$^{-3}$, the cell size is set to 19.2 μm, the depth of the trench Tr1 of the semiconductor device 100 is set to 6 μm, the unit cell area is configured to be the same, and a current gain is set to a same value.

As illustrated in FIG. 7, in the GTR, the hole concentration near a pn junction surface is $6.4\times10^{15}$ cm$^{-3}$. On the other hand, as illustrated in FIG. 8, in the semiconductor device 100 according to some embodiments, the hole concentration in a lower portion of the insulating part 19a is $7.1\times10^{16}$ cm$^{-3}$, and a value one digit or more greater than that of the GTR is acquired.

Figure 9:
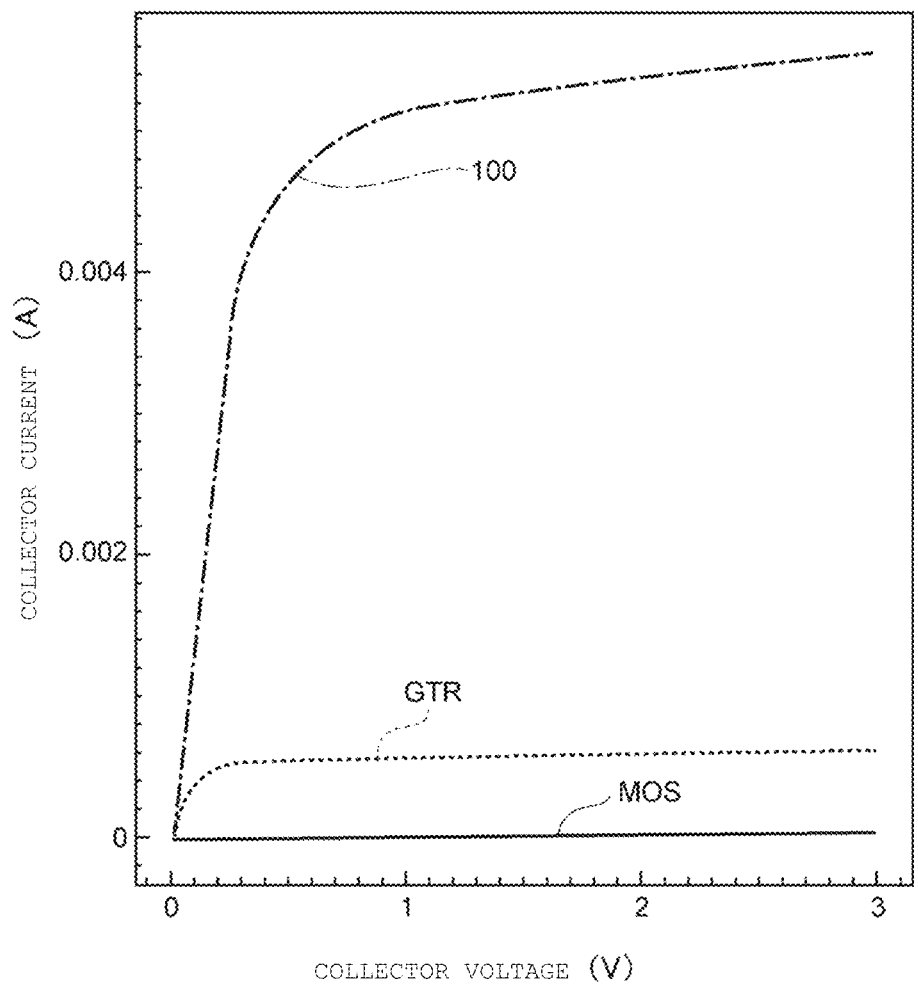
FIG. 9 represents simulation results that illustrate the conduction characteristics of the semiconductor device according to some embodiments and the semiconductor device according to the reference example.

FIG. 9 represents simulation results that illustrate the conduction characteristics of the semiconductor device according to some embodiments and the semiconductor device according to the reference example.

Based on the results illustrated in FIG. 9, it can be understood that, while the GTR has a conduction capability larger than the MOSFET, the semiconductor device 100 according to some embodiments has a conduction capability larger than the GTR.

As above, according to some embodiments, a semiconductor device having a conduction capability much larger than a unipolar device such as the MOSFET and, also in a case where the collector voltage is lower than a built-in voltage, similar to a bipolar device, having a large conduction capability and a low on resistance in accordance with deep conductivity modulation in the n⁻ type semiconductor region 3 is acquired.

In addition, according to some embodiments, compared to the GTR, more carrier plasma can be accumulated using a lower drive current, and a semiconductor device capable of controlling a large current is acquired.

As above, while a case in which a forward current flows from the collector electrode 90 to the emitter electrode 91a has been described, the semiconductor device 100 according to some embodiments can cause a reverse current to flow from the emitter electrode 91a to the collector electrode 90.

When a positive voltage of a threshold or more is applied to the gate electrodes 10a and 10b in a state in which a positive voltage with respect to the collector electrode 90 is applied to the emitter electrode 91a, the n⁺⁺ type contact region 6a and the n-type barrier region 4a are connected to an inversion layer of the p-type base region 5a. Accordingly, a reverse current flows from the emitter electrode 91a to the collector electrode 90.

In some embodiments, in this case (reverse voltage), when a positive voltage of the built-in potential between the p-type anode region 5b and the n-type barrier region 4b or more with respect to the emitter electrode 91a is applied to the current gate electrode 91b, a forward current flows to a p-i-n diode formed by the p-type anode region 5b and the n⁺⁺ type contact region 6a in a bipolar mode, and, as a result, deep conductivity modulation occurs in the n⁻ type semiconductor region 3.

In some embodiments, in a case where a negative voltage with respect to the emitter electrode 91a is applied to the collector electrode 90, a reverse current flowing between the emitter electrode 91a and the collector electrode 90 of the semiconductor device 100, also for a case where the voltage applied to the collector is 0 V to the built-in voltage or less, is an operation of the bipolar mode under a state in which deep conductivity modulation occurs in the n⁻ type semiconductor region 3 of the semiconductor device 100.

Here, the forward and reverse conduction characteristics of the semiconductor device according to some embodiments will be described in detail with reference to FIGS. 10 to 12.

Figure 10:
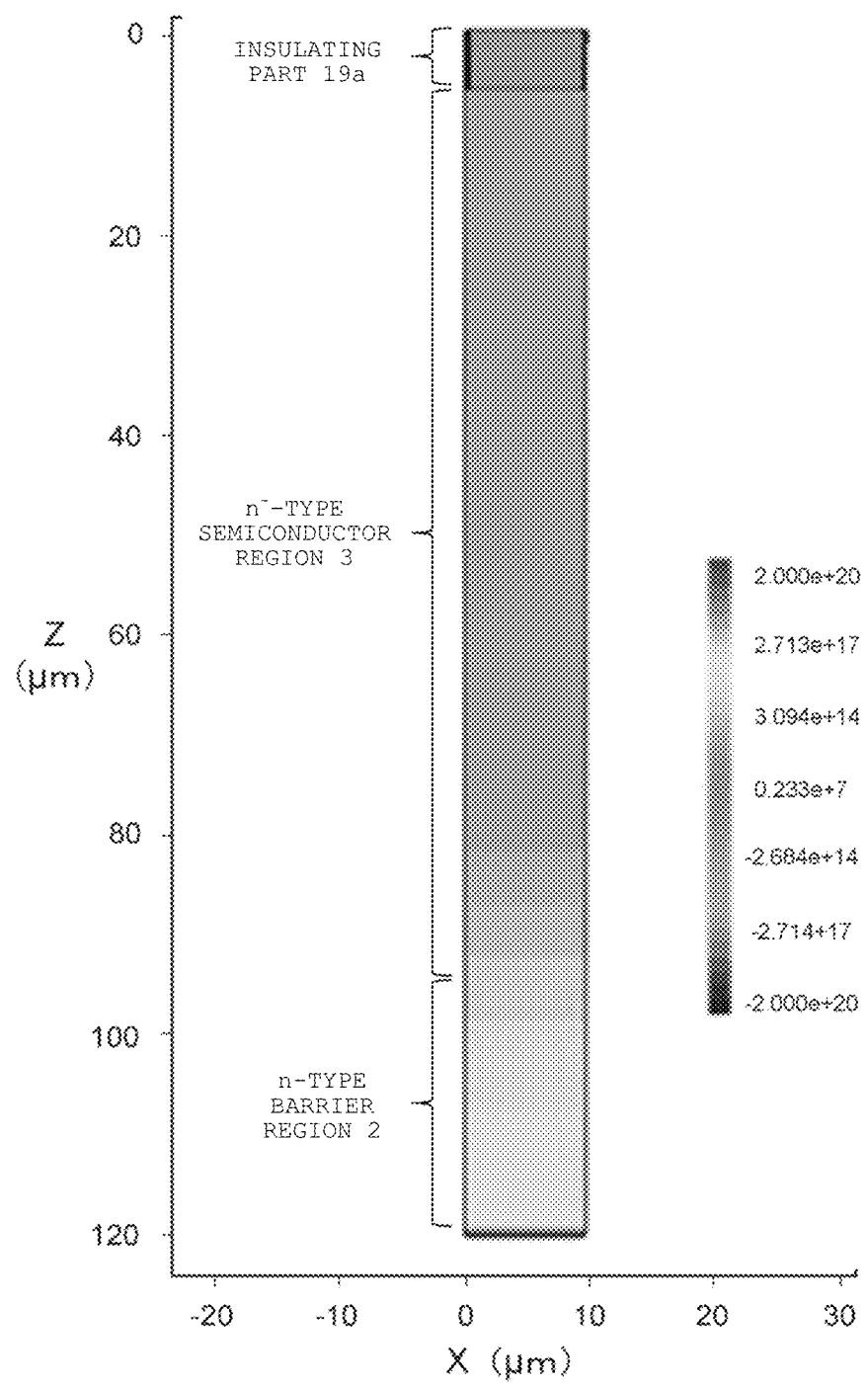
FIG. 10 is a cross-sectional structure of the semiconductor device according to some embodiments used for the simulation.

FIG. 10 is a cross-sectional structure of the semiconductor device 100 according to some embodiments used for the simulation.

FIG. 11A and FIG. 11B are simulation results that illustrate hole concentrations in an ON state in a case where the semiconductor device 100 according to some embodiments is electrically conducted in a forward direction and a reverse direction.

Figure 12:
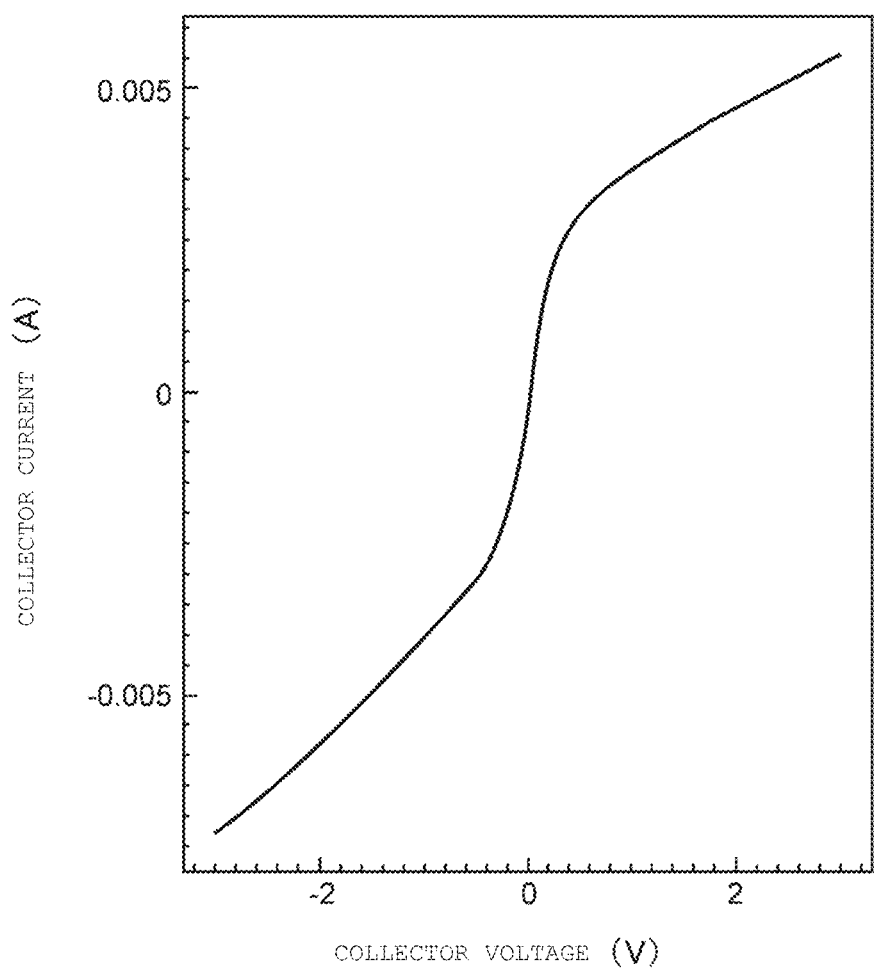
FIG. 12 is a simulation result that illustrates conduction characteristics of the semiconductor device according to some embodiments for both directions.

FIG. 12 is a simulation result that illustrates conduction characteristics of the semiconductor device 100 according to some embodiments for both directions.

In FIG. 10, a distribution of impurity concentrations below the insulating part 19a (e.g., trench Tr1) is illustrated. In FIG. 10, a brighter color represents a lower n-type impurity concentration, and a darker color represents a higher n-type impurity concentration.

FIG. 11A and FIG. 11B, similar to FIG. 7 and FIG. 8, illustrate distributions of holes in a case where a voltage of 3.0 V is applied to the collector electrode side in the ON state. A brighter color represents a higher hole concentration, and a darker color represents a lower hole concentration. FIG. 11A illustrates an appearance at the time of forward conduction, and FIG. 11B illustrates an appearance at the time of reverse conduction.

Based on the results illustrated in FIG. 11A and FIG. 11B, also in a case where a forward current or a reverse current flows, it can be understood that holes are accumulated at a high concentration in a region below the insulating part 19a.

In addition, based on the result illustrated in FIG. 12, also in a case where reverse conduction is caused, similar to the case of forward conduction, it can be understood that a high conduction characteristic is acquired.

In addition, as illustrated in FIG. 12, also in a case where the collector voltage is less than the built-in voltage, a high conduction capability similar to that of the thyristor is acquired, and accordingly, snap-back such as a triac does not occur in any one of the forward conduction and the reverse conduction.

As above, the semiconductor device according to some embodiments has a high conduction capability for any of the forward conduction and the reverse conduction.

In some embodiments, at the time of the forward conduction or the reverse conduction, when a voltage applied to the gate electrodes 10a and 10b is less than a threshold, the inversion layer of the p-type base region 5a disappears, and conduction between the collector electrode 90 and the emitter electrode 91a disappears, and the semiconductor device 100 enters into an Off state.

Figure 13:
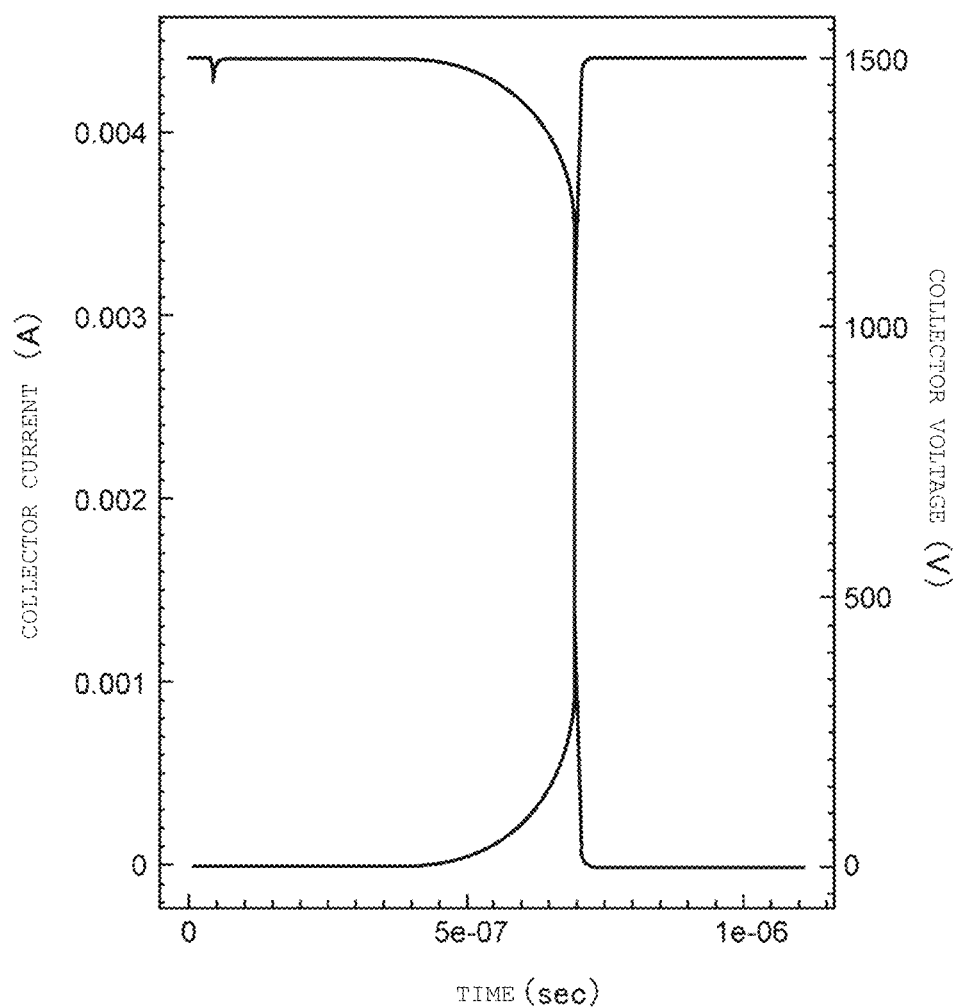
FIG. 13 is a simulation result that illustrates changes in a collector voltage and a collector current at the time of turn-off in the semiconductor device according to some embodiments.

FIG. 13 is a simulation result that illustrates changes in a collector voltage and a collector current at the time of turn-off in the semiconductor device 100 according to some embodiments.

Figure 14:
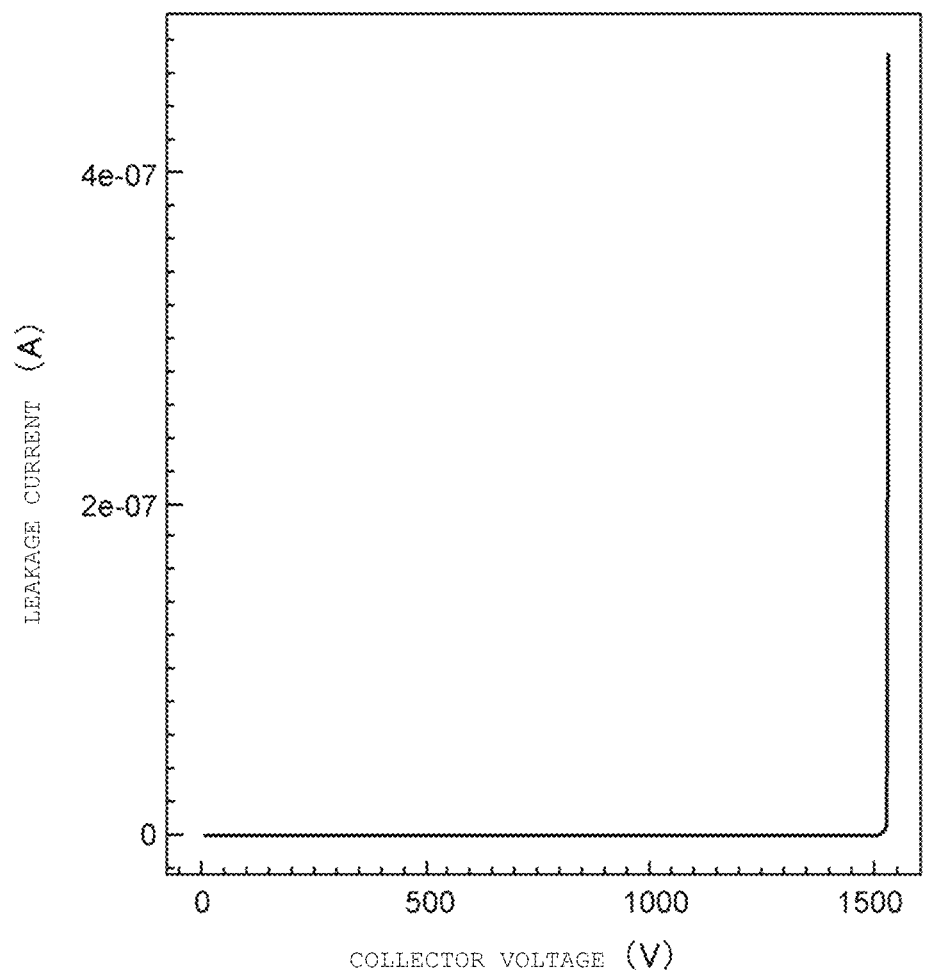
FIG. 14 is a simulation result that illustrates the waveform of a static breakdown voltage of the semiconductor device according to some embodiments.

FIG. 14 is a simulation result that illustrates the waveform of a static breakdown voltage of the semiconductor device 100 according to some embodiments.

FIG. 13 and FIG. 14 illustrate appearances at the time of turn-off in the semiconductor device 100 of which the element breakdown voltage is configured to be 1500 V. As illustrated in FIG. 13 and FIG. 14, in the semiconductor device 100 according to some embodiments, it can be understood that a breakdown voltage similar to a configured value is acquired at the time of turn-off.

In some embodiments, at the time of turn-off, by drawing out a current by setting the electric potential of the current gate electrode 91b to be negative with respect to the electric potential of the emitter electrode 91a, the semiconductor device 100 can be caused to be in the Off state more assuredly. In some embodiments, by delaying the timings of the gate electrodes 10a and 10b and the current gate electrode 91b, a trade-off between the resistance at the time of the ON state of the semiconductor device and the switching characteristics can be improved. For example, it may be configured such that, before the voltage applied to the gate electrodes 10a and 10b is changed, the voltage of the current gate electrode 91b is set to be negative, and after several μ seconds to several tens of μ seconds, the voltage of the gate electrodes 10a and 10b may be decreased. According to this method, after the accumulated carriers in the n⁻ type semiconductor region 3 of the semiconductor device 100 disappear, the gate electrodes 10a and 10b can be blocked, and a tail current at the time of turning off (not causing a tail current) the unipolar MOSFET can be suppressed.

According to the operating principle of some embodiments, the accumulation amount (e.g., a peak value of the carrier concentration) of excess carriers between the emitter electrode 91a and the current gate electrode 91b determines the amount of excess carriers in the n⁻ type semiconductor region 3, and the amount of excess carriers in the n⁻ type semiconductor region 3 determines resistance between the emitter electrode 91a and the collector electrode 90 of the semiconductor device 100.

In some embodiments, the accumulation amount (e.g., a peak value of carrier concentrations) of excess carriers between the emitter electrode 91a and the current gate electrode 91b is determined based on the IE effect according to the shape of the trenches Tr1 to Tr3 disposed on the emitter electrode 91a side. This IE effect may be determined based on the depth (e.g., up to several tens of μm) of the trench Tr1, a gap (e.g., 10 nm to several μm) between the gate electrodes 10a and 10b and the gate electrodes 11a and 11b, a gap between the emitter electrode 91a and the current gate electrode 91b, and the n-type impurity concentration in the n-type barrier regions 4a and 4b, and the like. The IE effect, for example, is described in "M. Kitagawa et al, "A 4500 V Injection Enhanced Insulated Gate Bipolar Transistor (IEGT) Operating in a Mode Similar to a Thyristor", IEDM'93. Technical Digest, pp 679-682, 1993", "M. Kitagawa et al, "Design Criterion and Operation Mechanism for 4.5 kV Injection Enhanced Gate Transistor", Jpn. J. Appl. Phys. Vol. 37pp4294-4300, 1998", "M. Kitagawa et al, "4.5 kV Injection Enhanced Gate Transistor: Experimental Verification of the Electrical Characteristics", Jpn. J. Appl. Phys. Vol. 36 pp3433-3437, 1997", "M. Kitagawa et al, "Study of 4.5 kV MOS-Power Device with Injection-Enhanced Trench Gate Structure", Jpn. J. Appl. Phys. Vol. 36pp1411-1413, 1997", and the like.

Here, a dimensional relation for increasing the IE effect will be described with reference to FIG. 15.

Figure 15:
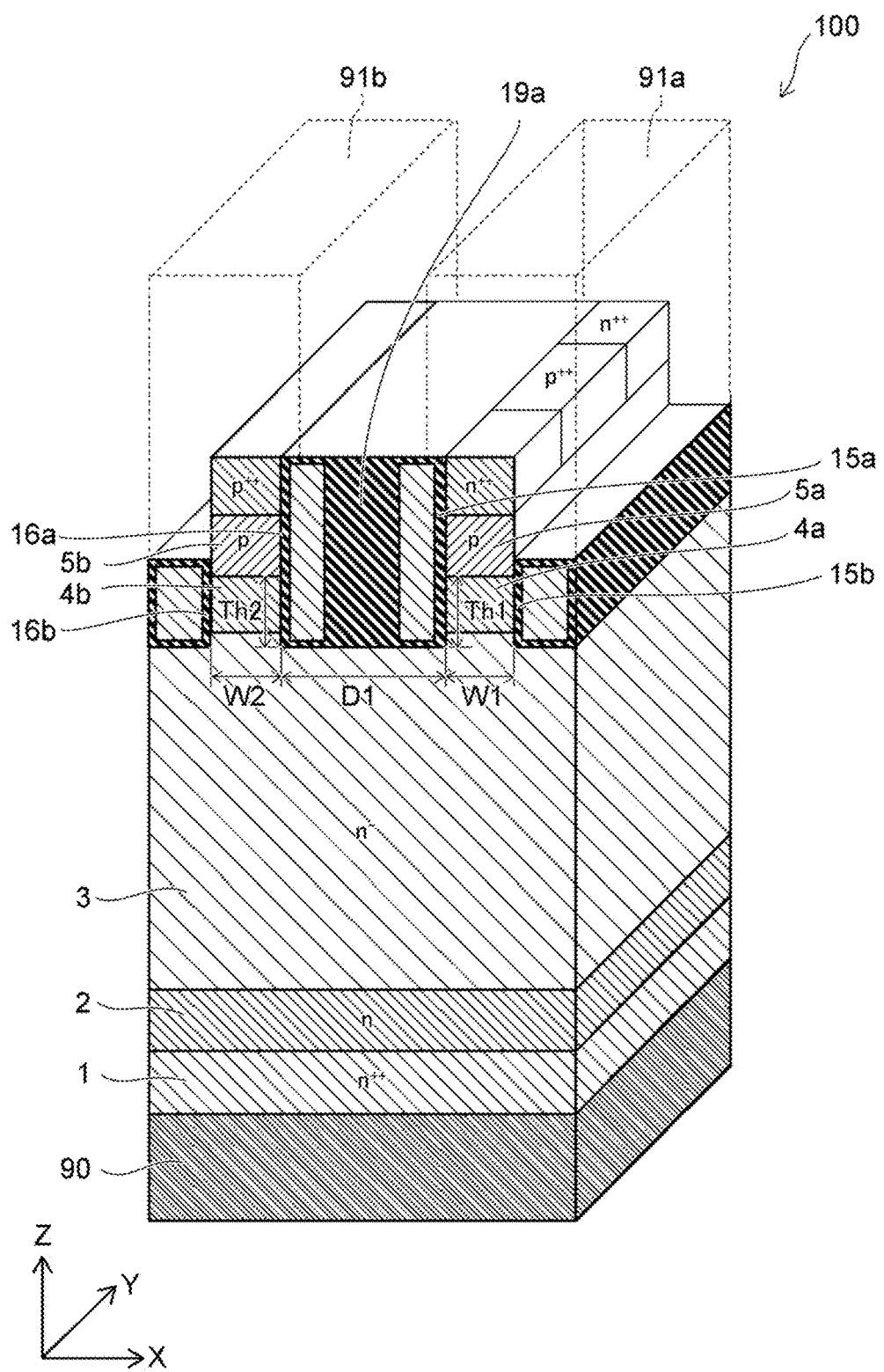
FIG. 15 is a perspective cross-sectional view that illustrates a part of the semiconductor device according to some embodiments.

FIG. 15 is a cross-sectional view that illustrates a part of the semiconductor device 100 according to some embodiments.

As illustrated in FIG. 15, in some embodiments, the IE effect is increased as the width (a length in the X direction) W1 of the p-type base region 5a and the width W2 of the p-type anode region 5b are narrower, and a gap D1 between the p-type base region 5a and the p-type anode region 5b is wider. In some embodiments, the IE effect is increased as a thickness Th1 between a lower surface (e.g., pn junction surface) of the p-type base region 5a and a lower end (e.g., lower end of the trench Tr1) of the insulating part 19a in the Z direction and a thickness Th2 between a lower surface (e.g., pn junction surface) of the p-type anode region 5b and a lower end (e.g., a lower end of the trench Tr1) of the insulating part 19a in the Z direction are larger, and the n-type impurity concentration in the n-type barrier regions 4a and 4b is higher.

In some embodiments, the widths W1 and W2 are 1.0 μm or less. By setting the widths W1 and W2 to be 1.0 μm or less, it is difficult for holes accumulated in the n⁻ type semiconductor region 3 on the ON state to flow to the p-type base regions 5a and 5b, and the hole concentration in the n⁻ type semiconductor region 3 can be increased. In some embodiments, in the example illustrated in FIG. 1, the width of the p-type base region 5a is the same as the width of the n-type barrier region 4a and a distance between the gate insulating layers 15a and 15b in the X direction. The width of the p-type base region 5b is the same as the width of the n-type barrier region 4b and a distance between the gate insulating layers 16a and 16b in the X direction.

In the example illustrated in FIG. 15, the width W1 is the same as a distance between the gate insulating layers 10a and 10b in the X direction, and the width W2 is the same as a distance between the gate insulating layers 11a and 11b in the X direction. In some embodiments, the distance D1 is the same as a length of the insulating part disposed inside the trench Tr1 in the X direction that includes the gate insulating layer 10a, the gate insulating layer 11a and the insulating part 19a.

In the example illustrated in FIG. 15, while the lengths of the n-type barrier region 4a and the p-type base region 5a in the X direction are the same, and the lengths of the n-type barrier region 4b and the p-type anode region 5b in the X direction are the same, the lengths of such semiconductor regions may be different from each other. In some embodiments, a side wall of the trench in which each gate electrode and each gate insulating layer are disposed may be formed in a tapered shape. In such a case, it may be configured such that a distance between at least a part of the gate insulating layer 10a and at least a part of the gate insulating layer 10b in the X direction is 1.0 µm or less, and a distance between at least a part of the gate insulating layer 11a and at least a part of the gate insulating layer 11b in the X direction is 1.0 µm or less.

In some embodiments, W1, W2, D1, Th1, and Th2 may satisfy at least one of the following Expressions (1) to (4).

$$Th1/W1 > 2 \quad (1)$$

$$Th2/W2 > 2 \quad (2)$$

$$(Th1 \times D1)/W1 > 2 \text{ µm} \quad (3)$$

$$(Th2 \times D1)/W2 > 2 \text{ µm} \quad (4)$$

By satisfying Expression (1), electrons injected from the emitter electrode 91a to the n⁻ type semiconductor region 3 to flow to the current gate electrode 91b, and the concentration of excess carriers of electrons in the n⁻ type semiconductor region 3 can be increased.

By satisfying Expression (2), it is difficult for holes injected from the current gate electrode 91b to the n⁻ type semiconductor region 3 to flow to the emitter electrode 91a, and the concentration of excess carriers of holes in the n⁻ type semiconductor region 3 can be increased.

By satisfying Expressions (3) and (4), the flow-out of holes from the n⁻ type semiconductor region 3 to the emitter electrode 91a and the current gate electrode 91b is suppressed, and the concentration of excess carriers of holes in the n⁻ type semiconductor region 3 can be increased.

In some embodiments, the distance D1 may be twice the width W1 or the width W2 or more. In some embodiments, the distance D1 may be ten times the width W1 or the width W2 or more. According to such a structure, the areas of the p-type base regions 5a and 5b per unit area of the semiconductor device 100 can be decreased, and it can become more difficult for holes accumulated in the n⁻ type semiconductor region 3 to flow to the p-type base regions 5a and 5b.

In some embodiments, by increasing the n-type impurity concentration of the n-type barrier region 2, it is difficult for excess carriers generated according to the IE effect to flow from the n⁻ type semiconductor region 3 to the collector electrode 90, and the IE effect can be further increased.

By increasing the IE effect by employing such a structure, the conduction capability of the semiconductor device is further improved, and the on resistance can be decreased.

In some embodiments, in a case where conduction between the collector electrode 90 and the emitter electrode 91a is made, it is preferable that a current flowing between the emitter electrode 91a and the current gate electrode 91b is low. The reason for this is as follows. Based on the IE effect (it becomes difficult for holes accumulated in the n⁻ type semiconductor region 3 to flow to the emitter electrode 91a) between the emitter electrode 91a and the current gate electrode 91b, also in a case where the current flowing from the current gate electrode 91b to the emitter electrode 91a is low, by narrowing the current flow path in a trench shape, the gate current density (in other words, a peak concentration of excess carriers disposed on the emitter side of the n⁻ type semiconductor region 3) is successfully increased, and, as a result, the on resistance between the emitter electrode 91a and the collector electrode 90 of the element is decreased, and the power consumption of the semiconductor device can be decreased.

Figure 16:
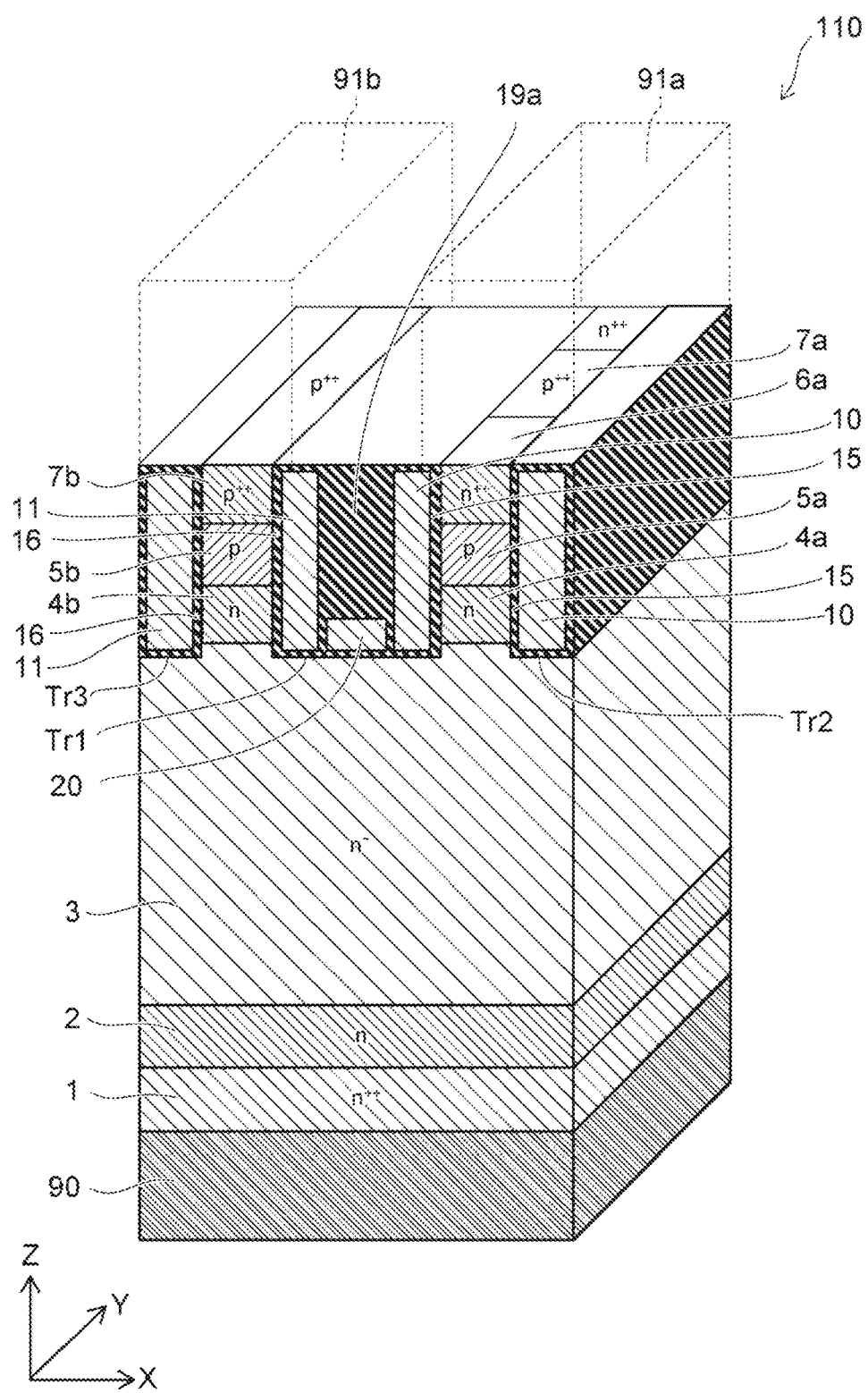
FIG. 16 is a perspective cross-sectional view that illustrates a part of a semiconductor device according to some embodiments.

FIG. 16 is a perspective cross-sectional view that illustrates apart of a semiconductor device 110 according to some embodiments.

The semiconductor device 110 is different from the semiconductor device 100 in that an electrode 20 is further included, gate electrodes 10 are disposed instead of the gate electrodes 10a and 10b, and gate electrodes 11 are disposed instead of the gate electrodes 11a and 11b.

In some embodiments, in the semiconductor device 110, an n-type barrier region 4a, a p-type base region 5a, an n⁺⁺ type contact region 6a, and a p⁺⁺ type contact region 7a are positioned between gate electrodes 10 in the X direction via a gate insulating layer 15.

In some embodiments, an n-type barrier region 4b, a p-type anode region 5b, an n⁺⁺ type contact region 6b, and a p⁺⁺ type contact region 7b are positioned between gate electrodes 11 in the X direction via a gate insulating layer 16.

Referring to FIG. 16, in some embodiments, the electrode 20 is disposed between the gate electrodes 10 and 11 in the X direction and is separated from the gate electrodes. In some embodiments, the electrode 20 faces the n⁻ type semiconductor region 3 in the Z direction via a part of the insulating part 19a. In some embodiments, the electrode 20, for example, is electrically connected to an emitter electrode 91a.

In some embodiments, by disposing the electrode 20 that is electrically connected to the emitter electrode 91a between the gate electrodes 10 and 11, when the semiconductor device is turned off, a depletion layer spreads also from a lower portion (a lower end of the trench Tr1) of the electrode 20 toward the n⁻ type semiconductor region 3. Accordingly, the breakdown voltage of the semiconductor device can be improved. In some embodiments, by increasing the n-type impurity concentration of the n⁻ type semiconductor region 3 in correspondence with the improvement of the breakdown voltage of the semiconductor device, the on resistance of the semiconductor device can be decreased.

In some embodiments, by controlling the electrode 20 as a gate electrode independently from the gate electrodes 10 and 11, not only the On-voltage of the element and the breakdown voltage of the blocking state but also the improvement of a trade-off between the switching speed and the conduction capability of the element, effective injection efficiency of carriers (holes or electrons) from the collector electrode 90, the emitter electrode 91a, and the current gate electrode 91b to the n⁻ type semiconductor region 3 in the bipolar mode and effective discharge efficiency of carriers from the n⁻ type semiconductor region 3 to each electrode can be controlled.

Figure 17:
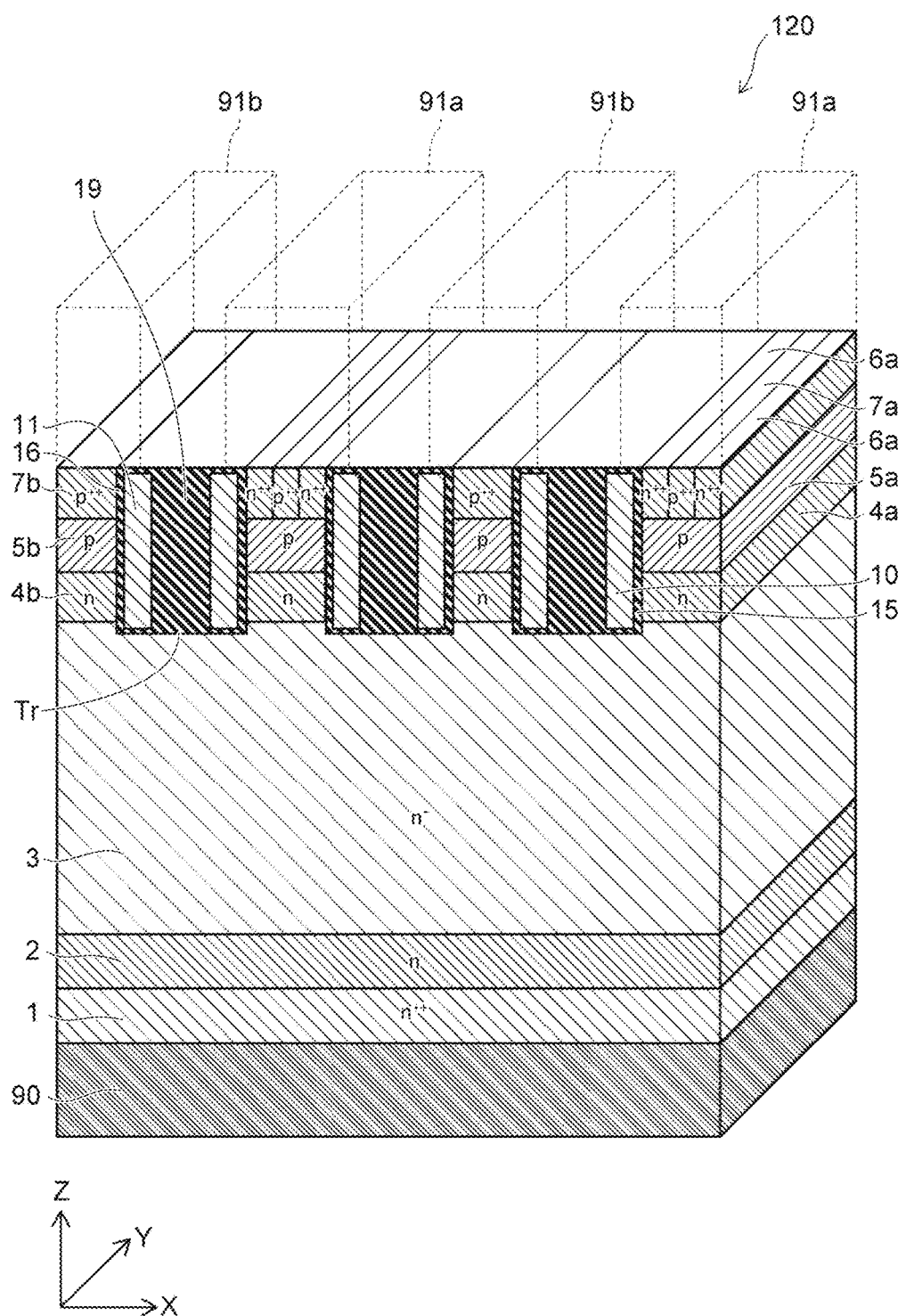
FIG. 17 is a perspective cross-sectional view that illustrates a part of a semiconductor device according to some embodiments.

FIG. 17 is a perspective cross-sectional view that illustrates a part of a semiconductor device 120 according to some embodiments.

In the semiconductor device 120, the structure of the gate electrode and the arrangement of an n⁺⁺ type contact region 6a and a p⁺⁺ type contact region 7a are different from those of the semiconductor device 100.

In some embodiments, in the semiconductor device 120, on a p-type base region 5a, a plurality of n⁺⁺ type contact regions 6a are disposed. In some embodiments, each of the plurality of n⁺⁺ type contact regions 6a faces the gate electrode 10 in the X direction via a gate insulating layer 15. The p⁺⁺ type contact region 7a is disposed between the n⁺⁺ type contact regions 6a in the X direction. In some embodiments, the n$^{++}$ type contact region 6a and the p$^{++}$ type contact region 7a extend in the Y direction.

In some embodiments, a p-type anode region 5b and a p$^{++}$ type contact region 7b face a gate electrode 11 in the X direction via a gate insulating layer 16. In some embodiments, the gate electrodes 10 and 11 are disposed inside a trench Tr. In some embodiments, between the gate electrodes 10 and 11, an insulating part 19 is disposed, and the gate electrodes 10 and 11 are separated from each other in the X direction.

In this way, also in a case where the arrangement of the n$^{++}$ type contact region 6a and the p$^{++}$ type contact region 7a and the shape of each gate electrode are changed, as described above, by increasing the IE effect of the semiconductor device as described above, deep conductivity modulation is caused to occur in the n$^-$ type semiconductor region 3, and a high conduction capability and low on resistance can be realized.

Figure 18:
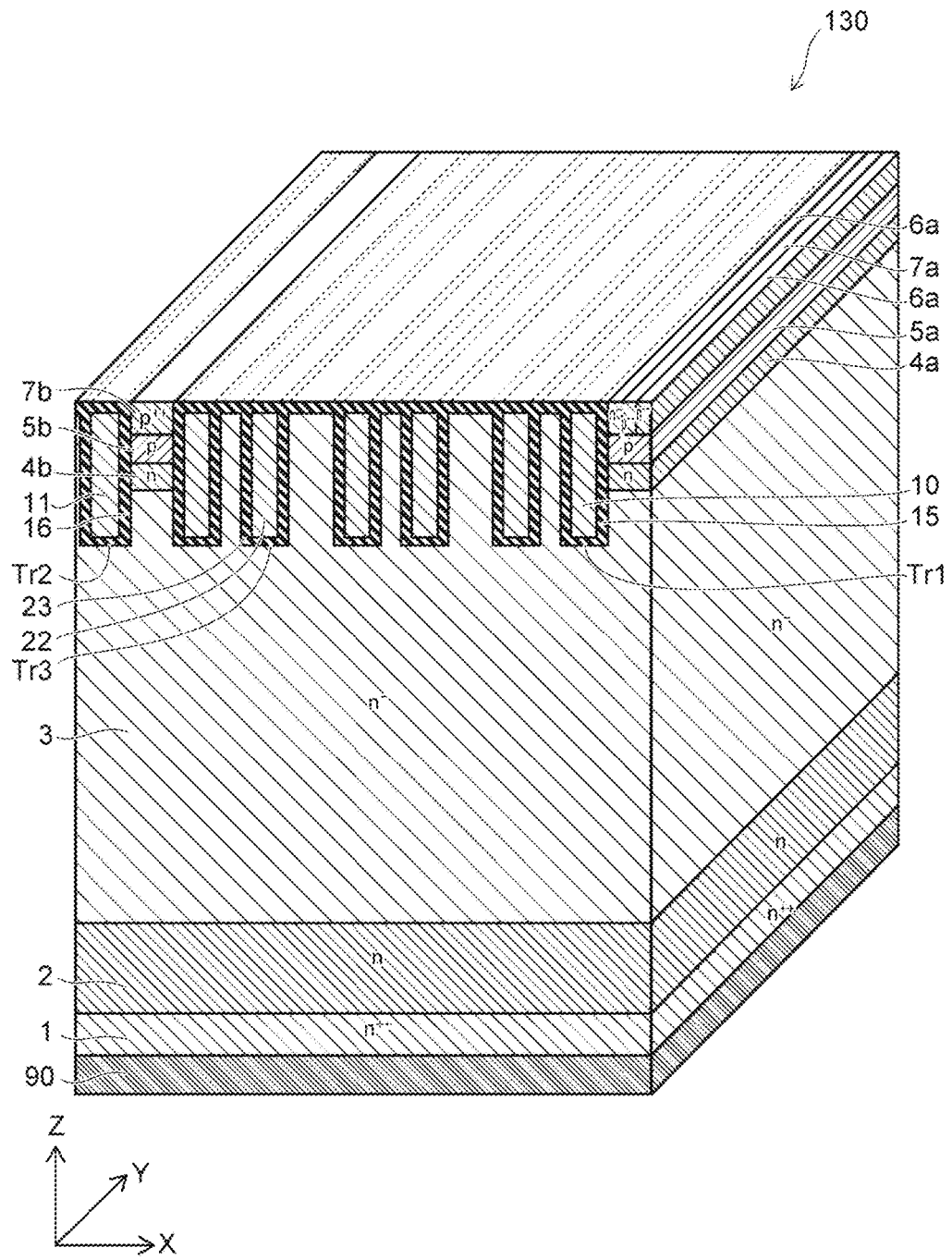
FIG. 18 is a perspective cross-sectional view that illustrates a part of a semiconductor device according to some embodiments.

FIG. 18 is a perspective cross-sectional view that illustrates apart of a semiconductor device 130 according to some embodiments.

In some embodiments, on the upper surface of the semiconductor device 130 illustrated in FIG. 18, outer edges of gate electrodes 10 and 11, an electrode 22, and trenches Tr1 to Tr3 of in the case of being seen in the Z direction are illustrated using broken lines. In FIG. 18, an emitter electrode 91a and a current gate electrode 91b are not illustrated.

In some embodiments, the semiconductor device 130 further includes the electrode 22 and an insulating layer 23, which is different from the semiconductor device 120.

In some embodiments, the electrode 22 is disposed in an n$^-$ type semiconductor region 3 via the insulating layer 23. In some embodiments, the electrode 22 is electrically connected to the emitter electrode 91a.

In some embodiments, a plurality of the electrodes 22 are disposed between a p-type base region 5a and a p-type anode region 5b in the X direction and extend in the Y direction. In some embodiments, areas between the electrodes 22 of the n$^-$ type semiconductor region 3 are covered with the insulating layer 23.

In some embodiments, the emitter electrode 91a, similar to the semiconductor device 120, is disposed on an n$^{++}$ type contact region 6a and a p$^{++}$ type contact region 7a. In some embodiments, the emitter electrode 91a may be disposed on the electrode 22. In some embodiments, the current gate electrode 91b, similar to the semiconductor device 120, is disposed on the p$^{++}$ type contact region 7b.

In some embodiments, by increasing a distance between the p-type base region 5a and the p-type anode region 5b (or decreasing areas of the p-type base region 5a and the p-type anode region 5b per unit area) by arranging the plurality of the electrodes 22, it is difficult for excess carriers to be discharged from the n$^-$ type semiconductor region 3 in the ON state. For this reason, according to some embodiments (e.g., the embodiment illustrated in FIG. 18), by increasing the accumulation amount of excess carriers in the n$^-$ type semiconductor region 3 in the ON state, further improvement of the conduction capability of the semiconductor device, a decrease in the on resistance, and a decrease in the drive current can be achieved.

Figure 19:
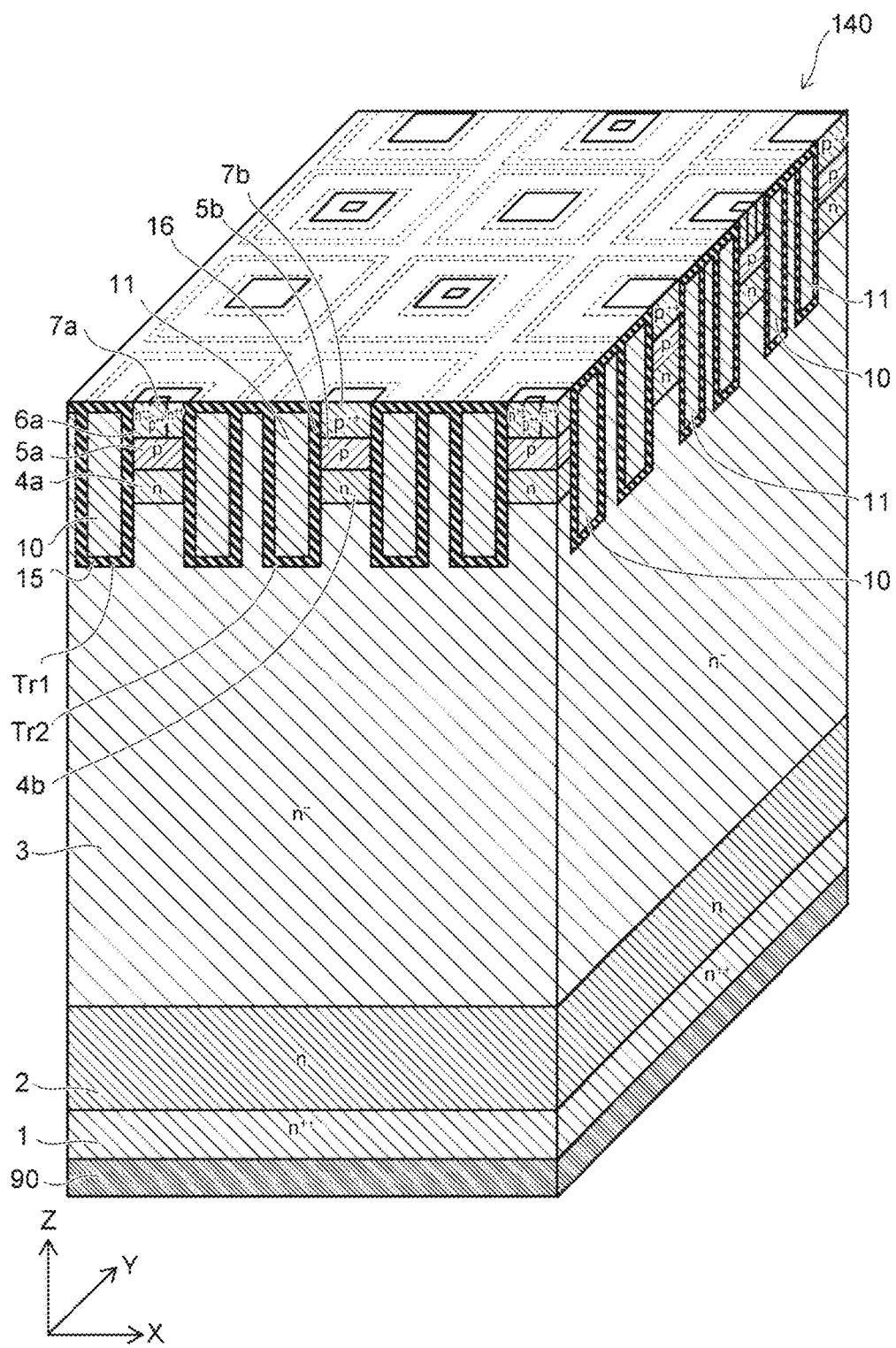
FIG. 19 is a perspective cross-sectional view that illustrates a part of a semiconductor device according to some embodiments.

FIG. 19 is a perspective cross-sectional view that illustrates apart of a semiconductor device 140 according to some embodiments.

In some embodiments, on the upper surface of the semiconductor device 140 illustrated in FIG. 19, outer edges of gate electrodes 10 and 11 and trenches Tr1 and Tr2 of in the case of being seen in the Z direction are illustrated using broken lines. In FIG. 19, an emitter electrode 91a and a current gate electrode 91b are not illustrated.

In some embodiments, in the semiconductor device 140, the gate electrodes 10 and 11 are disposed in an annular shape in an n$^-$ type semiconductor region 3 via the gate insulating layers 15 and 16.

In some embodiments, an n-type barrier region 4a, a p-type base region 5a, an n$^{++}$ type contact region 6a, and a p$^{++}$ type contact region 7a are disposed on the inner side of the gate electrode 10. The n$^{++}$ type contact region 6a, for example, is disposed in an annular shape on the inner side of the gate electrode 10, and the p$^{++}$ type contact region 7a is disposed on the inner side of the n$^{++}$ type contact region 6a.

In some embodiments, an n-type barrier region 4b and a p-type anode region 5b are disposed on the inner side of the gate electrode 11. In some embodiments, on the p-type anode region 5b, a p$^{++}$ type contact region 7b may be further disposed.

In some embodiments, on the n$^{++}$ type contact region 6a and the p$^{++}$ type contact region 7a, the emitter electrode 91a (not illustrated in the drawing) is disposed, and is electrically connected to such semiconductor regions. In some embodiments, on the p-type anode region 5b, the current gate electrode 91b not illustrated in the drawing is disposed and is electrically connected to the p-type anode region 5b.

In some embodiments (e.g., the embodiment illustrated in FIG. 19), in the semiconductor device, a plurality of regions functioning as MOSFETs and a plurality of regions used for injecting holes into the n$^-$ type semiconductor region 3 are disposed to be separated from each other in the X direction and the Y direction. In some embodiments (e.g., the embodiment illustrated in FIG. 19), the IE effect can be further increased as compared with the semiconductor device 100, and further improvement of the conduction capability of the semiconductor device, a decrease in the on resistance, and a decrease in the drive current can be achieved.

Figure 20:
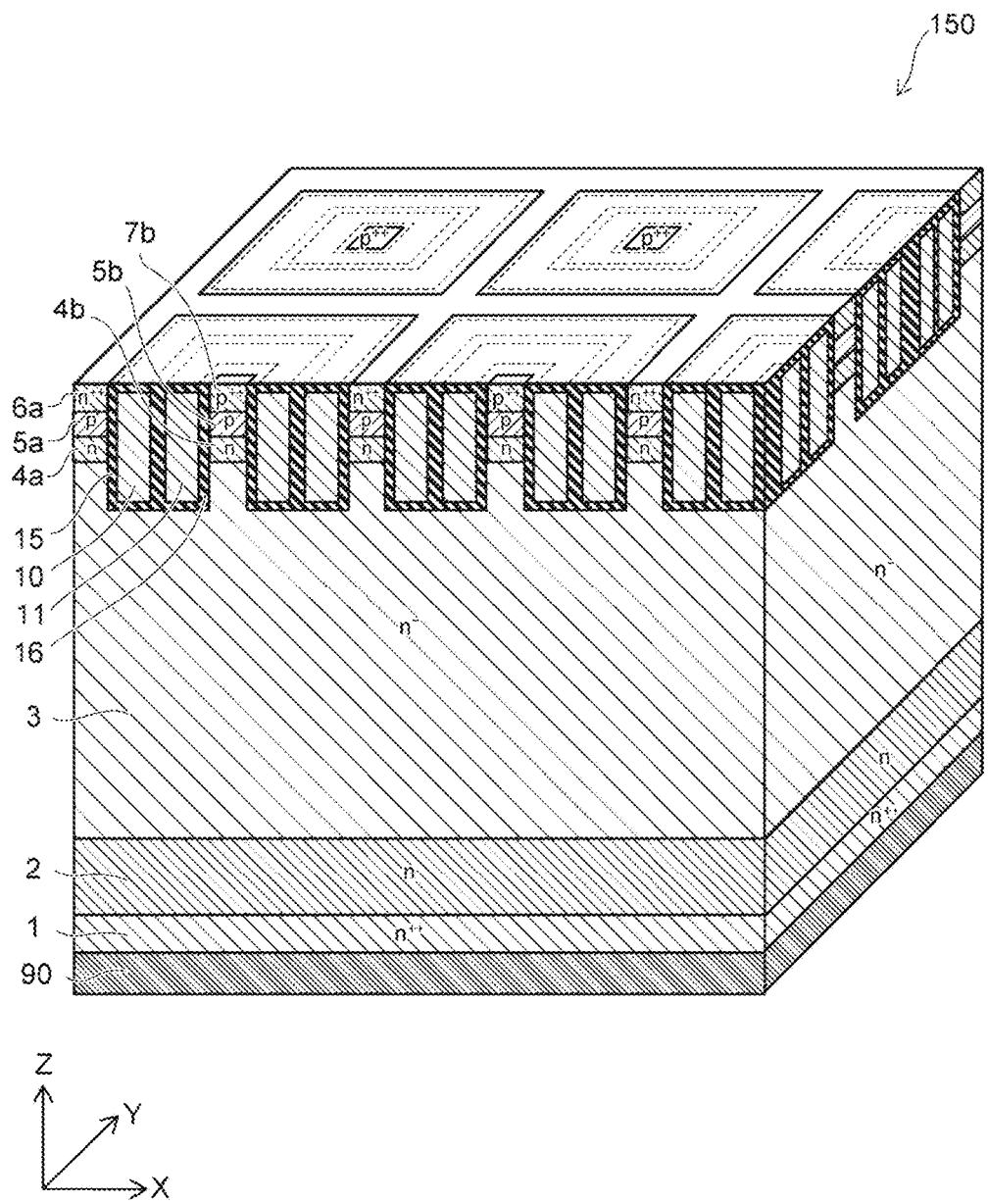
FIG. 20 is a perspective cross-sectional view that illustrates a part of a semiconductor device according to some embodiments.

FIG. 20 is a perspective cross-sectional view that illustrates apart of a semiconductor device 150 according to some embodiments.

In some embodiments, on the upper surface of the semiconductor device 150 illustrated in FIG. 20, outer edges of gate electrodes in the case of being seen in the Z direction are illustrated using broken lines. In FIG. 20, an emitter electrode 91a and a current gate electrode 91b are not illustrated.

In some embodiments, in the semiconductor device 150, the gate electrodes 10 and 11 are disposed in an annular shape. In some embodiments, the gate electrode 11 is disposed on the inner side of the gate electrode 10, and an n-type barrier region 4b and a p-type anode region 5b are disposed on the inner side of the gate electrode 11 via a gate insulating layer 16, which are different from the semiconductor device 140. In some embodiments, a current gate electrode 91b is disposed on the p-type anode region 5b.

In some embodiments, an n-type barrier region 4a, a p-type base region 5a, and an n$^{++}$ type contact region 6a are disposed between the gate electrodes 10 via a gate insulating layer 15. In some embodiments, on the p-type base region 5a, a p$^{++}$ type contact region 7a may be further disposed. The emitter electrode 91a, for example, is disposed in a lattice shape between the current gate electrodes 91b along the n-type barrier region 4a, the p-type base region 5a, and the n$^{++}$ type contact region 6a.

In some embodiments (e.g., the embodiment illustrated in FIG. 20), in the semiconductor device, a plurality of the regions used for injecting holes into the n$^-$ type semiconductor region 3 are disposed to be separated from each other in the X direction and the Y direction, and a region functioning as a MOSFET is disposed between such regions. In some embodiments (e.g., the embodiment illustrated in FIG. 20), the IE effect can be further increased as compared with the semiconductor device 100, and further improvement of the conduction capability of the semiconductor device, a decrease in the on resistance, and a decrease in the drive current can be achieved.

Here, an example of a control circuit connected to the semiconductor device according to some embodiments will be described with reference to FIGS. 21A to 21C and FIG. 22A and FIG. 22B.

FIGS. 21A to 21C and FIG. 22A and FIG. 22B are circuit diagrams that illustrate parts of a control circuit of the semiconductor device according to some embodiments.

In FIGS. 21A to 21C and FIG. 22A and FIG. 22B, the gate electrodes 10a and 10b are collectively represented as a gate electrode 10, and the gate electrodes 11a and 11b are collectively represented as a gate electrode 11. The emitter electrode 91a is connected to ground electric potential.

Figure 21A:
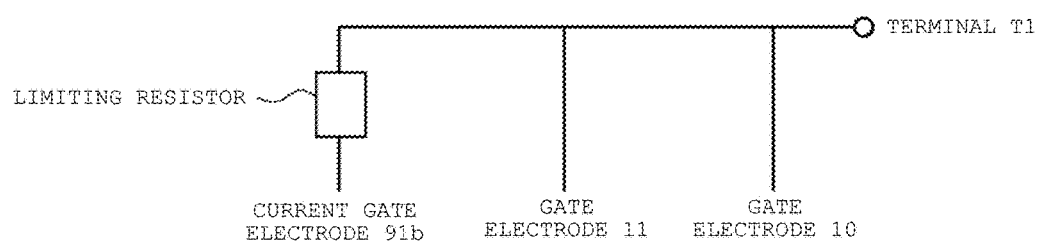
FIG. 21A, FIG. 21B, and FIG. 21C are circuit diagrams that illustrate parts of control circuits of the semiconductor device according to some embodiments.

In some embodiments, in a circuit illustrated in FIG. 21A, the current gate electrode 91b and the gate electrodes 10 and 11 are connected to a common terminal T1. In some embodiments, between the current gate electrode 91b and the terminal T1, a limiting resistor used for adjusting a voltage applied to the terminal T1 and applying the adjusted voltage to the current gate electrode 91b is connected. In some embodiments, when the semiconductor device 100 is turned on, a positive voltage is applied to the terminal T1. In some embodiments, when the positive voltage is applied to the terminal T1, an inversion layer is formed in the p-type base region 5a facing the gate electrode 10. In some embodiments, by applying a positive voltage of the built-in potential or more to the current gate electrode 91b, holes are injected to the n⁻ type semiconductor region 3.

In some embodiments, in the circuit illustrated in FIG. 21A, the voltages of the current gate electrode 91b and the gate electrodes 10 and 11 can be controlled using one terminal, and an increase in the number of terminals of the semiconductor device 100 can be suppressed.

Figure 21B:
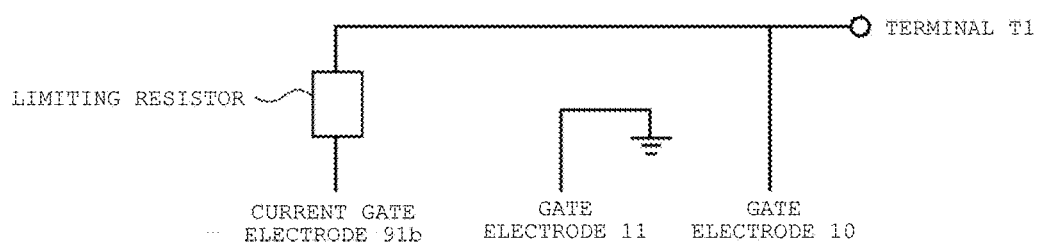

In some embodiments, a circuit illustrated in FIG. 21B, the gate electrode 11 is not connected to the terminal T1 but is connected to the ground electric potential that is the same as the electric potential of the emitter electrode 91a, which is different from the circuit illustrated in FIG. 21A. For this reason, compared to the circuit illustrated in FIG. 21A, the capacitance in a wiring to which the gate electrode 10 is connected is decreased, and the switching speed of the gate electrode 10 can be improved. In some embodiments, while holes of the p-type base region 5b near the gate insulating layer 16a are ejected when a positive voltage is applied to the gate electrode 11, in the circuit illustrated in FIG. 21B, such a phenomenon does not occur. For this reason, compared to the circuit illustrated in FIG. 21A, the injection of holes into the n⁻ type semiconductor region 3 can be efficiently performed.

Figure 21C:
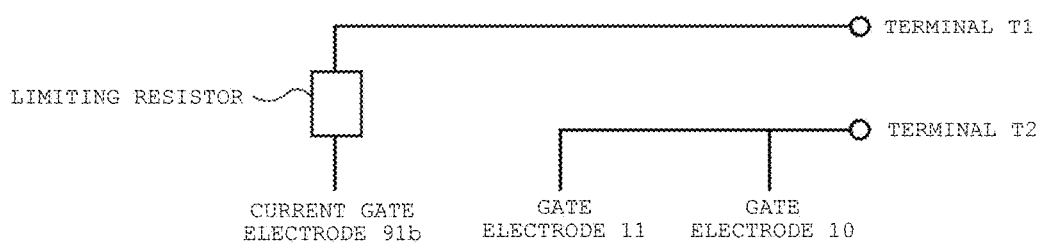

In some embodiments, in a circuit illustrated in FIG. 21C, the current gate electrode 91b is connected to the terminal T1 via a limiting resistor, and the gate electrodes 10 and 11 are connected to a common terminal T2. For this reason, optimal voltages can be applied to the current gate electrode 91b and the gate electrodes 10 and 11.

Figure 22A:
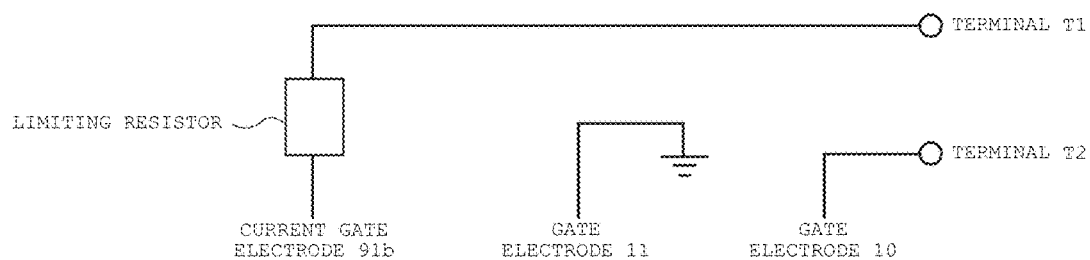
FIG. 22A and FIG. 22B are circuit diagrams that illustrate parts of control circuits of the semiconductor device according to some embodiments.

In some embodiments, in a circuit illustrated in FIG. 22A, the gate electrode 11 is not connected to the terminal T2 but is connected to the ground electric potential, which is different from the circuit illustrated in FIG. 21C. In some embodiments, according to the circuit illustrated in FIG. 22A, compared to the circuit illustrated in FIG. 21C, the switching speed is improved, and the injection of holes into the n⁻ type semiconductor region 3 can be efficiently performed.

Figure 22B:
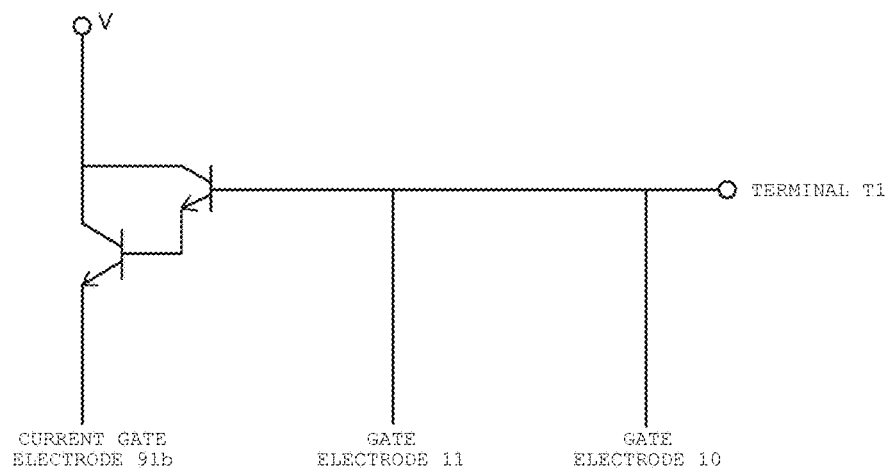

In some embodiments, in a circuit illustrated in FIG. 22B, a transistor connected between a terminal T1 and the current gate electrode 91b via a Darlington connection is disposed instead of the limiting resistor, which is different from the circuit illustrated in FIG. 21A. In some embodiments, the collector side of the Darlington connection is connected to a collector power supply V, the terminal T1 is connected to the base, and the current gate electrode 91b is connected to the emitter side. According to this circuit, by using a small gate current, a large current can be caused to flow from the collector power supply V to the current gate electrode 91b. In some embodiments, also for a small gate current, holes can be injected into the n⁻ type semiconductor region 3.

In addition to the examples of the circuits described above, In some embodiments, a specific circuit configuration may be appropriately changed as long as holes can be injected into the n⁻ type semiconductor region 3 from the current gate electrode 91b by turning on a MOSFET included in the semiconductor device.

Figure 23:
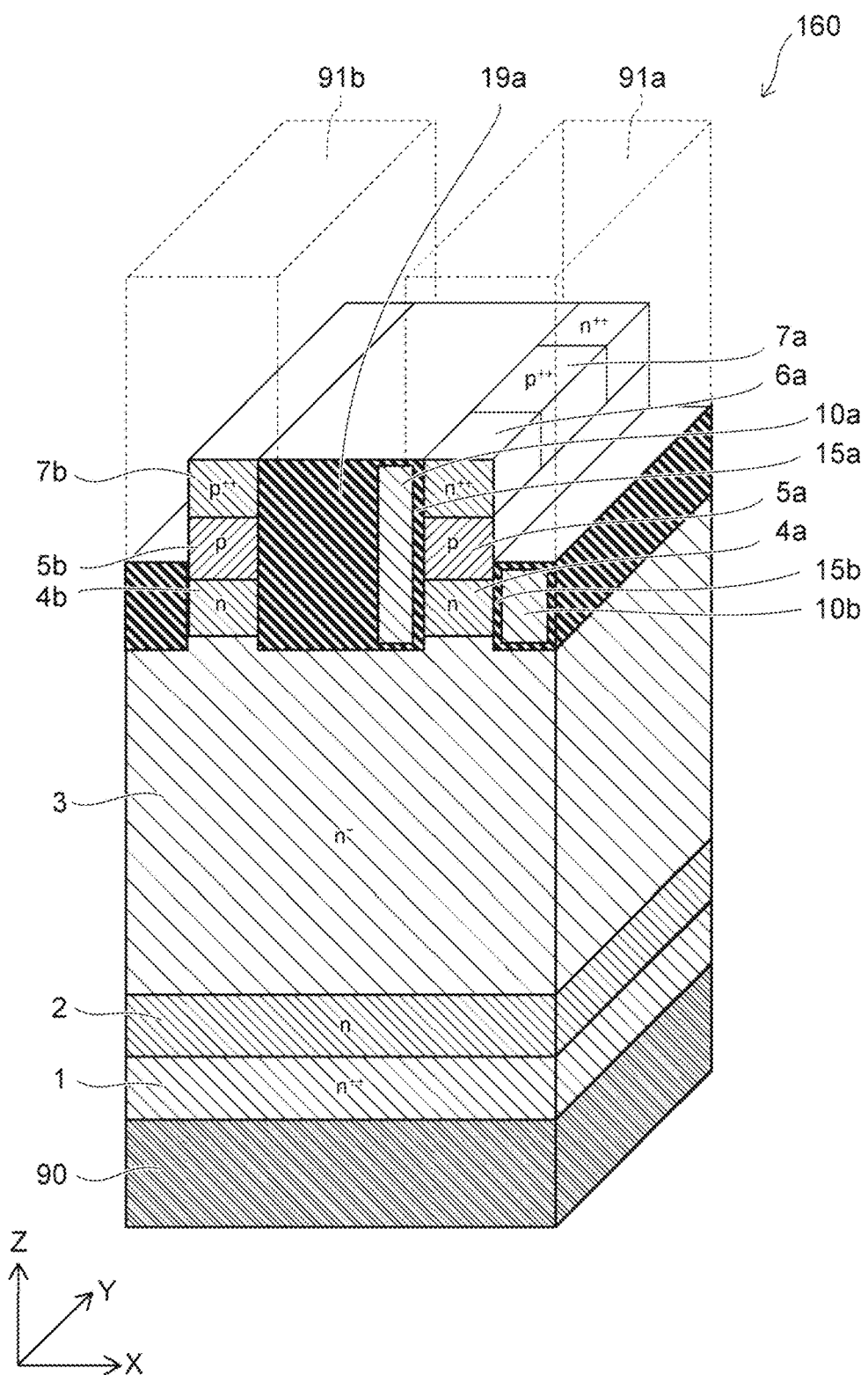
FIG. 23 is a perspective cross-sectional view that illustrates a part of a semiconductor device according to some embodiments.

FIG. 23 is a perspective cross-sectional view that illustrates apart of a semiconductor device 160 according to some embodiments.

The semiconductor device 160 does not include the gate electrodes 11a and 11b, which is different from the semiconductor device 100.

In some embodiments, in a case where the gate electrodes 11a and 11b are not disposed, by applying a voltage of the built-in potential or more with respect to the emitter electrode 91a to the current gate electrode 91b, holes can be injected into the n⁻ type semiconductor region 3. In some embodiments, as described above, by applying a negative voltage to the gate electrodes 11a and 11b, the injection of holes into the n⁻ type semiconductor region 3 is promoted, and the conduction capability of the semiconductor device is further improved, and the on resistance can be decreased.

An example of a semiconductor device according to some embodiments will be described with reference to FIG. 24 and FIG. 25.

Figure 24:
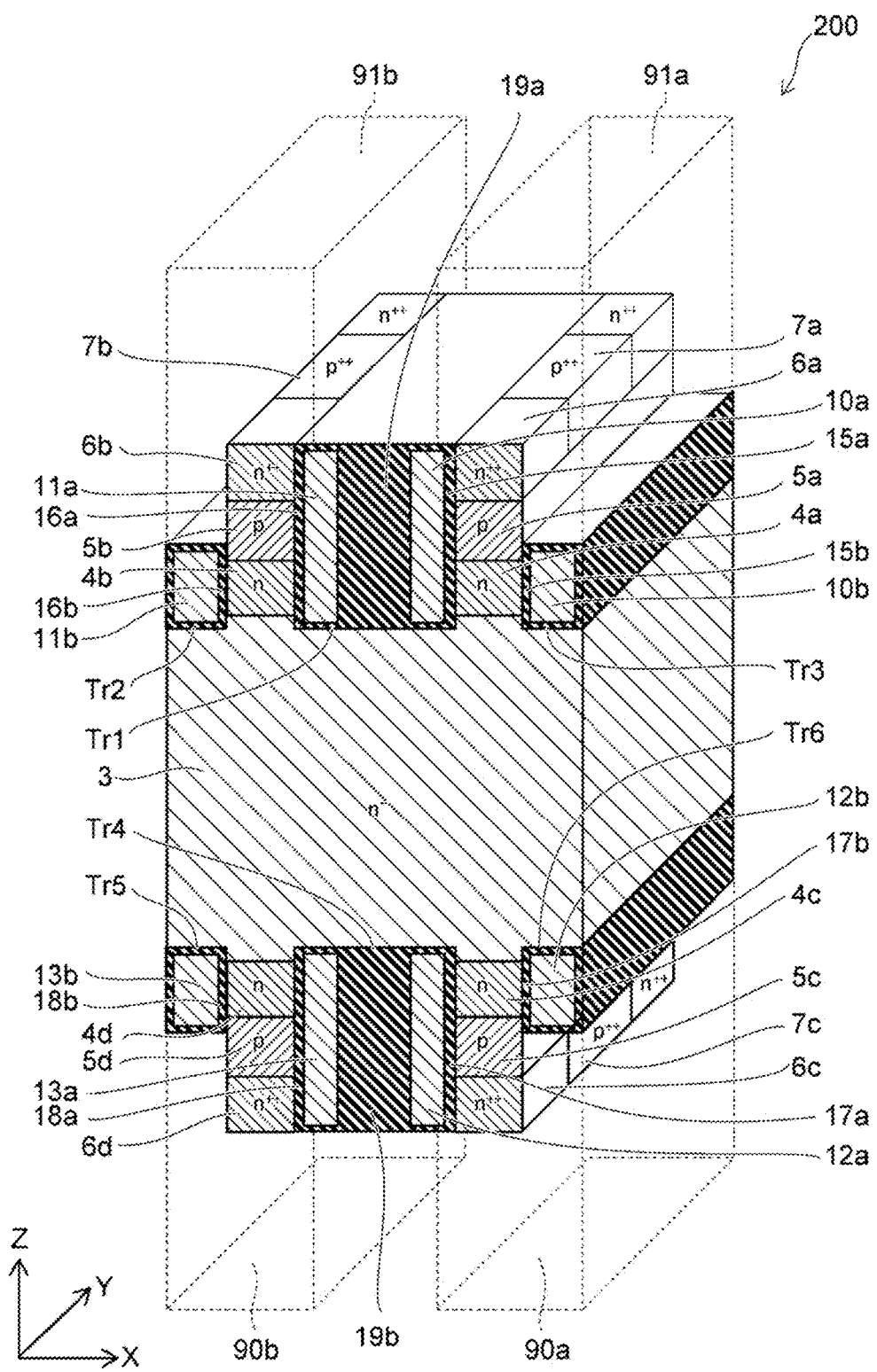
FIG. 24 is a perspective cross-sectional view that illustrates a part of a semiconductor device according to some embodiments.
Figure 25:
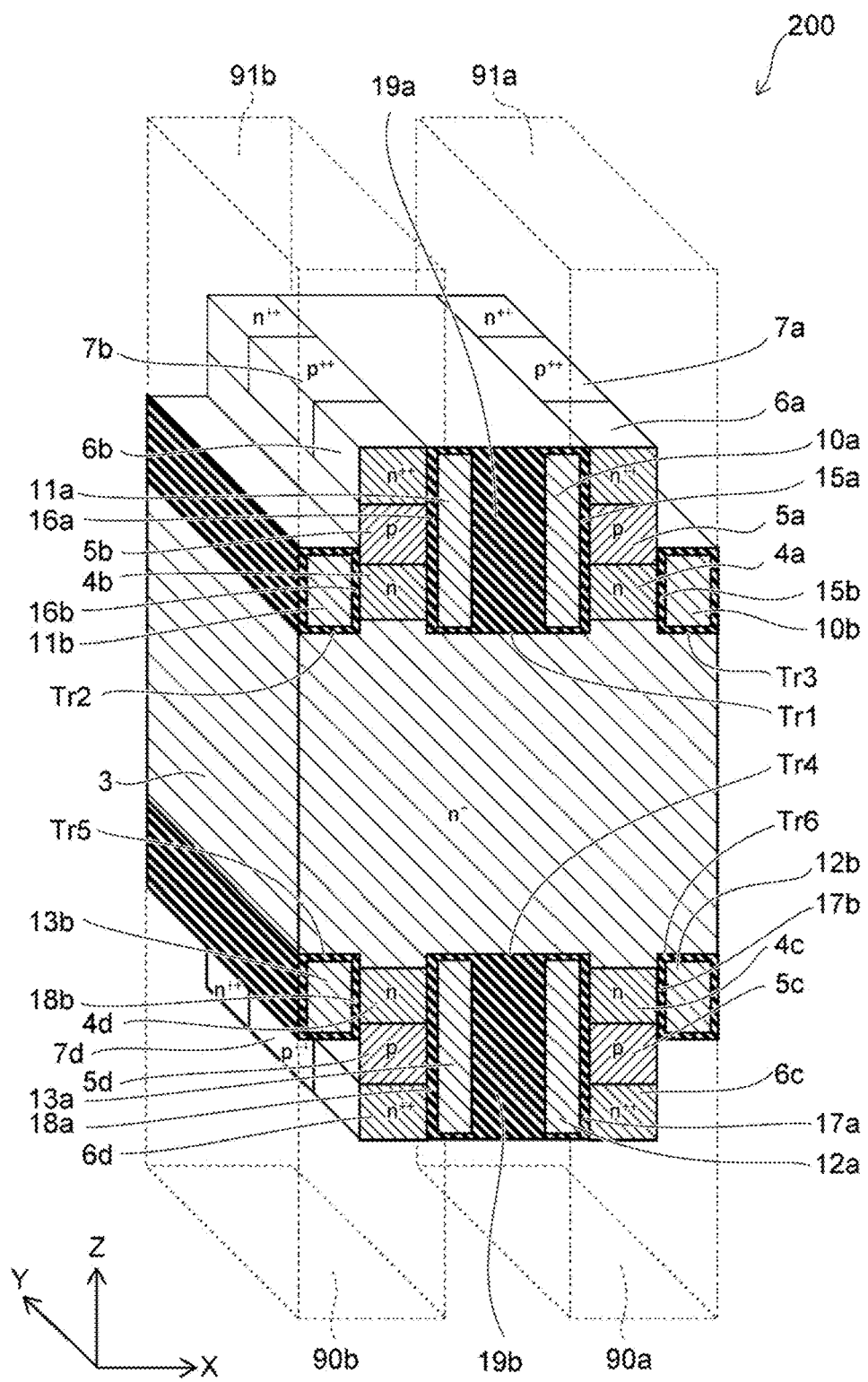
FIG. 25 is a perspective cross-sectional view that illustrates a part of the semiconductor device according to some embodiments.

FIG. 24 and FIG. 25 are perspective cross-sectional views that illustrate a part of the semiconductor device 200 according to some embodiments.

In FIG. 24 and FIG. 25, an emitter electrode 91a and a current gate electrode 91b are illustrated as being transmitted.

In FIG. 24 and FIG. 25, appearances acquired when the semiconductor device 200 is seen at mutually-different angles are illustrated.

In some embodiments, as illustrated in FIG. 24, on an n-type barrier region 4a, similar to the semiconductor device 100, a p-type base region 5a, an n⁺⁺ type contact region 6a, a p⁺⁺ type contact region 7a, and the emitter electrode 91a are disposed.

In some embodiments, on the n-type barrier region 4b, a p-type base region 5b is disposed. In some embodiments, on the p-type base region 5b, an n⁺⁺ type contact region 6b and a p⁺⁺ type contact region 7b are selectively disposed (e.g., (1) the n⁺⁺ type contact region 6b or (2) the p⁺⁺ type contact region 7b or (3) both of the regions 6b and 7b are disposed on the p-type base region 5b). In some embodiments, the p-type base region 5b, the n⁺⁺ type contact region 6b, and the p⁺⁺ type contact region 7b are electrically connected to the current gate electrode 91b.

In some embodiments, the n-type barrier region 4a and the p-type base region 5a are disposed between a trench Tr1 in which the gate electrodes 10a and 11a, the gate insulating layers 15a and 16a, and an insulating part 19a are disposed and a trench Tr2 in which the gate electrode 10b and the gate insulating layer 15b are disposed. In some embodiments, the n-type barrier region 4b and the p-type anode region 5b are disposed between the trench Tr1 and a trench Tr3 in which the gate electrode 11b and the gate insulating layer 16b are disposed.

In some embodiments, under a part of the n⁻ type semiconductor region 3, an n-type barrier region 4c is disposed, and, under the n-type barrier region 4c, a p-type base region 5c is disposed. In some embodiments, under the p-type base region 5c, an n⁺⁺ type contact region 6c and a p⁺⁺ type contact region 7c are disposed. In some embodiments, a collector electrode 90a is in contact with a lower surface and one side surface of the n⁺⁺ type contact region 6c, a lower surface and one side surface of the p⁺⁺ type contact region 7c, and one side surface of the p-type base region 5c and is electrically connected to such semiconductor regions.

In some embodiments, gate electrodes 12a and 12b are disposed on the n⁻ type semiconductor region 3 respectively via gate insulating layers 17a and 17b. In some embodiments, a length of the gate electrode 12b in the Z direction is shorter than a length of the gate electrode 12a in the Z direction. In some embodiments, the n-type barrier region 4c and the p-type base region 5c are positioned between the gate electrodes 12a and 12b in the X direction and respectively face the gate electrodes 12a and 12b via the gate insulating layers 17a and 17b.

In some embodiments, as illustrated in FIG. 25, the n-type barrier region 4d is disposed under another part of the n⁻ type semiconductor region 3 and is separated from the n-type barrier region 4c in the X direction. The structure of the lower side of the n-type barrier region 4d, for example, is symmetrical to the structure of the lower side of the n-type barrier region 4c in the X direction.

In some embodiments, the p-type base region 5d is disposed under the n-type barrier region 4d, and, under the p-type base region 5d, the n⁺⁺ type contact region 6d and the p⁺⁺ type contact region 7d are disposed. In some embodiments, the collector electrode 90b is electrically connected to the p-type base region 5d, the n⁺⁺ type contact region 6d, and the p⁺⁺ type contact region 7d. In some embodiments, the n-type barrier region 4d and the p-type base region 5d respectively face the gate electrodes 13a and 13b via the gate insulating layers 18a and 18b in the X direction.

In some embodiments, the n-type barrier region 4c and the p-type base region 5c are disposed between a trench Tr4 in which the gate electrodes 12a and 13a, the gate insulating layers 17a and 18a, and the insulating part 19b are disposed and a trench Tr5 in which the gate electrode 12b and the gate insulating layer 17b are disposed. In some embodiments, the n-type barrier region 4d and the p-type base region 5d are disposed between the trench Tr4 and a trench Tr6 in which the gate electrode 13b and the gate insulating layer 18b are disposed.

In some embodiments, between the gate electrodes 12a and 12b and the collector electrode 90a, the gate insulating layers 17a and 17b are disposed, and such electrodes are separated from each other. In some embodiments, between the gate electrodes 13a and 13b and the collector electrode 90b, the gate insulating layers 18a and 18b are disposed, and such electrodes are separated from each other. In some embodiments, between the gate electrodes 12a and 13a, the insulating part 19b is disposed, and the gate electrodes 12a and 13a are separated from each other in the X direction.

In some embodiments, in the case illustrated in FIG. 24 and FIG. 25, while the trenches Tr1 to Tr3, the gate electrodes 10a and 11a, and the like disposed on the emitter electrode 91a side are aligned with the trenches Tr4 to Tr6, the gate electrodes 12a and 13a, and the like disposed on the collector electrode 90a and 90b side in the Z direction, such constituent elements may not be aligned in the Z direction.

In some embodiments, in the case illustrated in FIG. 24 and FIG. 25, while the trenches Tr1 to Tr3, the gate electrodes 10a and 11a, and the like disposed on the emitter electrode 91a side extend in a same direction as the extending direction of the trenches Tr4 to Tr6, the gate electrodes 12a and 13a, and the like disposed on the collector electrode 90a and 90b side, such constituent elements may extend in mutually-different directions.

The relations of the lengths of the trenches Tr4 to Tr6 in the X direction and the distances therebetween in the X direction, for example, are the same as the relations of the trenches Tr1 to Tr3 described with reference to FIG. 15.

Next, examples of a method of driving the semiconductor device 200 according to some embodiments will be described.

Figure 26:
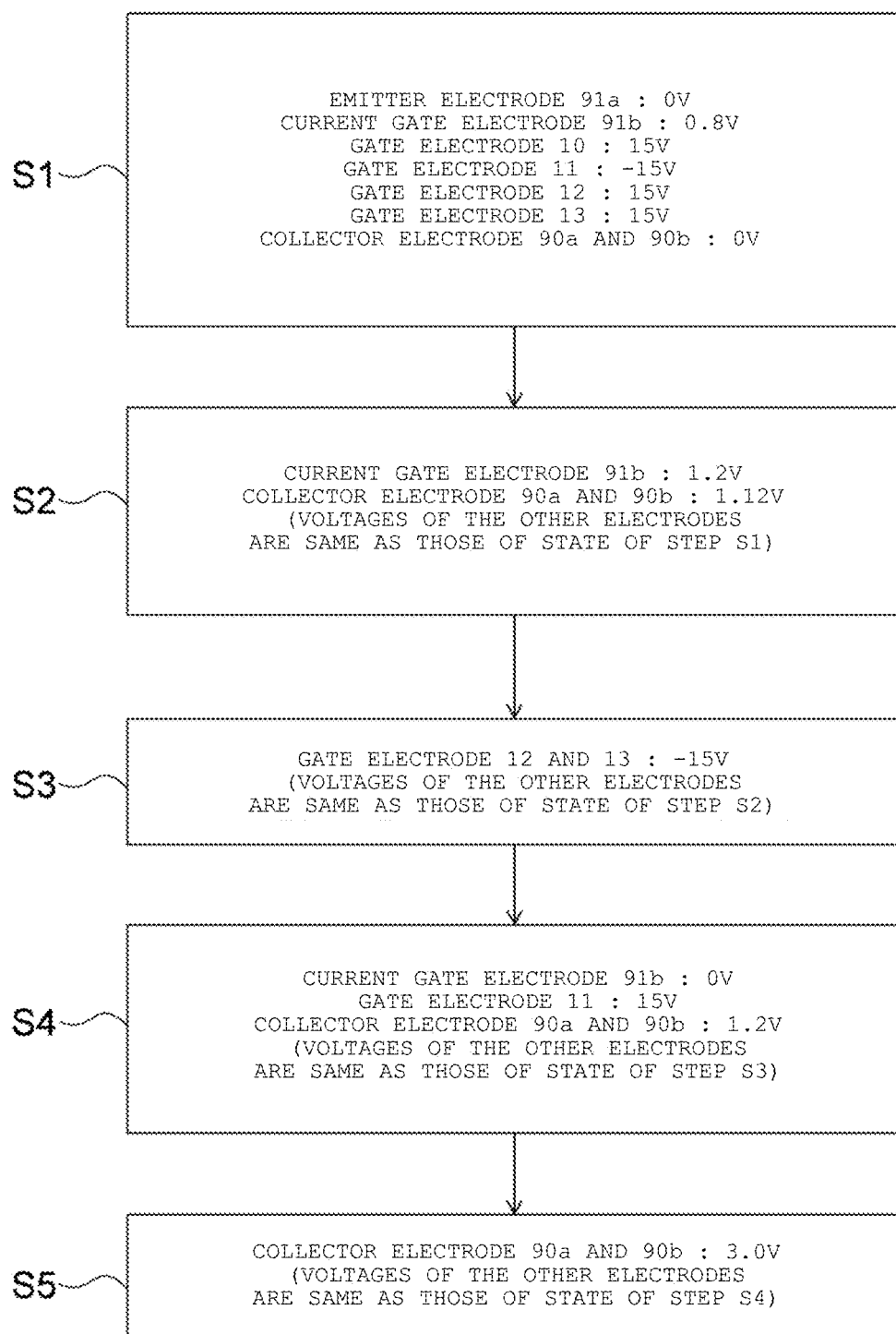
FIG. 26 is a flowchart that illustrates an example of a method of driving the semiconductor device according to some embodiments.
Figure 27:
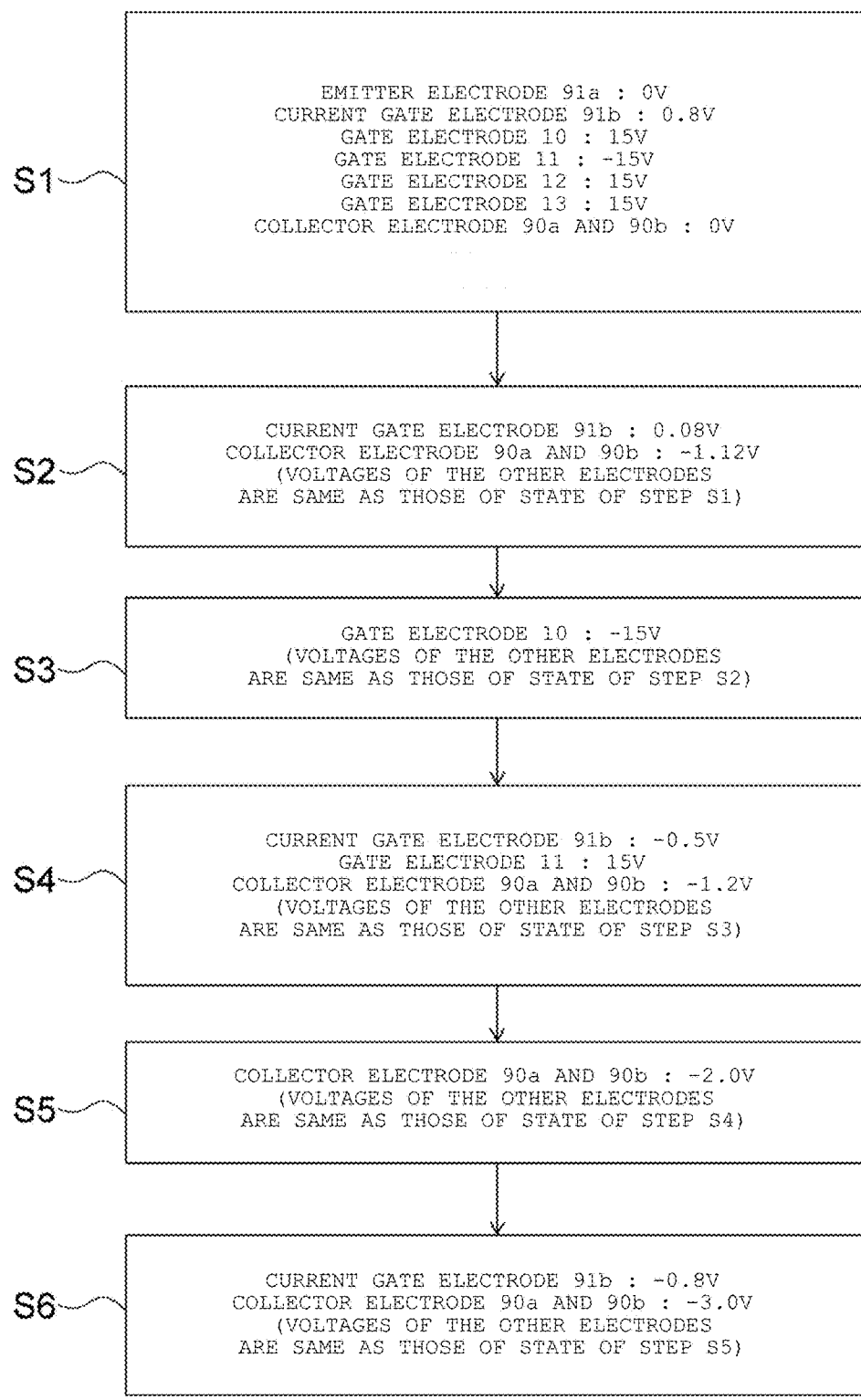
FIG. 27 is a flowchart that illustrates an example of a method of driving the semiconductor device according to some embodiments.

FIG. 26 and FIG. 27 are flowcharts that illustrate examples of the method of driving the semiconductor device 200 according to some embodiments.

In FIG. 26 and FIG. 27, the examples of the driving method in a case where each semiconductor region is configured of silicon are illustrated. In FIG. 26 and FIG. 27, the gate electrodes 10a and 10b are collectively represented as a gate electrode 10. Similarly, the gate electrodes 11a, 11b, 12a, 12b, 13a, and 13b are respectively represented as gate electrodes 11, 12, and 13.

First, a case will be described with reference to FIG. 26 in which a current is caused to flow from the collector electrodes 90a and 90b to the emitter electrode 91a.

In some embodiments, in an initial state, any voltage is not applied to the emitter electrode 91a, the current gate electrode 91b, the gate electrodes 10 to 13, and the collector electrodes 90a and 90b.

From this state, voltages illustrated in Step S1 are applied to the electrodes. In some embodiments, by applying a positive voltage of built-in potential (e.g., 0.7 V) or more with respect to the emitter electrode 91a to the current gate electrode 91b, holes are injected from the p⁺⁺ type contact region 7b into the n⁻ type semiconductor region 3. In some embodiments, by applying negative voltages to the gate electrode 11, a hole accumulating layer is formed in the p-type base region 5b, and the injection of holes into the n⁻ type semiconductor region 3 is promoted. In some embodiments, by applying positive voltages to the gate electrodes 10, 12, and 13, inversion layers are formed in the p-type base regions 5a, 5c and 5d.

Next, voltages illustrated in Step S2 are applied to the electrodes. In some embodiments, by applying a positive voltage to the collector electrodes 90a and 90b, electrons flow from the emitter electrode 91a toward the collector electrodes 90a and 90b. In some embodiments, in accordance with the application of the positive voltage to the collector electrodes 90a and 90b, the voltage applied to the current gate electrode 91b is increased. In this way, by suppressing an increase in an electric potential difference between the collector electrodes 90a and 90b and the current gate electrode 91b, it is difficult for a current to flow between the collector electrodes 90a and 90b and the current gate electrode 91b.

Next, voltages illustrated in Step S3 are applied to the electrodes. In some embodiments, by applying a negative voltage to the gate electrodes 12 and 13, hole accumulating layers are formed in the p-type base regions 5c and 5d, and holes are injected also from the collector electrodes 90a and 90b into the n⁻ type semiconductor region 3. In some embodiments, in Step S2, while the semiconductor device 200 operates as a MOSFET of a unipolar type having only electrons as the carriers, in this Step S3, the operation of the semiconductor device 200 is switched to an IEGT (IGBT) having electrons and holes as the carriers.

Next, voltages illustrated in Step S4 are applied to the electrodes. In some embodiments, by applying a negative voltage to the gate electrode 11 from the positive voltage, the hole accumulating layer formed in the p-type base region 5b disappears, and an inversion layer of electrons is formed. In addition, as the voltage of the current gate electrode 91b decreases, electrons start to flow from the current gate electrode 91b to the collector electrodes 90a and 90b through the inversion layer of the p-type base region 5b. In some embodiments, in Steps S1 to S3, while holes are injected from the current gate electrode 91b into the n⁻ type semiconductor region 3, in Step S4, electrons are injected from the current gate electrodes 91b into the n⁻ type semiconductor region 3.

Next, in some embodiments, as illustrated in Step S5, the voltage applied to the collector electrodes 90a and 90b is increased. Accordingly, the value of a current flowing through the semiconductor device 200 increases. At this time, in some embodiments, the semiconductor device 200 operates as an IEGT and has a large conduction capability. Accordingly, by increasing the voltage of the collector electrodes 90a and 90b, a large current according to the increase in the voltage can be caused to flow.

Next, a case will be described with reference to FIG. 27 in which a current is caused to flow from the emitter electrode 91a to the collector electrodes 90a and 90b.

Referring to FIG. 27, in some embodiments, first, the same voltages as those of Step S1 illustrated in FIG. 26 are applied to the electrodes. Accordingly, holes are injected into the n⁻ type semiconductor region 3.

Next, voltages illustrated in Step S2 (see FIG. 27) are applied to the electrodes. In some embodiments, a negative voltage is applied to the collector electrodes 90a and 90b. In some embodiments, the voltage applied to the current gate electrode 91b is decreased such that an electric potential difference between the current gate electrode 91b and the collector electrodes 90a and 90b is not too large. In some embodiments, by applying a negative voltage to the collector electrodes 90a and 90b, a current flows from the emitter electrode 91a to the collector electrodes 90a and 90b through the inversion layers of the p-type base regions 5a, 5c, and 5d.

Next, in some embodiments, as illustrated in Step S3 (see FIG. 27), a negative voltage is applied to the gate electrode 10. Accordingly, a hole accumulating layer is formed in the p-type base region 5a, and holes are injected from the emitter electrode 91a to the n⁻ type semiconductor region 3. According to this step, in some embodiments, the operation of the semiconductor device 200 is switched from a MOSFET to an IEGT.

Next, in some embodiments, voltages illustrated in Step S4 (see FIG. 27) are applied to the electrodes. In some embodiments, as the voltage applied to the gate electrode 11 is changed from the negative voltage to a positive voltage, the hole accumulating layer formed in the p-type base region 5b disappears, and an inversion layer of electrons is formed.

In some embodiments, in Steps S4, S5, and S6 (see FIG. 27), by increasing the negative voltage applied to the collector electrodes 90a and 90b, a reverse current is increased. In some embodiments, the negative voltage applied to the current gate electrode 91b is increased as appropriate in accordance with a change in the voltage of the collector electrodes 90a and 90b such that an electric potential difference between the current gate electrode 91b and the collector electrodes 90a and 90b is not too large.

Here, the current-voltage characteristics of the semiconductor device 200 acquired when the driving method described above is performed will be described with reference to FIG. 28.

Figure 28:
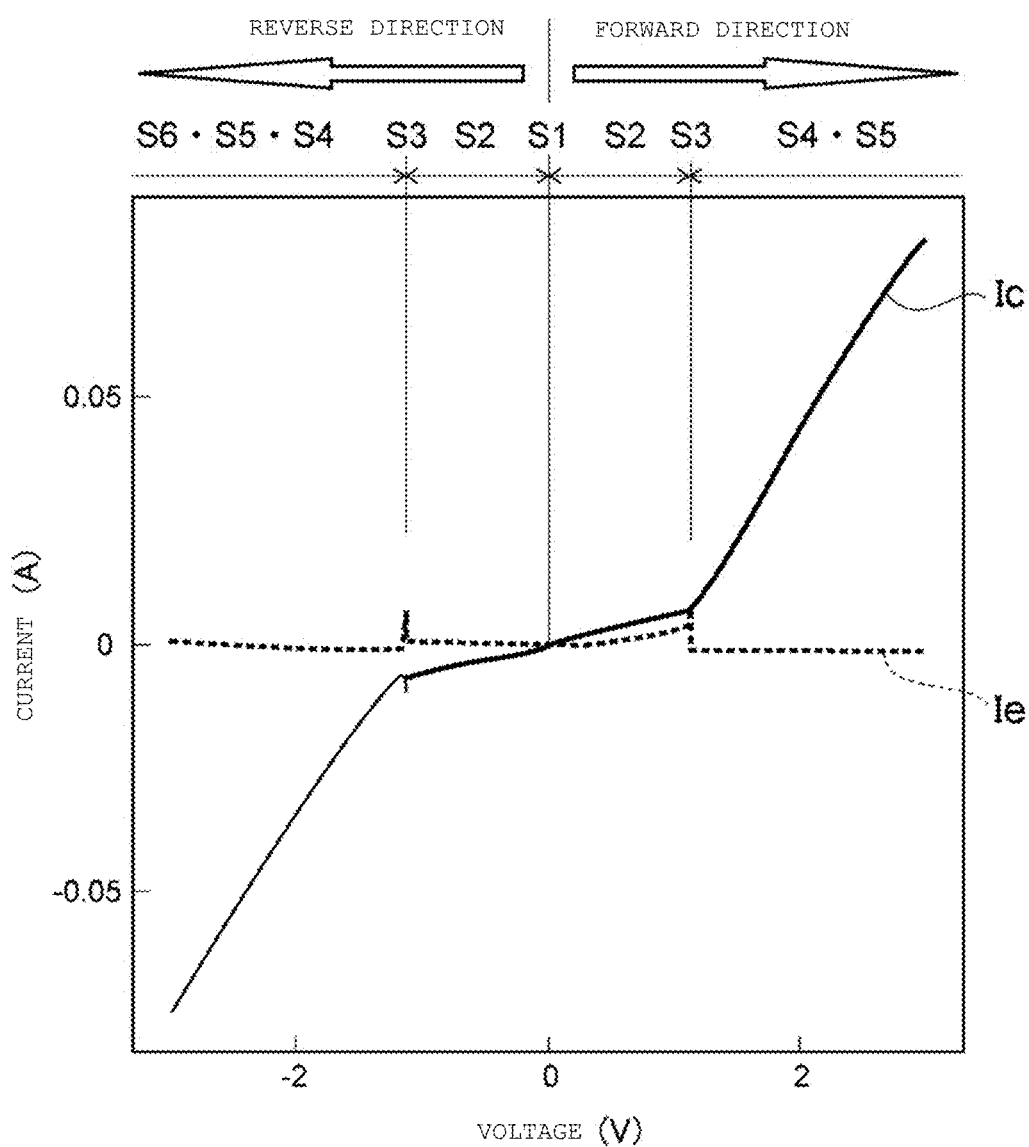
FIG. 28 is a graph that illustrates an example of current-voltage characteristics of the semiconductor device according to some embodiments.

FIG. 28 is a graph that illustrates an example of the current-voltage characteristics of the semiconductor device 200 according to some embodiments.

In FIG. 28, the horizontal axis represents a voltage Vc applied to the collector electrodes 90a and 90b. A solid line in the graph represents a change in a current Ic flowing through the collector electrodes 90a and 90b with respect to the voltage Vc, and a broken line represents a change in a current Ie flowing through the current gate electrodes 91b with respect to the voltage Vc. In addition, on the upper side of the graph, among the steps illustrated in FIG. 26 and FIG. 27, a step corresponding to each voltage Vc is described.

In a case where a forward current is caused to flow, in Step S2, since the semiconductor device 200 operates as a MOSFET, the current Ic linearly increases according to an increase in the voltage Vc. In Step S3, when the operation of the semiconductor device 200 is switched from the MOSFET to an IEGT, in the subsequent Steps S4 and S5, compared to Step S2, the current Ic greatly increases with respect to the voltage Vc.

Similarly, in a case where a reverse current is caused to flow, in Step S2, the current Ic linearly increases according to an increase in the voltage Vc. After Step S4, compared to Step S1, the current Ic greatly increases with respect to the voltage Vc.

In this way, based on the result illustrated in FIG. 28, it can be understood that, according to the semiconductor device illustrated in FIG. 24 and FIG. 25, a conduction characteristic in the deep conductivity modulation like a thyristor can be acquired according to injection of a small amount of holes from the current gate electrode 91b into the n⁻ type semiconductor region 3 in the range of the collector electrode from 0 V to ±3 V regardless of the conduction direction.

In some embodiments, while a case has been described in which holes are injected from the current gate electrode 91b into the n⁻ type semiconductor region 3 in Step S2, the gate electrode 12 or 13 may be controlled to inject holes from one of the collector electrodes 90a and 90b into the n⁻ type semiconductor region 3. In such a case, the same voltage as that of the current gate electrode 91b is applied to the one of the collector electrodes 90a and 90b in each of the steps illustrated in FIG. 26 and FIG. 27.

In some embodiments, in any of the forward conduction and the reverse conduction, the semiconductor device according to some embodiments (e.g., the embodiment illustrated in FIGS. 24-27) inject holes into the n⁻ type semiconductor region 3 and can cause the operation to proceed from a MOSFET to an IEGT (or IGBT) while causing deep conductivity modulation in the n⁻ type semiconductor region 3. For this reason, while conduction can be made in both directions, as illustrated in FIG. 28, there is no occurrence of a snap-back such as a triac.

Figure 29:
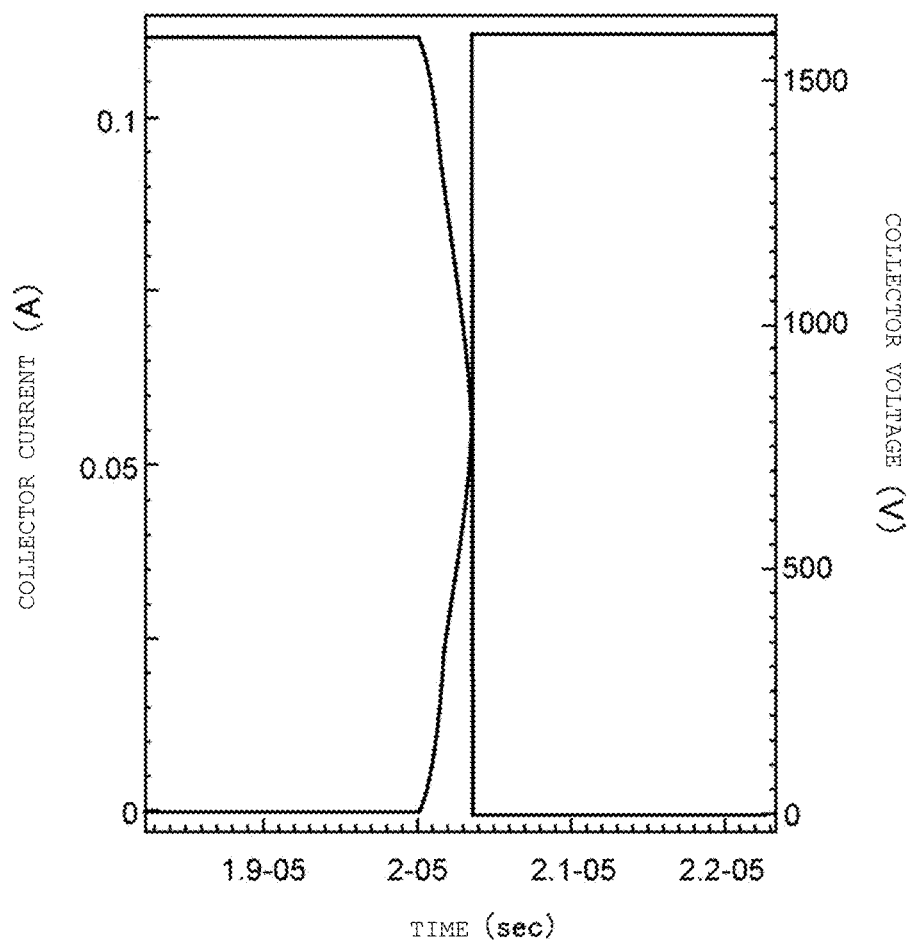
FIG. 29 is a simulation result that illustrates a waveform at the time of turn-off in the semiconductor device according to some embodiments.

FIG. 29 is a simulation result that illustrates a waveform at the time of turn-off in the semiconductor device 200 according to some embodiments.

FIG. 29 illustrate a result of a case where the gate electrodes 12a, 12b, 13a, and 13b are turned off at T=0 sec, and the gate electrodes 10a, 10b, 11a, and 11b are turned off at T=20 μsec. In other words, a result of a case where, by turning off the gate electrodes disposed on the collector electrode 90 side, injection of holes from the collector electrode 90 into the n⁻ type semiconductor region 3 is stopped, and thereafter, by turning off the gate electrodes disposed on the emitter electrode 91a side, injection of electrons from such electrodes is stopped is illustrated.

In this way, in some embodiments, by delaying timing at which the gate electrodes are turned off on the emitter electrode 91a side and the collector electrode 90 side, after the accumulation amount of excess carriers in the n⁻ type semiconductor region 3 is decreased, the semiconductor device can be turned off, whereby a switching loss at the time of turn-off can be decreased.

In some embodiments, at the time of turn-off, the tail current can be further decreased by causing the operation to proceed from an IEGT (or IGBT) to a MOSFET and turning off the operation regardless of whether the collector voltage is equal to or larger the built-in potential or less than the built-in potential. However, in the case of an actual semiconductor device of a high breakdown voltage, since the conduction of the MOSFET is lower than that of the IEGT, there is a possibility that, as the operation proceeds to the MOSFET, a short-circuit mode is formed, and the loss rather increases.

Next, a forward breakdown voltage and a reverse breakdown voltage of the semiconductor device according to some embodiments will be described with reference to FIGS. 30A to 30C and 31A to 31C.

FIGS. 30A to 30C are diagrams that illustrates a cross-sectional structure and a breakdown voltage of the semiconductor device according to a reference example.

More specifically, in FIG. 30A, the cross-sectional structure of a semiconductor device of a punch-through type is illustrated, and, in FIG. 30B, the cross-sectional structure of a semiconductor device of a non-punch-through type is illustrated. In FIG. 30C, the electric field of each point at the time of a forward breakdown voltage of the semiconductor device illustrated in FIG. 30A is represented using a broken line, and the electric field at each point at the time of a reverse breakdown voltage of the semiconductor device illustrated in FIG. 30B is represented using a solid line.

Figure 31C:
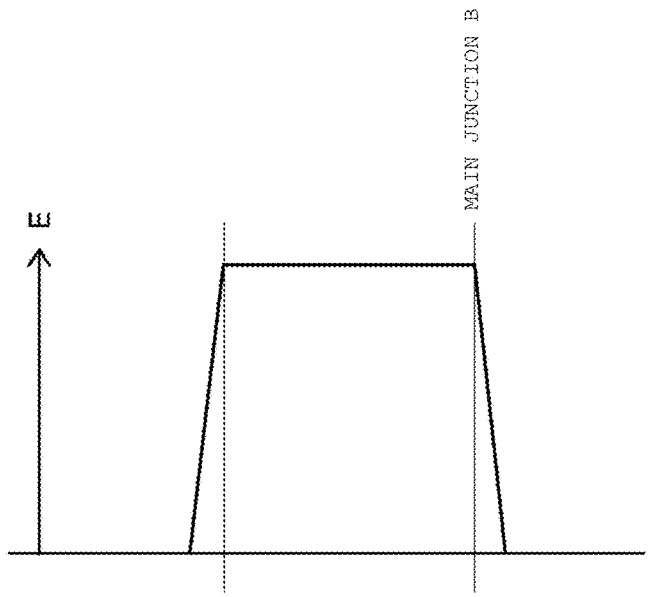
FIG. 31A, FIG. 31B, and FIG. 31C are diagrams that illustrate a cross-sectional structure of the semiconductor device according to some embodiments and electric fields of the inside of an element at the time of applying a breakdown voltage.
Figure 31B:
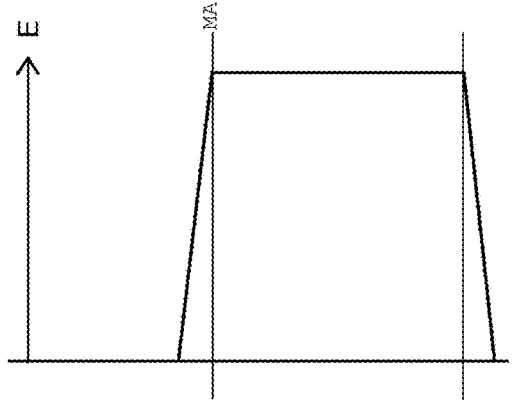
Figure 31A:
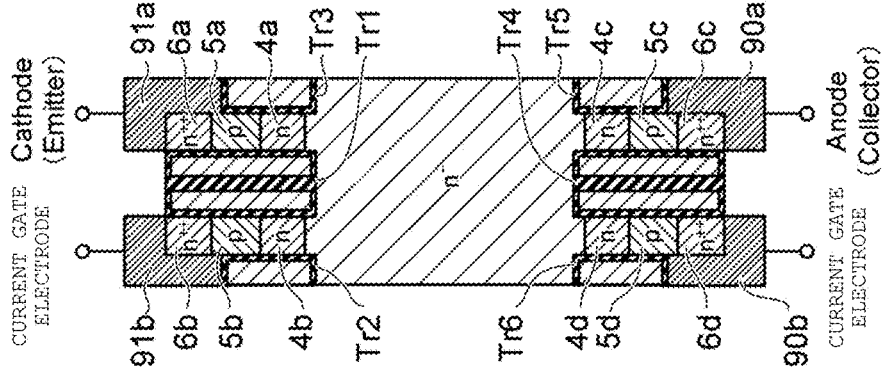

FIGS. 31A to 31C are diagrams that illustrate a cross-sectional structure of the semiconductor device according to some embodiments and electric fields of the inside of an element at the time of applying a breakdown voltage.

In FIG. 31A, the cross-sectional structure of the semiconductor device 200 is schematically illustrated. FIG. 31B illustrates the electric field of each point at the time of a forward breakdown voltage, and FIG. 31C illustrates the electric field at the time of a reverse breakdown voltage.

In the semiconductor device illustrated in FIG. 30A, from a cathode electrode toward an anode electrode, sequentially, an n⁺⁺ type contact region, an n-type semiconductor region, an n⁻ type semiconductor region, a p-type anode region, and a p⁺⁺ type contact region are disposed. In the semiconductor device illustrated in FIG. 30A, in a case where a positive voltage with respect to the anode electrode is applied to the cathode electrode, a depletion layer spreads from a main junction A between the p-type semiconductor region and the n⁻ type semiconductor region. The spread of this depletion layer, as illustrated in FIG. 30C, stops in the n-type semiconductor region. In other words, the semiconductor device illustrated in FIG. 30A has a punch-through type structure in which the depletion layer spreads over the entire surface of the n⁻ type semiconductor region. In a case where the punch-through type structure illustrated in FIG. 30A is employed, while the thickness of the n⁻ type semiconductor region can be decreased, and thus, the size of the semiconductor device can be decreased, however, the structure is vertically asymmetrical, and, in a case where a positive voltage with respect to the cathode electrode is applied to the anode electrode, a breakdown voltage is not acquired.

In the semiconductor device illustrated in FIG. 30B, from a cathode electrode toward an anode electrode, sequentially, a p⁺⁺ type contact region, a p-type semiconductor region, an n⁻ type semiconductor region, a p-type semiconductor region, and a p⁺⁺ type contact region are disposed.

In the semiconductor device illustrated in FIG. 30B, in a case where a positive voltage with respect to the anode electrode is applied to the cathode electrode, as illustrated in FIG. 30C, a depletion layer spreads from a main junction A between the p-type semiconductor region disposed on the anode electrode side and the n⁻ type semiconductor region into the n-type semiconductor layer. Since the thickness of the n⁻ type semiconductor region is sufficiently large for the spread of the depletion layer, the spread of the depletion layer stops within the n⁻ type semiconductor region.

On the other hand, in a case where a positive voltage with respect to the cathode electrode is applied to the anode electrode, as illustrated in FIG. 30C, a depletion layer spreads from a main junction B between the p-type semiconductor region disposed on the cathode electrode side and the n⁻ type semiconductor region into the n⁻ type semiconductor region, and the spread of the depletion layer stops within the n⁻ type semiconductor region.

In this way, the semiconductor device illustrated in FIG. 30B can acquired a breakdown voltage for any of the forward direction and the reverse direction. However, the structure is of a non-punch-through type in which the n⁻ type semiconductor region 3 is thicker than the growth of the depletion layer at the time of a breakdown voltage, compared to the case of the semiconductor device illustrated in FIG. 30A, the n⁻ type semiconductor region is thick, and a decrease in the loss in the semiconductor device is not easy.

In some embodiments, in the semiconductor device as illustrated in FIG. 31A, in a case where a positive voltage with respect to the cathode electrode 91 is applied to the anode electrode 90, a depletion layer spreads from the bottoms of the trenches Tr4 to Tr6 to the n⁻ type semiconductor region 3. At this time, in some embodiments, the depletion layer spreading from the bottoms of the trenches Tr4 to Tr6 is stopped by a depletion layer spreading from the bottoms of the trenches Tr1 to Tr3 disposed on the cathode electrode 91 side to the n⁻ type semiconductor region 3.

In some embodiments, in a case where a positive voltage with respect to the anode electrode 90 is applied to the cathode electrode 91, a depletion layer spreads from the bottoms of the trenches Tr1 to Tr3 to the n⁻ type semiconductor region 3. At this time, in some embodiments, the depletion layer spreading from the bottoms of the trenches Tr1 to Tr3 is stopped by a depletion layer spreading from the bottoms of the trenches Tr4 to Tr6 disposed on the anode electrode 90 side to the n⁻ type semiconductor region 3.

In some embodiments, in the semiconductor device illustrated in FIG. 31A, the trenches Tr1 to Tr6 have a function as the main junction A or B and a function as an n-type field stop region serving as a stopper of the depletion layer which are changed in accordance with the direction of the applied voltage.

As a result, in the semiconductor device according to some embodiments (e.g., the embodiment illustrated in FIG. 31A), as illustrated in FIG. 31B and FIG. 31C, at the time of any of a forward breakdown voltage and a reverse breakdown voltage, the punch-through type in which the depletion layer spreads over the entire surface of the n⁻ type semiconductor region 3 can be realized. According to some embodiments (e.g., the embodiment illustrated in FIG. 31A), while conduction can be made in both directions, a punch-through type breakdown voltage can be realized for any of the directions, and a loss in the semiconductor device can be decreased.

Figure 32:
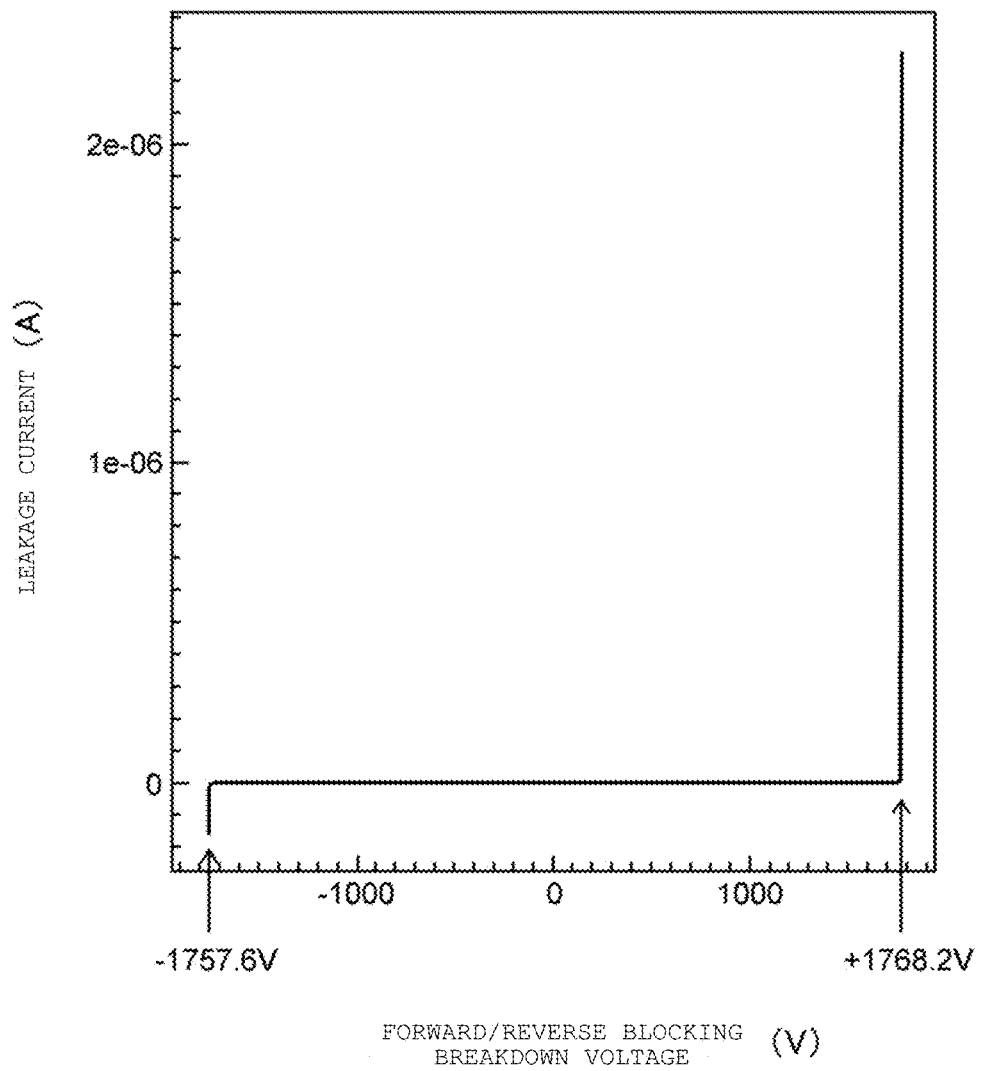
FIG. 32 is a simulation result that illustrates the waveform of breakdown voltages of the forward direction and the reverse direction in the semiconductor device according to some embodiments.

FIG. 32 is a simulation result that illustrates the waveform of breakdown voltages of the forward direction and the reverse direction in the semiconductor device 200 according to some embodiments.

Here, a simulation is performed in which the n-type impurity concentration in the n⁻ type semiconductor region 3 is set to $1.0 \times 10^{13}$ cm⁻³, and the thickness of the n⁻ type semiconductor region 3 is set to 108 μm. From FIG. 32, it can be understood that a breakdown voltage of about 1750 V is acquired at the time of a breakdown voltage of any of the forward direction and the reverse direction.

Figure 33:
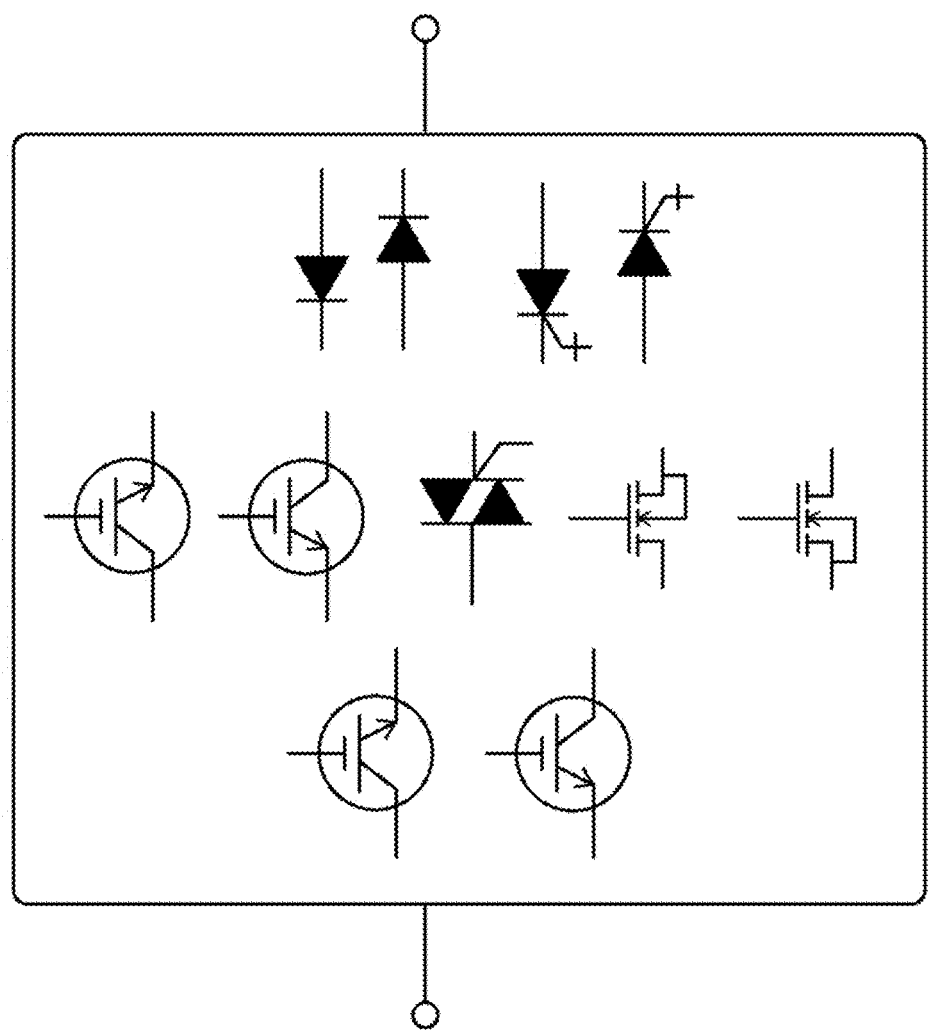
FIG. 33 is a diagram that illustrates an example of operating modes realized by the semiconductor device according to some embodiments.

FIG. 33 is a diagram that illustrates an example of operating modes realized by the semiconductor device 200 according to some embodiments.

As illustrated in FIG. 33, according to the semiconductor device 200 of some embodiments (e.g., the embodiments illustrated in FIG. 24 and FIG. 25), by controlling the voltages of the gate electrodes 10 to 13, the operation of the semiconductor device 200 can be appropriately switched to a diode, a MOSFET, an IEGT, a triac, or the like.

In this way, according to the semiconductor device of some embodiments, by controlling only the gate electrodes, ideal characteristics of almost all the conventional power devices can be realized. Depending on an application circuit, a substantial decrease in the number of components can be expected. In addition, according to the semiconductor device of some embodiments, there is a possibility that the performance of a conventional element can be significantly improved.

According to the semiconductor device of some embodiments, "the use of deep conductivity modulation at the potential difference less than the built-in potential", "a thyristor (an IEGT or an IGBT) having no built-in potential", "integration of a MOSFET and an IEGT", "a complete bidirectional conduction characteristic in a deep bipolar mode like a thyristor", "assurance of a forward/reverse blocking breakdown voltage through punch-through type design" and the like can be simultaneously realized. This is a power semiconductor device having advantages of both ideal characteristics of a conventional GTR such as a current gate, a bipolar operation, and no built-in voltage and characteristics of a conventional thyristor (including an IEGT, an IGBT, and the like) such as a high conduction capability and realizing ideal advantages for controlling power with high efficiency, which cannot be realized in a conventional semiconductor device using an impurity diffusion layer, over a conventional limit.

Figure 34:
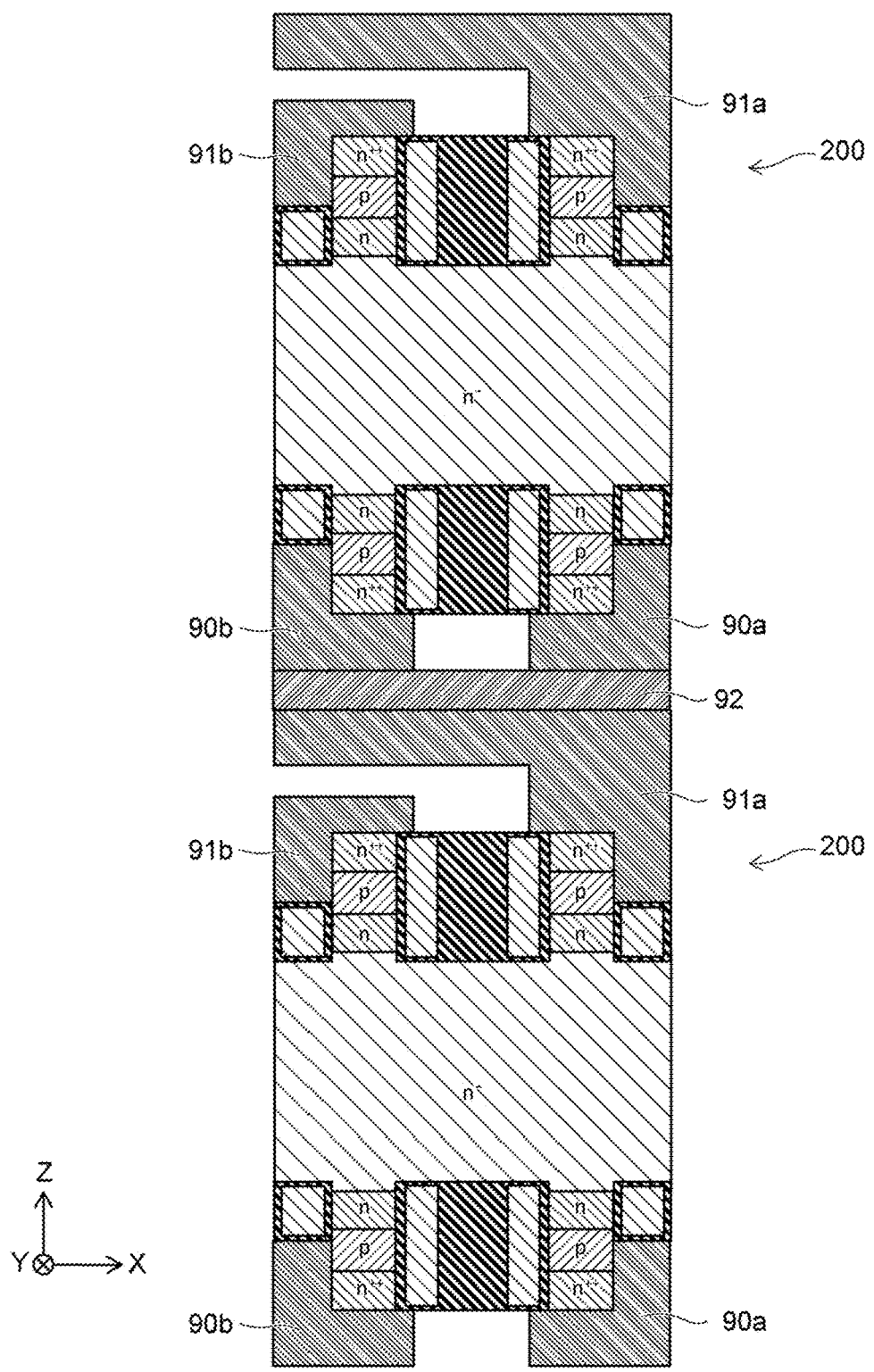
FIG. 34 is a cross-sectional view that illustrates an application example of the semiconductor device according to some embodiments.

FIG. 34 is a cross-sectional view that illustrates an application example of the semiconductor device according to some embodiments.

In some embodiments, in the example illustrated in FIG. 34, the collector electrodes 90a and 90b of the semiconductor device 200 are connected in series to the emitter electrode 91a of another semiconductor device 200 via a metal layer 92.

As described above, in the semiconductor device 200 according to some embodiments (e.g., the embodiment illustrated in FIG. 34), built-in potential is not present in the conduction direction. For this reason, also in a case where a plurality of the semiconductor devices 200 are connected in series, built-in potential overlapping does not occur. Therefore, the semiconductor device according to some embodiments (e.g., the embodiment illustrated in FIG. 34) is particularly advantageous in a case where a plurality of the semiconductor devices are connected in series.

Figure 35:
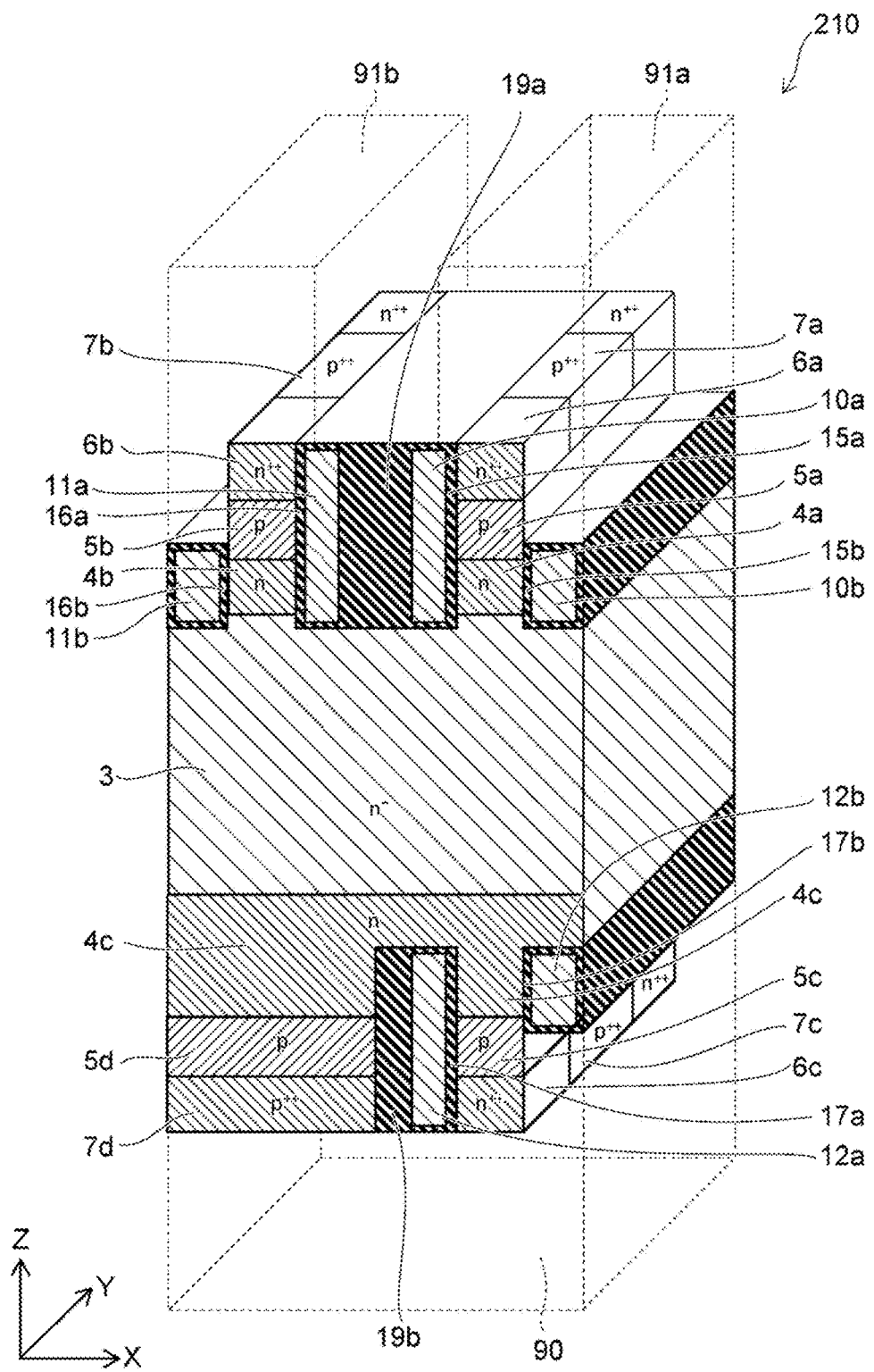
FIG. 35 is a perspective cross-sectional view that illustrates a part of a semiconductor device according to some embodiments.

FIG. 35 is a perspective cross-sectional view that illustrates apart of a semiconductor device 210 according to some embodiments.

In some embodiments, in the semiconductor device 210, the gate electrodes 13a and 13b and the n⁺⁺ type contact region 6d are not disposed, and the n⁺⁺ type contact region 6c and the p⁺⁺ type contact regions 7c and 7d are connected to a common collector electrode 90, which are different from the semiconductor device 200. In some embodiments, in the semiconductor device 210, under the n⁻ type semiconductor region 3, a common n-type barrier region 4c is disposed. In some embodiments, the p-type base regions 5c and 5d are disposed under the n-type barrier region 4c, and the p-type base region 5c is positioned between the gate electrodes 12a and 12b. In some embodiments, the p⁺⁺ type contact region 7d is disposed under the p-type base region 5d.

In some embodiments, in the semiconductor device 210, the gate electrodes 13a and 13b are not disposed, and thus, holes cannot be injected on the collector electrode side at the time of performing a MOSFET operation. In some embodiments, the conduction operation illustrated in FIG. 26 and FIG. 27 can be performed in a similar manner. In some embodiments, by applying voltages other than the voltages of the gate electrodes 13 as illustrated in FIG. 26, a forward current can be caused to flow from the collector electrode 90 to the emitter electrode 91a. In some embodiments, by applying voltages other than the voltages of the gate electrodes 13 as illustrated in FIG. 27, a reverse current can be caused to flow from the emitter electrode 91 to the collector electrode 90.

Figure 36:
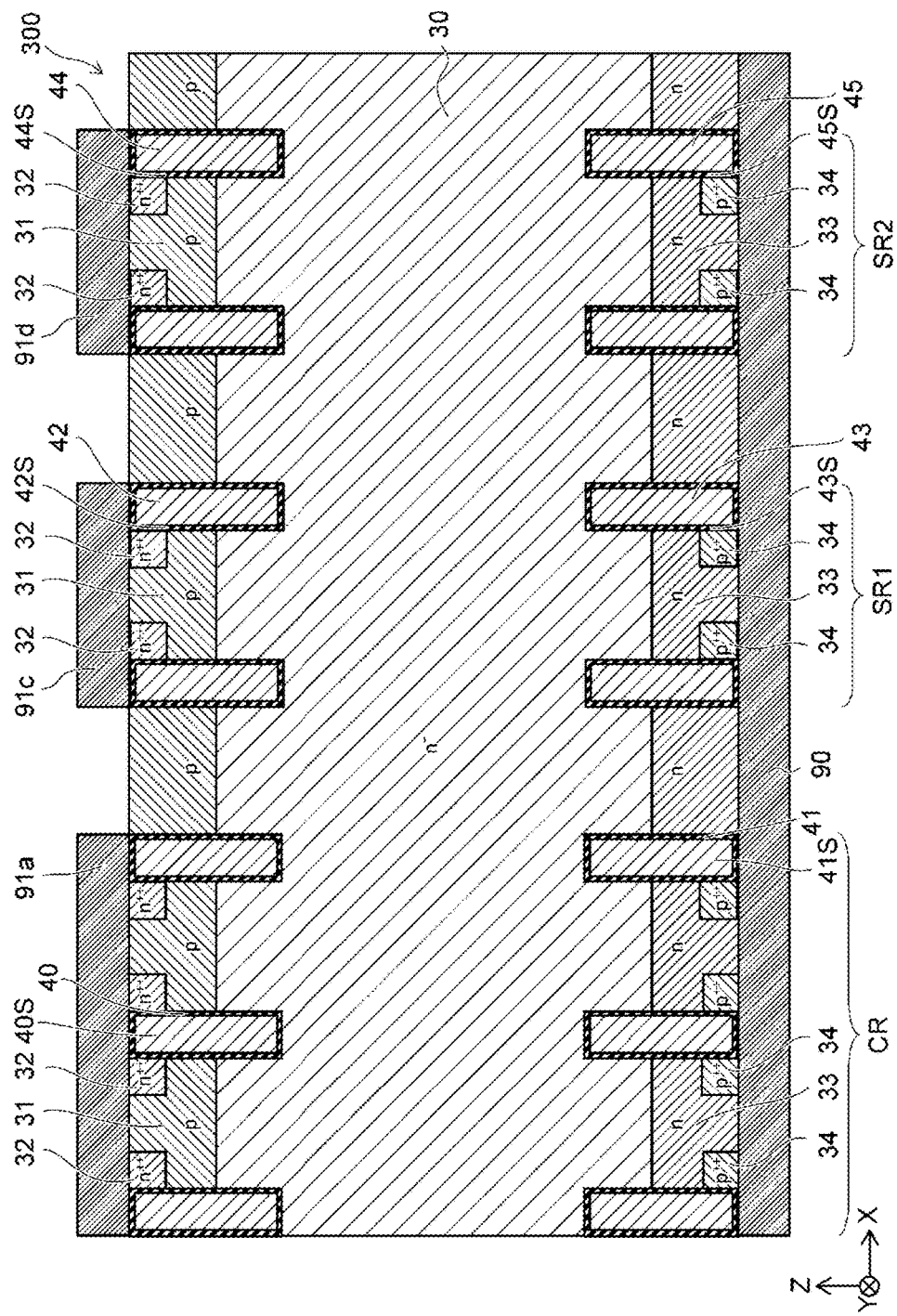
FIG. 36 is a cross-sectional view that illustrates apart of a semiconductor device according to some embodiments.

FIG. 36 is a cross-sectional view that illustrates a part of a semiconductor device 300 according to some embodiments.

In some embodiments, as illustrated in FIG. 36, the semiconductor device 300 includes an n⁻ type semiconductor region 30; a p-type base region 31, an n⁺⁺ type contact region 32; an n-type barrier region 33, a p⁺⁺ type contact region 34, gate electrodes 40 to 45, gate insulating layers 40S to 45S, a collector electrode 90, and emitter electrodes 91a, 91c, and 91d.

In some embodiments, the semiconductor device 300, as illustrated in FIG. 36, includes an element region CR, a sense region SR1, and a sense region SR2. The element region CR is a region used for conduction between the collector electrode 90 and the emitter electrode 91a. The sense region SR1 and the sense region SR2 are areas used for conduction between the emitter electrodes 91c and 91d and the collector electrode 90.

In some embodiments, the p-type base region 31 is disposed on the n⁻ type semiconductor region 30.

In some embodiments, the n⁺⁺ type contact region 32 is selectively disposed on the p-type base region 31.

In some embodiments, the n-type barrier region 33 is disposed under the n⁻ type semiconductor region 30.

In some embodiments, the p++ type contact region 34 is selectively disposed under the n-type barrier region 33.

In some embodiments, a plurality of the p-type base regions 31, a plurality of the n++ type contact regions 32, a plurality of the n-type barrier regions 33, and a plurality of the p++ type contact regions 34 are disposed in the X direction and extend in the Y direction.

In some embodiments, in the element region CR, the gate electrode 40 is disposed, in the n− type semiconductor region 30 and the p-type base region 31 via the gate insulating layer 40S. In some embodiments, in the sense region SR1, the gate electrode 42 is disposed in the n− type semiconductor region 30 and the p-type base region 31 via the gate insulating layer 42S. In the sense region SR2, the gate electrode 44 is disposed in the n− type semiconductor region 30 and middle of the p-type base region 31 via the gate insulating layer 44S.

In some embodiments, the gate electrodes 40, 42, and 44 face the p-type base region 31 and the n++ type contact region 32 respectively via the gate insulating layers 40S, 42S, and 44S in the X direction.

In some embodiments, the emitter electrode 91a is disposed on the p-type base region 31 and the n++ type contact region 32 in the element region CR and is electrically connected to such semiconductor regions. In some embodiments, the emitter electrode 91c is disposed on the p-type base region 31 and the n++ type contact region 32 in the sense region SR1 and is electrically connected to such semiconductor regions. In some embodiments, the emitter electrode 91d is disposed on the p-type base region 31 and the n++ type contact region 32 in the sense region SR2 and is electrically connected to such semiconductor regions.

In some embodiments, the same voltage as that of the emitter electrode 91a is applied to the emitter electrodes 91c and 91d. In some embodiments, a detector not illustrated in the drawing is connected to each of the emitter electrodes 91c and 91d so as to monitor a current flowing through the electrode.

In some embodiments, in the element region CR, the gate electrode 41 is disposed in the n− type semiconductor region 30 and the n-type barrier region 33 via the gate insulating layer 41S. In some embodiments, in the sense region SR1, the gate electrode 43 is disposed in the n− type semiconductor region 30 and the n-type barrier region 33 via the gate insulating layer 43S. In some embodiments, in the sense region SR2, the gate electrode 45 is disposed in the n− type semiconductor region 30 and the n-type barrier region 33 via the gate insulating layer 45S. In some embodiments, the gate electrodes 41, 43, and 45 face the n-type barrier region 33 and the p++ type contact region 34 respectively via the gate insulating layers 41S, 43S, and 45S in the X direction.

In some embodiments, in the element region CR, the sense region SR1, and the sense region SR2, the collector electrode 90 is electrically connected to the n-type barrier region 33 and the p++ type contact region 34 of each region.

In some embodiments, a plurality of the gate electrodes 40 to 45 are disposed in the X direction and extend in the Y direction.

Here, the operation of the semiconductor device 300 will be described.

In some embodiments, in a state in which a positive voltage with respect to the emitter electrode 91a is applied to the collector electrode 90, when a positive voltage of a threshold or more is applied to the gate electrode 40, an inversion layer of electrons is formed in the p-type base region 31 near the gate insulating layer 40S. At this time, a positive voltage of a threshold or more may be applied to the gate electrode 41. In such a case, an electron accumulating layer is formed in the n-type barrier region 33 near the gate insulating layer 41S.

In this way, the semiconductor device 300 operates as a MOSFET having only electrons as the carriers, and a current flows from the collector electrode 90 to the emitter electrode 91a.

Subsequently, in some embodiments, the voltage applied to the collector electrode 90 is increased, and, when the voltage applied to the collector electrode 90 with respect to the emitter electrode 91a is higher than the built-in potential, by applying a negative voltage of a threshold or more to the gate electrode 41, an inversion layer of holes is formed in the n-type barrier region 33 near the gate insulating layer 41S. Accordingly, electrons are injected from the emitter electrode 91a into the n− type semiconductor region 30, and holes are injected from the collector electrode 90 into the n− type semiconductor region 30. In other words, the operation of the semiconductor device 300 proceeds from a MOSFET to an IGBT having electrons and holes as the carriers.

In some embodiments, regardless of an electric potential difference between the collector electrode 90 and the emitter electrode 91a, a positive voltage of a threshold or more is applied to the gate electrode 42, and a negative voltage of a threshold or more is applied to the gate electrode 43. In some embodiments, a positive voltage of a threshold or more is applied to the gate electrodes 44 and 45. In some embodiments, a voltage is applied to each gate electrode such that the sense region SR1 operates as an IGBT, and the sense region SR2 operates as a MOSFET regardless of the operation in the element region CR.

Since the sense region SR2 operates as a MOSFET, built-in potential is not present between the collector electrode 90 and the emitter electrode 91d. In some embodiments, the sense region SR1 operates as an IGBT and thus, does not operate unless an electric potential difference between the collector electrode 90 and the emitter electrode 91c is built-in potential or more.

For this reason, for example, in a state in which a current is detected in the sense region SR2, the electric potential difference between the collector electrode 90 and the emitter electrode 91a is increased, and, when a current is detected in the sense region SR1, the operation of the element region CR can be switched from a MOSFET to an IGBT. In this way, by detecting currents flowing through the two sense regions and performing switching between a MOSFET and an IGBT based on a result of the detection, the switching between a MOSFET and an IGBT can be performed at more accurate timing. Accordingly, it can be suppressed that conduction between the collector electrode 90 and the emitter electrode 91a is not made due to switching of the voltage of the gate electrode 41 when the electric potential difference is less than the built-in potential.

The element region CR illustrated in FIG. 36 is an example. The element region CR of the semiconductor device 300 according to some embodiments (e.g., the embodiment illustrated in FIG. 36) may be appropriately changed to different modified examples (e.g., those illustrated in FIGS. 37-40).

Figure 37:
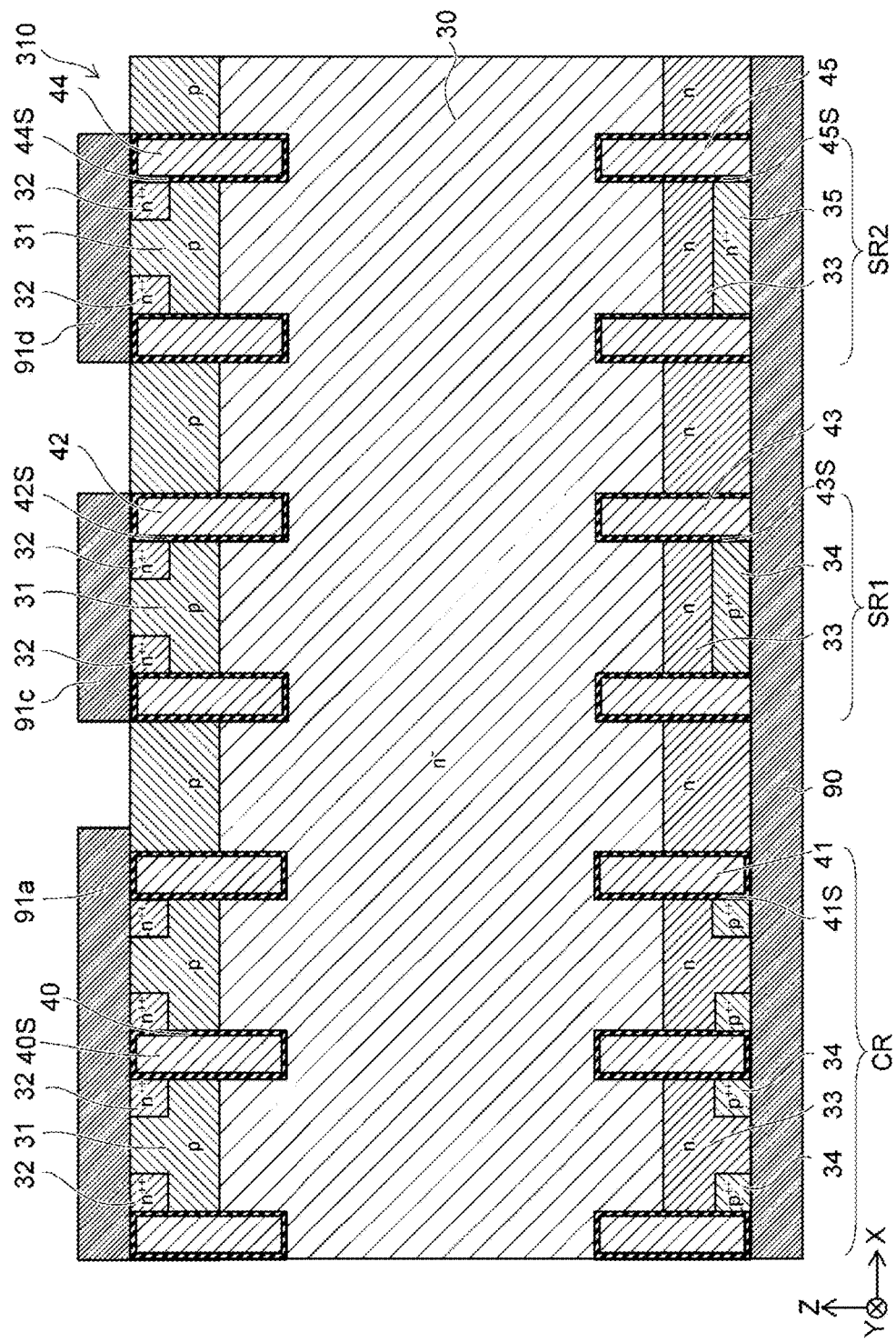
FIG. 37 is a cross-sectional view that illustrates a part of a semiconductor device according to some embodiments.

FIG. 37 is a cross-sectional view that illustrates a part of a semiconductor device 310 according to some embodiments.

In the semiconductor device 310, the structures of sense regions SR1 and SR2 are different from those of the semiconductor device 300.

In some embodiments, in the sense region SR1, under the n− type semiconductor region 30, the n-type barrier region 33 and the electrode 43 are disposed. In some embodiments, the electrode 43 faces the n-type barrier region 33 via the insulating layer 43S in the X direction. In some embodiments, between the electrodes 43, the $p^{++}$ type contact region 34 is disposed on the entire surface under the n-type barrier region 33.

In some embodiments, in the sense region SR2, under the $n^-$ type semiconductor region 30, the n-type barrier region 33 and the electrode 45 are disposed. In some embodiments, the electrode 45 faces the n-type barrier region 33 via the insulating layer 45S in the X direction. In some embodiments, Between the electrodes 45, the $n^{++}$ type contact region 35 is disposed on the entire surface under the n-type barrier region 33.

The electrodes 43 and 45, for example, are electrically connected to the collector electrode 90.

In some embodiments, in the semiconductor device 310, on the collector electrode 90 side of the sense region SR1, the $p^{++}$ type contact region 34 is disposed on the whole surface between the electrodes 43. For this reason, regardless of the voltage of the electrode 43, when a voltage between the collector electrode 90 and the emitter electrode 91c is the built-in potential or more, holes are injected through the $p^{++}$ type contact region 34.

In some embodiments, on the collector electrode 90 side of the sense region SR2, the $n^{++}$ type contact region 35 is disposed on the whole surface between the electrodes 45. For this reason, regardless of the voltage of the electrode 45, electrons injected from the emitter electrode 91d into the $n^-$ type semiconductor region 30 flow to the collector electrode 90 through the $n^{++}$ type contact region 35.

In this way, also in a case where the gate electrodes 43 and 45 are connected to the collector electrode 90, according to the structure of the semiconductor device 310, a current according to an IGBT operation can be detected in the sense region SR1, and a current according to a MOSFET operation can be detected in the sense region SR2. In other words, in the semiconductor device 300, between the gate electrodes 41 and 43 and between the gate electrodes 41 and 45, different voltages are applied at the time of performing the MOSFET operation and at the time of performing the IGBT operation. In some embodiments (e.g., the embodiment illustrated in FIG. 37), such control is unnecessary, and the semiconductor device 310 can be easily controlled.

Figure 38:
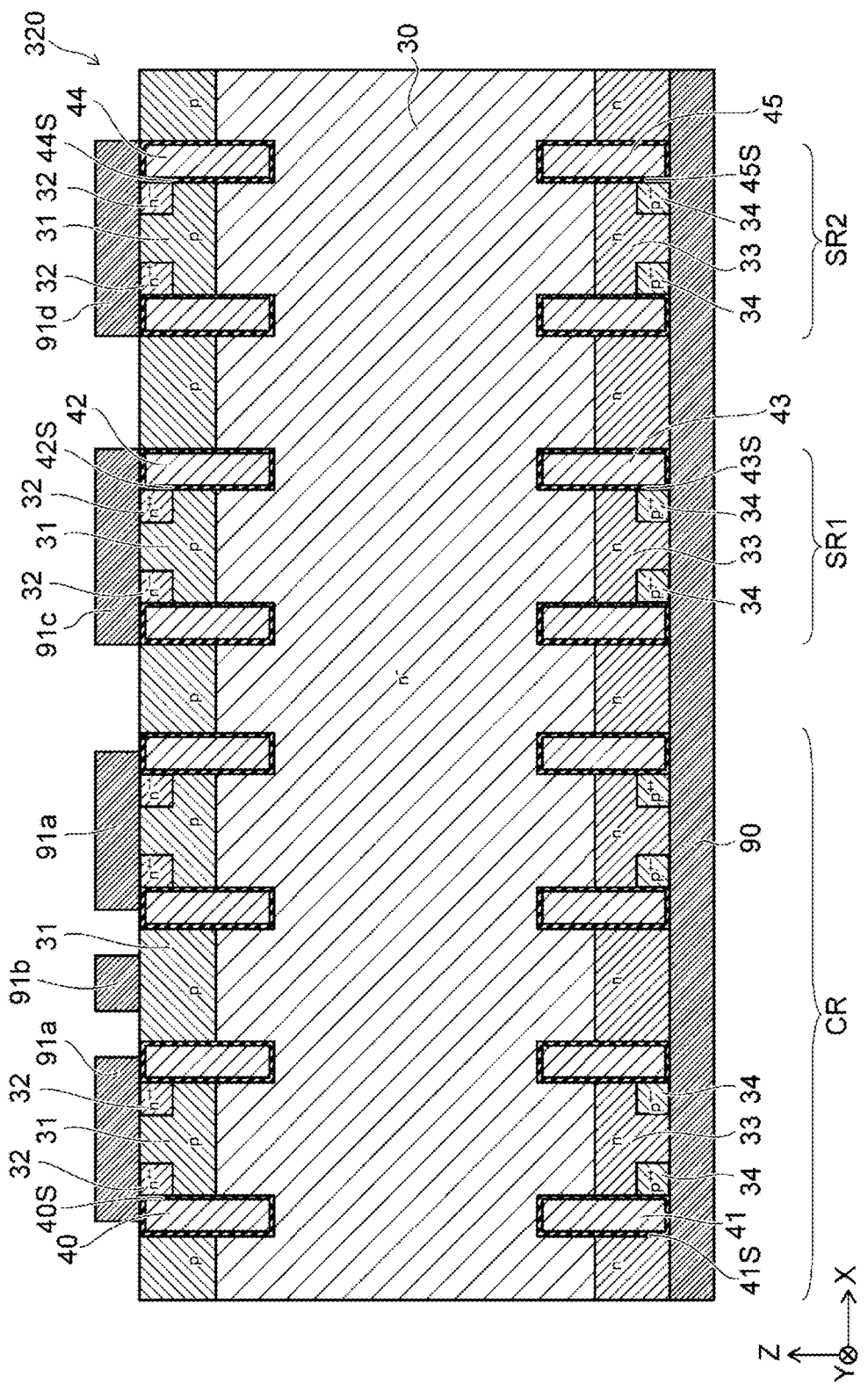
FIG. 38 is a cross-sectional view that illustrates a part of a semiconductor device according to some embodiments.

FIG. 38 is a cross-sectional view that illustrates apart of a semiconductor device 320 according to some embodiments.

In the semiconductor device 320, the structure of the element region CR is different from that of the semiconductor device 300.

In some embodiments, in the element region CR, on a part of the p-type base region 31, the current gate electrode 91b is disposed, and the part of the p-type base region 31 is electrically connected to the current gate electrode 91b. In some embodiments, the emitter electrode 91a and the current gate electrode 91b are disposed to be separated from each other.

Referring to FIG. 38, similar to the embodiments illustrated in FIGS. 1-35, a voltage of the built-in potential or more is applied to the current gate electrode 91b with respect to the emitter electrode 91a.

In some embodiments, when a positive voltage is applied to the gate electrodes 40 and 41, and the element region CR operates as a MOSFET, a positive voltage of the built-in potential or more with respect to the emitter electrode 91a is applied to the current gate electrode 91b, and holes are injected from the current gate electrode 91b into the $n^-$ type semiconductor region 30.

In some embodiments, similar to the semiconductor device 200 (e.g., the semiconductor device 200 according to the embodiments illustrated in FIGS. 24-35), when the element region CR of the semiconductor device 320 is operated as a MOSFET, by injecting holes into the $n^-$ type semiconductor region 30 and causing conductivity modulation to occur in the $n^-$ type semiconductor region 30, the conduction capability is improved, and the on resistance can be decreased.

Figure 39:
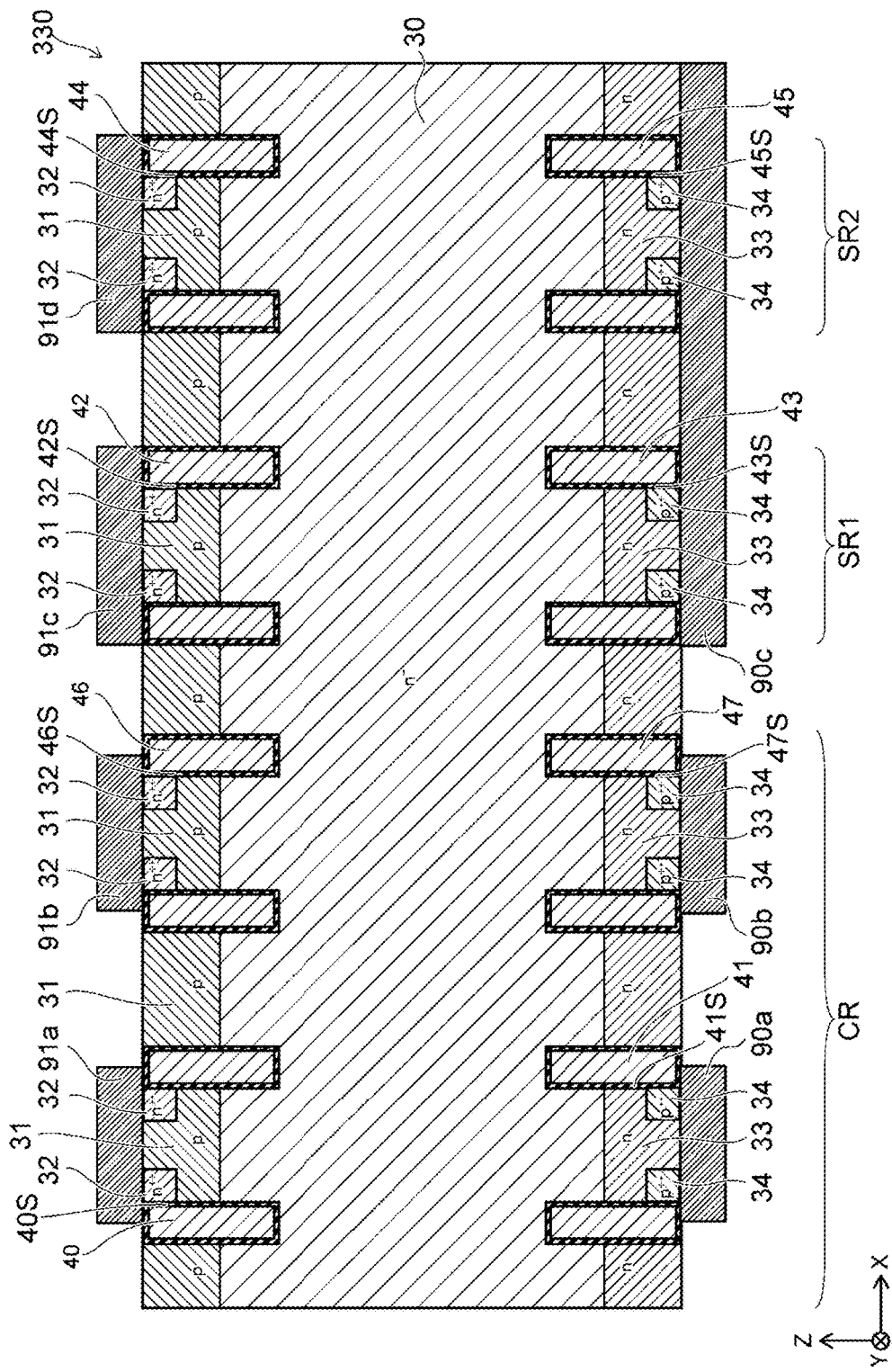
FIG. 39 is a cross-sectional view that illustrates a part of a semiconductor device according to some embodiments.

FIG. 39 is a cross-sectional view that illustrates a part of a semiconductor device 330 according to some embodiments.

In the semiconductor device 330, the structure of the element region CR is different from that of the semiconductor device 300.

In some embodiments, in the element region CR, the emitter electrode 91a is electrically connected to a part of the p-type base region 31 and a part of the $n^{++}$ type contact region 32, and the current gate electrode 91b is electrically connected to another part of the p-type base region 31 and another part of the $n^{++}$ type contact region 32. In some embodiments, a gate electrode 46 is disposed in the $n^-$ type semiconductor region 30 and the p-type base region 31 via a gate insulating layer 46S. In some embodiments, the emitter electrode 91a and the current gate electrode 91b are disposed to be separated from each other. In some embodiments, when the semiconductor device operates, a voltage of the built-in potential or more with respect to the emitter electrode 91a is applied to the current gate electrode 91b.

In some embodiments, in the element region CR, the collector electrode 90a is electrically connected to a part of the n-type barrier region 33 and a part of the $p^{++}$ type contact region 34, and the collector electrode 90b is electrically connected to another part of the n-type barrier region 33 and another part of the $p^{++}$ type contact region 34. In some embodiments, a gate electrode 47 is disposed in the $n^-$ type semiconductor region 30 and the n-type barrier region 33 via the gate insulating layer 47S. In some embodiments, the collector electrodes 90a and 90b are disposed to be separated from each other. In some embodiments, when the semiconductor device operates, a voltage of the built-in potential or more with respect to the collector electrode 90a is applied to the collector electrode 90b.

In some embodiments, in the sense regions SR1 and SR2, the n-type barrier region 33 and the $p^{++}$ type contact region 34 are electrically connected to the collector electrode 90c. In some embodiments, the collector electrode 90c is electrically connected to the collector electrode 90a.

In some embodiments, when a positive voltage is applied to the gate electrodes 40 and 41, the element region CR operates as a MOSFET. At this time, holes are injected from the collector electrode 90b and the current gate electrode 91b into the $n^-$ type semiconductor region 30. In some embodiments (e.g., the embodiment illustrated in FIG. 39), compared to the semiconductor device 320, more holes are injected using the $n^-$ type semiconductor region 30, and the concentration of holes accumulated in the $n^-$ type semiconductor region 30 is increased, whereby the conduction capability in the element region CR can be further improved.

Figure 40:
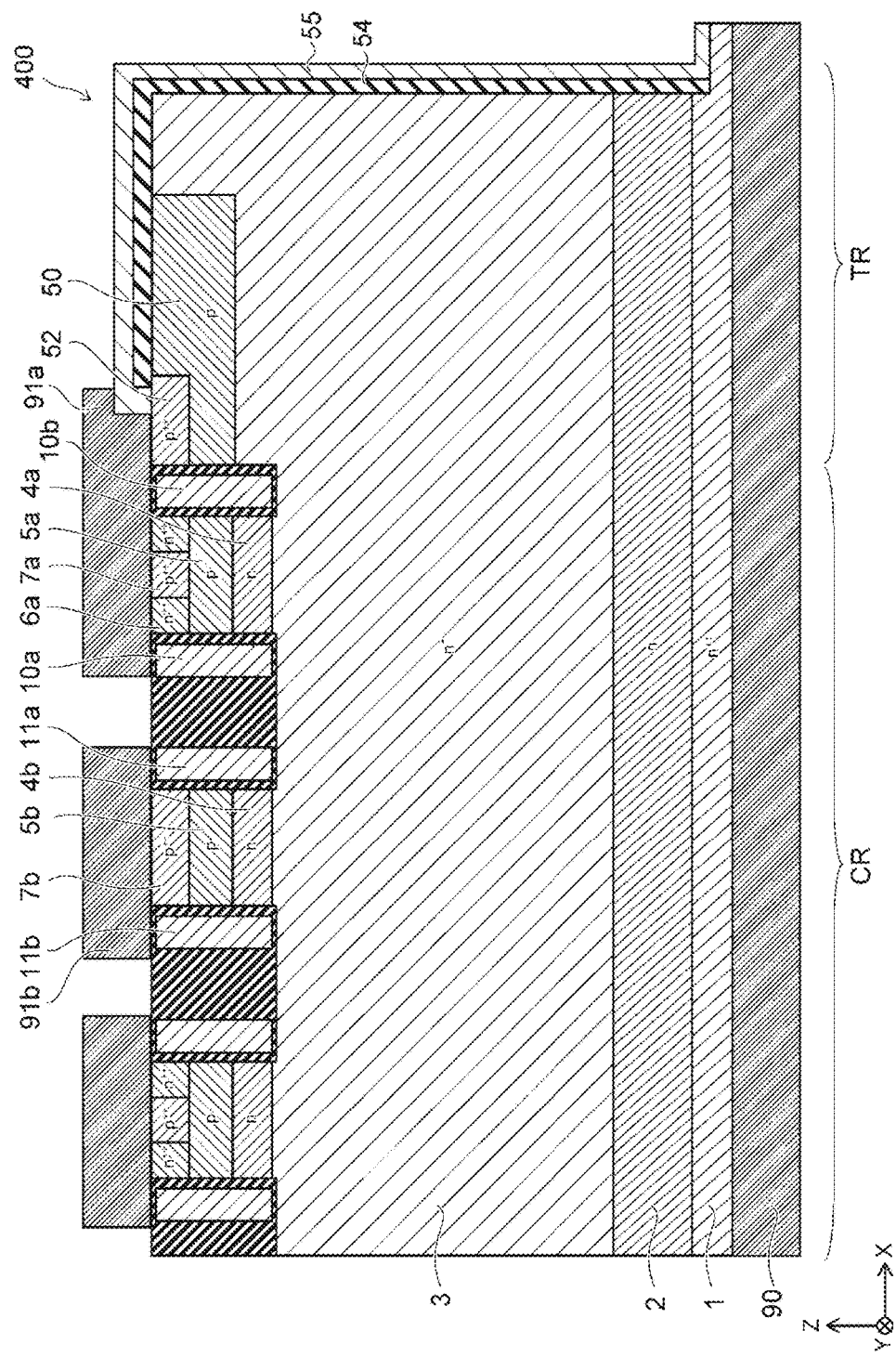
FIG. 40 is a cross-sectional view that illustrates a part of a semiconductor device according to some embodiments.

FIG. 40 is a cross-sectional view that illustrates a part of a semiconductor device 400 according to some embodiments. The semiconductor device 400 includes an element region CR and a termination region TR surrounding the element region CR.

As illustrated in FIG. 40, in the element region CR, for example, a structure having a function similar to that of the semiconductor device 100 according to the embodiments illustrated in FIGS. 1-23 is disposed.

In some embodiments, in the terminal region TR, on an n⁻ type semiconductor region 3, a p-type semiconductor region 50 is disposed. In some embodiments, on the p-type semiconductor region 50, a p⁺⁺ type semiconductor region 52 is selectively disposed. In some embodiments, an emitter electrode 91a is electrically connected to the p⁺⁺ type semiconductor region 52.

In some embodiments, on the periphery of an n-type barrier region 2, the periphery of an n⁻ type semiconductor region 3, and the p-type semiconductor region 50, an insulating layer 54 is disposed. In some embodiments, on the insulating layer 54, a semi-insulating layer 55 is disposed. In some embodiments, one end of the semi-insulating layer 55 is connected to the p⁺⁺ type semiconductor region 52, and the other end thereof is connected to an n⁺⁺ type collector region 1. In some embodiments, one end of the semi-insulating layer 55 is connected to the same electric potential as that of the emitter electrode 91a, and the other end is connected to the same electric potential as that of a collector electrode 90.

In some embodiments, the configuration is not limited to the example illustrated in FIG. 40, and, in the semiconductor device 400 according to some embodiments, the semi-insulating layer 55 may be directly in contact with semiconductor regions of the p-type semiconductor region 50, the n⁻ type semiconductor region 3, the n-type barrier region 2, and the n⁺⁺ type collector region 1 without disposing the insulating layer 54. In such a case, in some embodiments, the insulating layer 54 may be disposed on the semi-insulating layer 55.

In some embodiments, the electric resistance of the semi-insulating layer 55 may be higher than the electric resistance of the semiconductor regions such as the n⁻ type semiconductor region 3 and the like and may be lower than the electric resistance of the insulating layer 54. The insulating layer 54, for example, contains silicon oxide, silicon nitride, or the like as an insulating material. In some embodiments, the semi-insulating layer 55 contains semi-insulating silicon nitride (SInSiN: amorphous silicon) or semi-insulating polycrystalline silicon (SIPOS) as a semi-insulating material.

In some embodiments, in a case where an electric potential difference is present between the collector electrode 90 and the emitter electrode 91a, a minute current flows between the n⁺⁺ type collector region 1 and the p⁺⁺ type semiconductor region 52 through the semi-insulating layer 55. At the time of a breakdown voltage of the semiconductor device 400, as the electric potential difference between the n⁺⁺ type collector region 1 and the p⁺⁺ type semiconductor region 52 gradually decreases in the semi-insulating layer 55, deviations in the intensity of the electric field generated on the outer periphery of the semiconductor device 400 are alleviated, and the breakdown voltage of the semiconductor device 400 can be increased.

In some embodiments, by disposing the semi-insulating layer 55 on the periphery of the n⁻ type semiconductor region 3 in the Z direction and increasing a distance between the n⁺⁺ type collector region 1 and the p⁺⁺ type semiconductor region 52 along the semi-insulating layer 55, a voltage drop in the semi-insulating layer 55 becomes more gentle, and the breakdown voltage of the semiconductor device 400 can be further increased.

Figure 41:
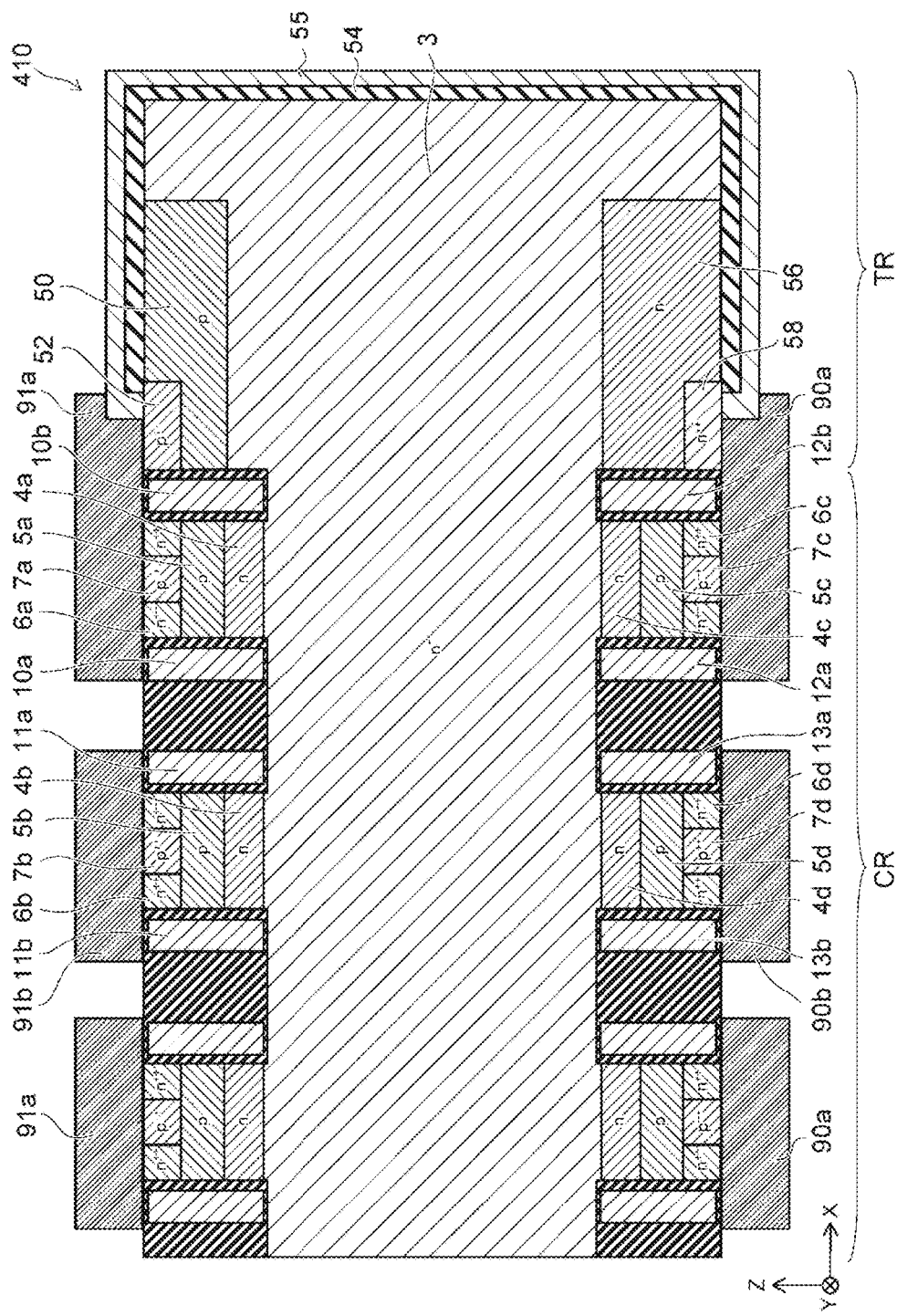
FIG. 41 is a cross-sectional view that illustrates a part of a semiconductor device according to some embodiments.

FIG. 41 is a cross-sectional view that illustrates a part of a semiconductor device 410 according to some embodiments.

In the semiconductor device 410, a structure having a function similar to that of the semiconductor device 200 according to the embodiments illustrated in FIGS. 24-35 is disposed in the element region CR.

In some embodiments, on the element region CR side of the termination region TR, the p-type semiconductor region 50 is disposed on the n⁻ type semiconductor region 3, and the n-type semiconductor region 56 is disposed under the n⁻ type semiconductor region 3.

In some embodiments, on the p-type semiconductor region 50, the p⁺⁺ type semiconductor region 52 is disposed, and the p⁺⁺ type semiconductor region 52 is electrically connected to the emitter electrode 91a.

In some embodiments, under the n-type semiconductor region 56, the n⁺⁺ type semiconductor region 58 is disposed, and the n⁺⁺ type semiconductor region 58 is electrically connected to the collector electrode 90a.

In some embodiments, the insulating layer 54 is disposed on the upper surface of the p-type semiconductor region 50, the side surface of the n⁻ type semiconductor region 3, and the lower surface of the n-type semiconductor region 56. In some embodiments, the semi-insulating layer 55 is disposed on the insulating layer 54. In some embodiments, one end of the semi-insulating layer 55 is connected to the p⁺⁺ type semiconductor region 52, and the other end thereof is connected to the n⁺⁺ type semiconductor region 58.

In some embodiments (e.g., the embodiment illustrated in FIG. 41), in the termination region TR, the semi-insulating layer 55 is continuously disposed over the upper surface to the lower surface of the semiconductor device 410. For this reason, the distance between the n⁺⁺ type semiconductor region 58 and the p⁺⁺ type semiconductor region 52 along the semi-insulating layer 55 can be increased, and, in the termination region TR, a voltage drop in each of the portions of the upper surface, the side surface, and the lower surface of the semiconductor device 410 can be further decreased. For this reason, compared to the semiconductor device 400, the concentration of the electric field in the termination region TR is further alleviated, and the breakdown voltage of the semiconductor device can be further increased.

Figure 42:
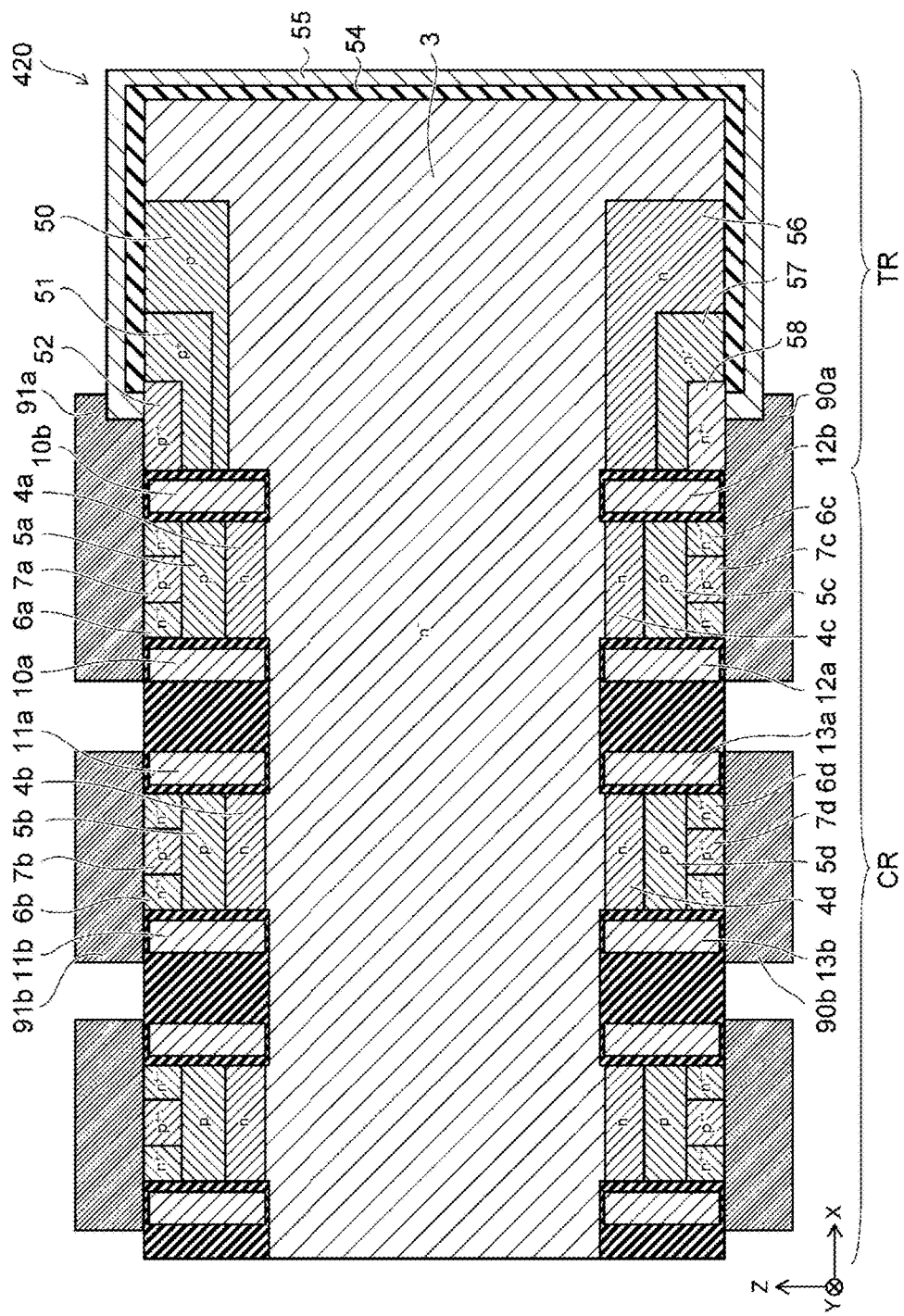
FIG. 42 is a cross-sectional view that illustrates a part of a semiconductor device according to some embodiments.

FIG. 42 is a cross-sectional view that illustrates a part of a semiconductor device 420 according to some embodiments.

In the semiconductor device 420, a p⁺ type semiconductor region 51 and an n⁺ type semiconductor region 57 are further disposed, which is different from the semiconductor device 410.

In some embodiments, the p⁺ type semiconductor region 51 is selectively disposed on the p-type semiconductor region 50. In some embodiments, the p⁺⁺ type semiconductor region 52 is selectively disposed on the p⁺ type semiconductor region 51.

In some embodiments, the n⁺ type semiconductor region 57 is selectively disposed on the n-type semiconductor region 56. In some embodiments, the n⁺⁺ type semiconductor region 58 is selectively disposed on the n⁺ type semiconductor region 57.

In some embodiments (e.g., the embodiment illustrated in FIG. 42), similar to the semiconductor device 410, the concentration of the electric field in the termination region TR is alleviated, and the breakdown voltage of the semiconductor device can be improved.

Figure 43:
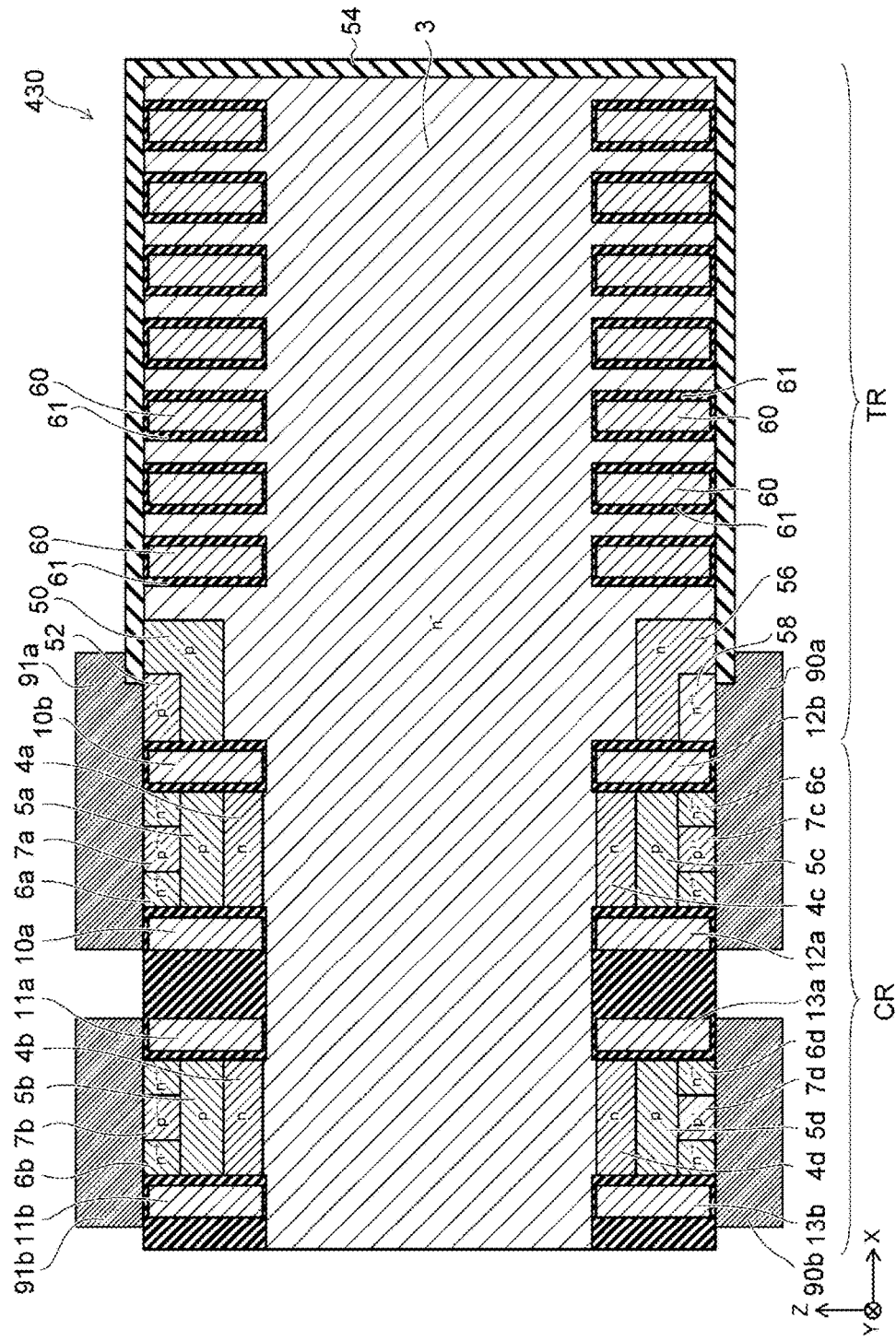
FIG. 43 is a cross-sectional view that illustrates a part of a semiconductor device according to some embodiments.

FIG. 43 is a cross-sectional view that illustrates a part of a semiconductor device 430 according to some embodiments.

In some embodiments, in the semiconductor device 430, in the termination region TR, instead of the semi-insulating layer 55, conduction parts 60 and an insulating layer 61 are disposed. In some embodiments, the conduction parts 60 are disposed in the n⁻ type semiconductor region 3 via the insulating layer 61. In some embodiments, the conduction parts 60 are disposed on both sides including the upper surface side and the lower surface side of the semiconductor device 430. In some embodiments, in a direction from the center of the semiconductor device toward the outer periphery, a plurality of the conduction parts 60 are disposed to be separated from each other. In some embodiments, the conduction parts 60 are disposed in an annular shape along the outer periphery of the semiconductor device 430.

In some embodiments, it may be configured such that a plurality of the conduction parts 60 having a dot shape or a rectangular shape in the plan view (in the case of being seen in the Z direction) are disposed, and the conduction parts 60 may be arranged in an annular shape along the outer periphery of the semiconductor device 430. In such a case, a gap between the conduction parts 60 is set to match the spread of the depletion layer at the time of turning off the semiconductor device 430.

In some embodiments, the conduction parts 60 are electrically separated from the collector electrode 90a, the emitter electrode 91a, and the like, and the electric potential of the conduction parts 60 is floating. In some embodiments, the conduction parts 60 may be disposed to be electrically separated from each other, or a plurality of conduction parts 60 neighboring to each other may be electrically connected.

For example, a positive voltage with respect to the emitter electrode 91a is applied to the collector electrode 90a, and, when the semiconductor device 430 is in the off state, on the upper surface side (e.g., the collector electrode 90a side), the electric potential of each conduction part 60 is gradually lowered from the center side of the semiconductor device toward the outer periphery thereof, and, on the lower surface side (e.g., the emitter electrode 91a side), the electric potential of each conduction part 60 is gradually lowered from the outer periphery toward the center side. In some embodiments, the equipotential lines in the n⁻ type semiconductor region 3 extend in accordance with the electric potential of each conduction part 60. For this reason, the concentration of the electric field in the termination region TR is alleviated, and the breakdown voltage of the semiconductor device can be improved.

In some embodiments, since the conduction parts 60 are disposed on both sides including the upper surface side and the lower surface side of the semiconductor device 430, a voltage drop between the conduction parts 60 is decreased, and the concentration of the electric field in the termination region TR is further alleviated, whereby the breakdown voltage of the semiconductor device can be improved. In some embodiments, by decreasing the thickness (e.g., a dimension in a direction from the center of the semiconductor device toward the outer periphery) of the termination region TR in correspondence with the improvement of the breakdown voltage of the semiconductor device, the size of the semiconductor device can be decreased.

In some embodiments, in the semiconductor device 430, a structure having a function similar to the semiconductor device 200 is disposed in the element region CR. As described in the embodiments illustrated in FIGS. 24-35, the semiconductor device 200 has the structure of the punch-through type in which the depletion layer spreads over the entire surface of the n⁻ type semiconductor region 3 in the Z direction regardless of the breakdown voltage maintaining direction.

In the semiconductor device 430 according to some embodiments, a pn junction used for maintaining the breakdown voltage in the termination region TR is not disposed, and the breakdown voltage in the termination region TR is acquired by the conduction parts 60. In some embodiments, the conduction parts 60 are disposed to be symmetrical in the Z direction with respect to the n⁻ type semiconductor region 3 as the center.

In a case where a pn junction is provided in the termination region TR to achieve the breakdown voltage, the structure becomes asymmetrical in the Z direction. Accordingly, in the structure of the punch-through type, while the breakdown voltage can be achieved in one of the forward direction and the reverse direction, the breakdown voltage cannot be achieved in the other direction. In some embodiments (e.g., the embodiment illustrated in FIG. 43), by disposing the conduction parts 60 to be symmetrical in the Z direction with respect to the n⁻ type semiconductor region 3 as the center, a high breakdown voltage can be acquired in the termination region TR regardless of the breakdown voltage maintaining direction. Accordingly, the structure of the termination region TR of the semiconductor device according to some embodiments, as illustrated in FIG. 43, is particularly effective in a case where a structure of the punch-through type that can be conductive in both directions is disposed in the element region CR.

A simulation result of the semiconductor device 430 according to this modified example will be described with reference to FIG. 44 and FIG. 45.

Figure 44:
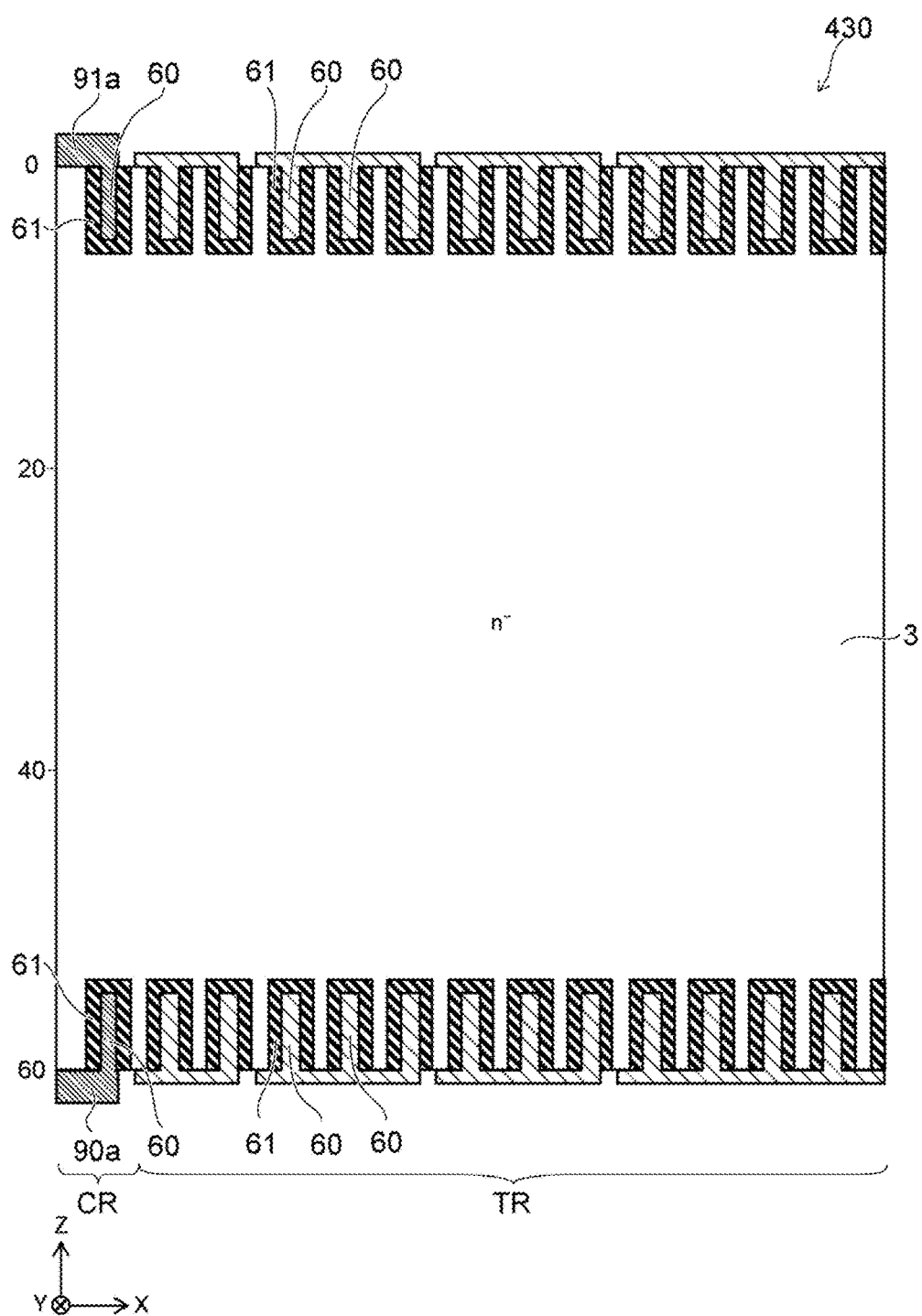
FIG. 44 is a cross-sectional view that illustrates a part of a semiconductor device according to some embodiments used for a simulation.

FIG. 44 is a cross-sectional view that illustrates apart of a semiconductor device 430 according to some embodiments used for a simulation.

Figure 45:
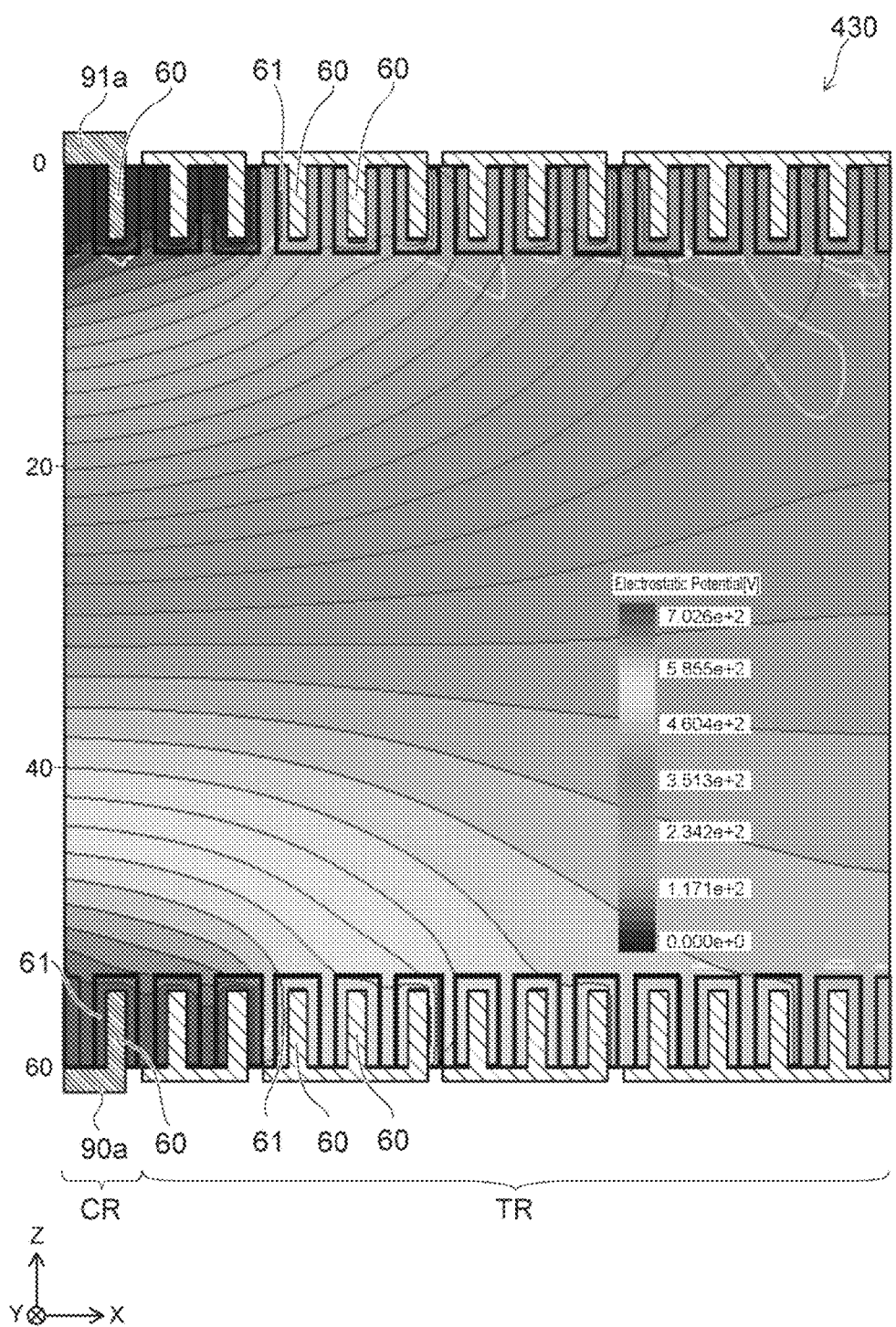
FIG. 45 is a simulation result that illustrates a distribution of electric potential in a structure illustrated in FIG. 44.

FIG. 45 is a simulation result that illustrates a distribution of electric potential in a structure illustrated in FIG. 44. In FIG. 45, on the upper side from the center of the semiconductor device 430 in the Z direction, a darker color represents lower electric potential, and, on the lower side from the center, a darker color represents higher electric potential.

As illustrated in FIG. 44, in the semiconductor device 430 used for the simulation, a plurality of conduction parts 60 that are neighboring to each other are electrically connected. In some embodiments, the conduction parts 60 disposed most to the element region CR side are respectively connected to the emitter electrode 91a and the collector electrode 90a.

As a result of the simulation for such a structure, as illustrated in FIG. 45, equipotential lines extend on the upper surface, the side surface, and the lower surface of the semiconductor device 430, and it can be understood that the breakdown voltage is maintained on the upper surface, the side surface, and the lower surface of the semiconductor device 430. In addition, as above, since the breakdown voltage is maintained on the upper surface, the side surface, and the lower surface, compared to a case where the breakdown voltage is acquired by distributing equipotential lines only in the termination region on one of the upper surface side and the lower surface side, the thickness (e.g., a dimension in a direction from the center of the semiconductor device to the outer periphery) of the termination region can be decreased, whereby the size of the semiconductor device can be decreased.

From the result illustrated in FIG. 45, it can be understood that the electric potential is distributed to be approximately symmetrical in the Z direction. Thus, according to some embodiments (e.g., the embodiment illustrated in FIG. 44), the breakdown voltage can be maintained on the upper surface, the side surface, and the lower surface of the semiconductor device 430 regardless of the direction of the breakdown voltage between the collector electrode 90 and the emitter electrode 91a.

Figure 46:
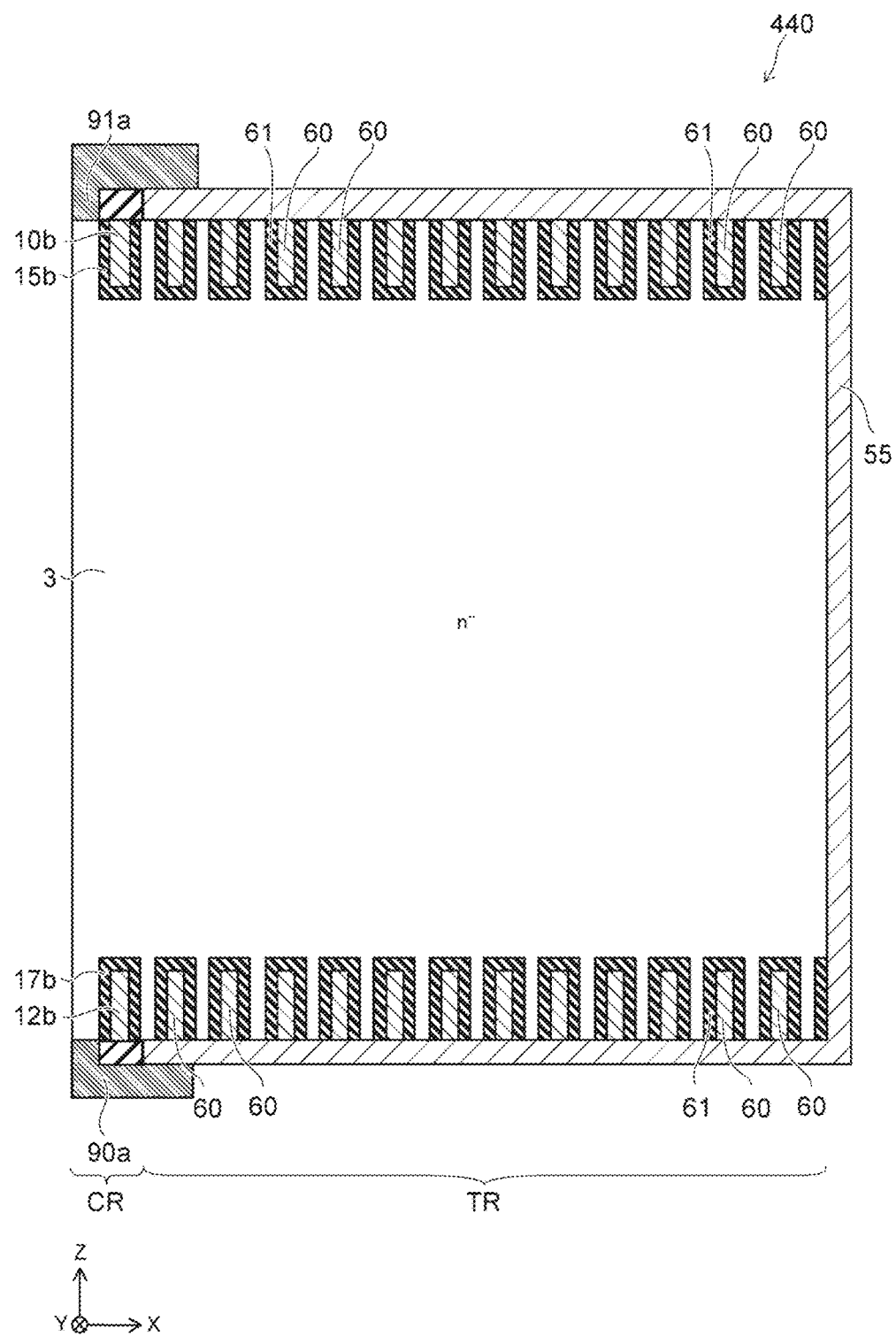
FIG. 46 is a cross-sectional view that illustrates a part of a semiconductor device according to some embodiments.

FIG. 46 is a cross-sectional view that illustrates a part of a semiconductor device 440 according to some embodiments.

In FIG. 46, semiconductor regions other than the n⁻ type semiconductor region 3 disposed in the element region CR is not illustrated.

In some embodiments, in the semiconductor device 440, a semi-insulating layer 55 covering the termination region TR is disposed, which is different from the semiconductor device 430.

In some embodiments, the semi-insulating layer 55 is disposed on the upper surface, the side surface, and the lower surface of the termination region TR and is connected to each conduction part 60. In some embodiments, one end of the semi-insulating layer 55 is connected to the emitter electrode 91a, and the other end thereof is connected to the collector electrode 90.

In some embodiments, the semi-insulating layer 55 is a resistive field plate and has a function for uniformly distributing the electric potential of the conduction parts 60 in the termination region TR in the thickness direction of the termination region TR and suppressing the concentration of the electric field on the upper surface and the lower surface of the termination region TR at the time of applying the breakdown voltage.

An effect of the embodiment illustrated in FIG. 46 will be described with reference to FIG. 47.

Figure 47:
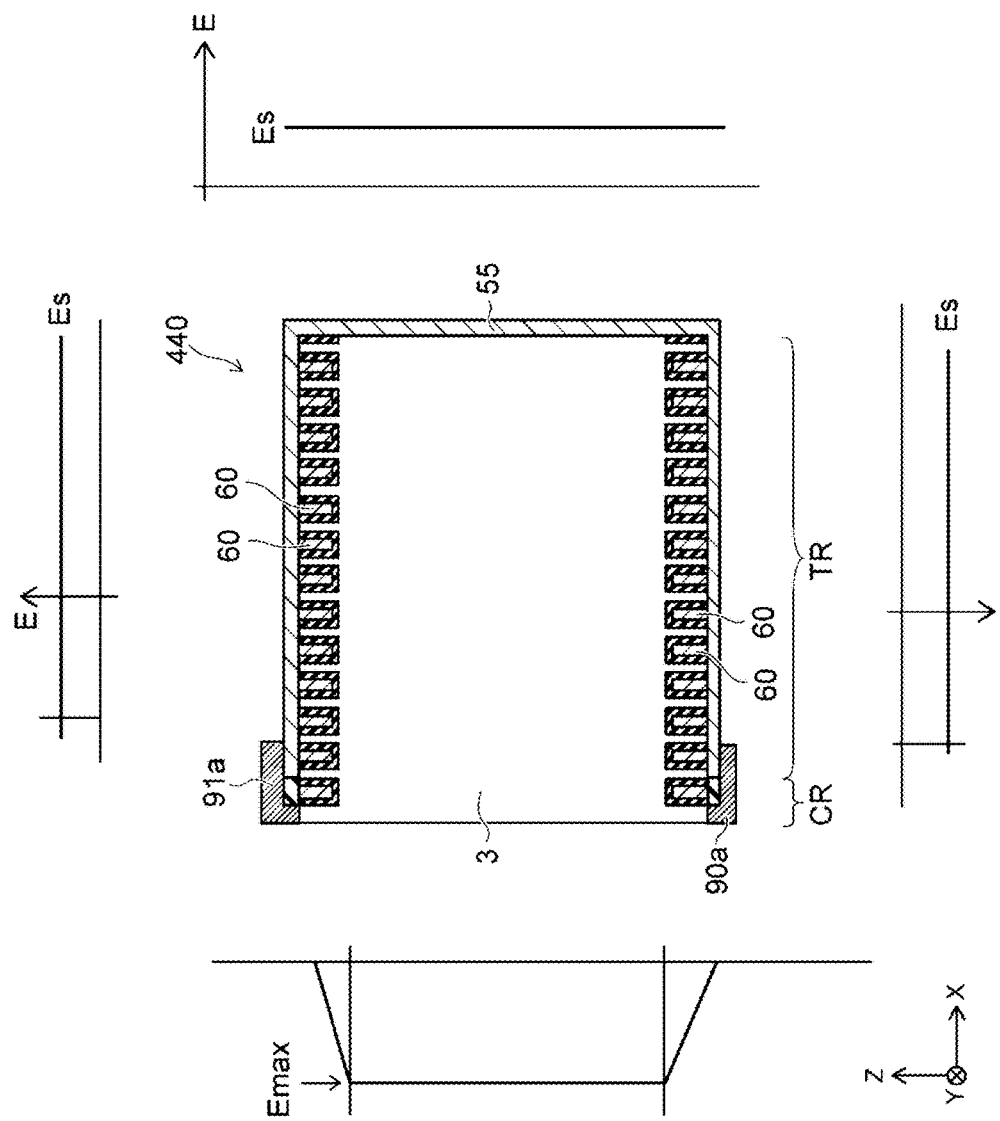
FIG. 47 represents a cross-sectional view that illustrates a part of the semiconductor device according to some embodiments, and a graph illustrating electric potential of each part.

FIG. 47 represents a cross-sectional view that illustrates a part of the semiconductor device 440 according to some embodiments and a graph showing electric potential of each part.

In FIG. 47, on the upper side of the cross-sectional view, the intensity of the electric field on the upper surface side (e.g., the emitter electrode 91a side) of the semiconductor device 430 is illustrated, and, on the lower side, the intensity of the electric field on the lower surface side (e.g., the collector electrode 90 side) of the semiconductor device 430 is illustrated. In addition, on the right side of the cross-sectional view, the intensity of the electric field on the end surface of the semiconductor device 430 is illustrated, and, on the left side, the intensity of the electric field in the element region CR of the semiconductor device 430 is illustrated.

In some embodiments, the semiconductor device 440 has a structure that is symmetrical in the Z direction and has a structure of the punch-through type in which the depletion layer spreads over the entire surface of the n⁻ type semiconductor region 3. For this reason, as illustrated in a graph disposed on the left side in FIG. 47, the intensity of the electric field in the element region CR is almost constant to be Emax in the Z direction.

In some embodiments, in the termination region TR, since the semi-insulating layer 55 is disposed, similarly to the semiconductor device 400, a current flows in the semi-insulating layer 55 from the collector electrode 90 toward the emitter electrode 91a. At this time, the electric potential of the conduction part 60 is equal to the electric potential of each part of the semi-insulating layer 55, and accordingly, the electric potential in the n⁻ type semiconductor region 3 in the termination region TR can be uniformly distributed.

For this reason, as illustrated in the graphs disposed on the upper side, the right side, and the lower side of FIG. 47, the intensity of the electric field in the termination region TR is almost constant to be Es along each surface. Here, Es is a value smaller than Emax.

In some embodiments, since the semiconductor device 440 has a symmetrical structure in the Z direction, the uniform distribution of the electric potential in the termination region TR can be acquired regardless of the direction of the breakdown voltage of the semiconductor device 440.

In this way, according to some embodiments (e.g., the embodiment illustrated in FIG. 47), the concentration of the electric field in the termination region TR can be further alleviated regardless of the direction of the breakdown voltage, and accordingly, the breakdown voltage of the semiconductor device can be increased. In some embodiments, by decreasing the thickness of the termination region TR in correspondence with the alleviation of the concentration of the electric field in the termination region TR, the size of the semiconductor device can be decreased.

Figure 48:
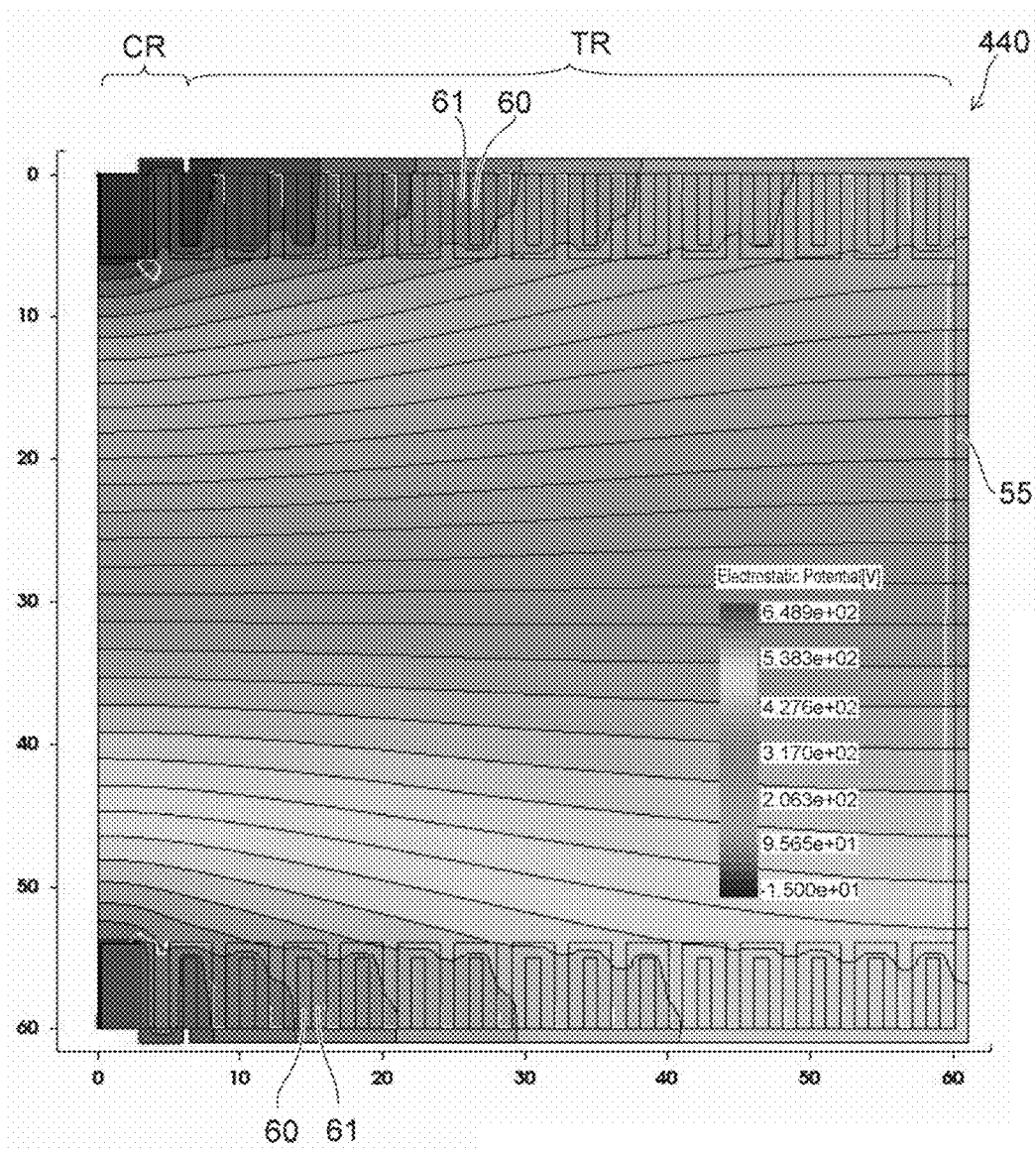
FIG. 48 is a simulation result of the semiconductor device according to some embodiments.
Figure 49:
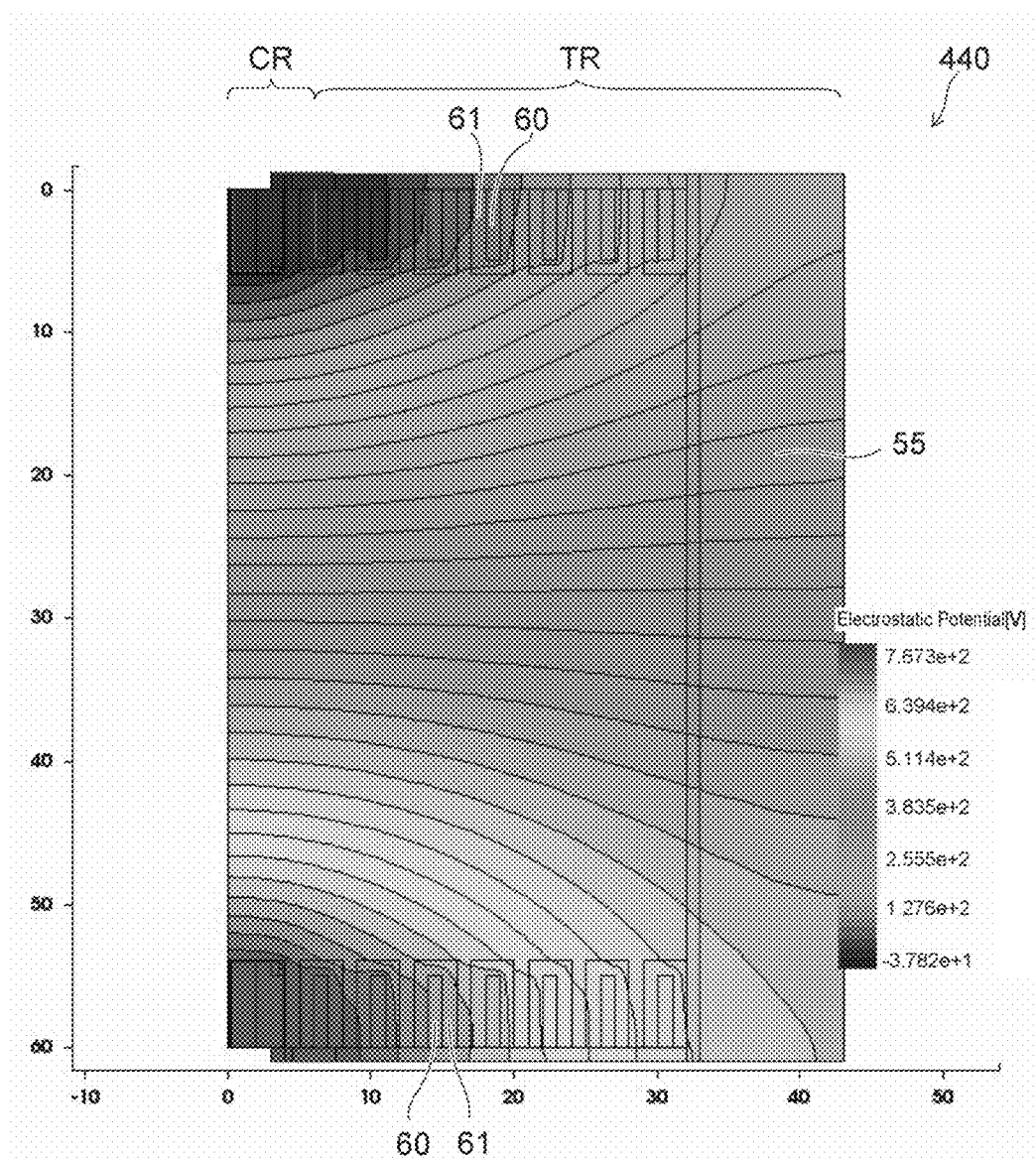
FIG. 49 is a simulation result of the semiconductor device according to some embodiments.

FIG. 48 and FIG. 49 are simulation results of the semiconductor device 440 according to some embodiments.

In FIG. 48 and FIG. 49, the distributions of the electric potential in the termination region TR of the semiconductor device 440 are illustrated. In FIG. 48 and FIG. 49, similar to FIG. 45, on the upper side from the center of the semiconductor device 440 in the Z direction, a darker color represents lower electric potential, and, on the lower side from the center, a darker color represents higher electric potential.

In some embodiments, the thickness of the semi-insulating layer 55 disposed on the side surface of the semiconductor device 440 is different between the cases illustrated in FIG. 48 and FIG. 49. In some embodiments, in the semiconductor device illustrated in FIG. 48, the thickness of the semi-insulating layer 55 disposed on the upper surface, the side surface, and the lower surface of the termination region TR is constant. In some embodiments, in the semiconductor device illustrated in FIG. 49, the thickness of the semi-insulating layer 55 disposed on the side surface of the termination region TR is larger than the thickness of the semi-insulating layer 55 disposed on the upper surface and the lower surface.

In some embodiments, as illustrated in FIG. 48, in a case where the thickness of the semi-insulating layer 55 is constant, the voltage uniformly decreases on the upper surface, the side surface, and the lower surface of the termination region TR. In some embodiments, as illustrated in FIG. 49, in a case where the semi-insulating layer 55 of the side surface is thick, the electric resistance of the semi-insulating layer 55 on the side surface is lower than that of any the other portion. As a result, a voltage drop on the side surface is decreased, and the intensity of the electric field is decreased. For this reason, according to the configuration illustrated in FIG. 49, also in a case where the side surface of the semiconductor device is roughly formed through processing such as dicing, the electric field on the side surface can be decreased, whereby a leak current flowing through the side surface can be decreased.

Figure 50:
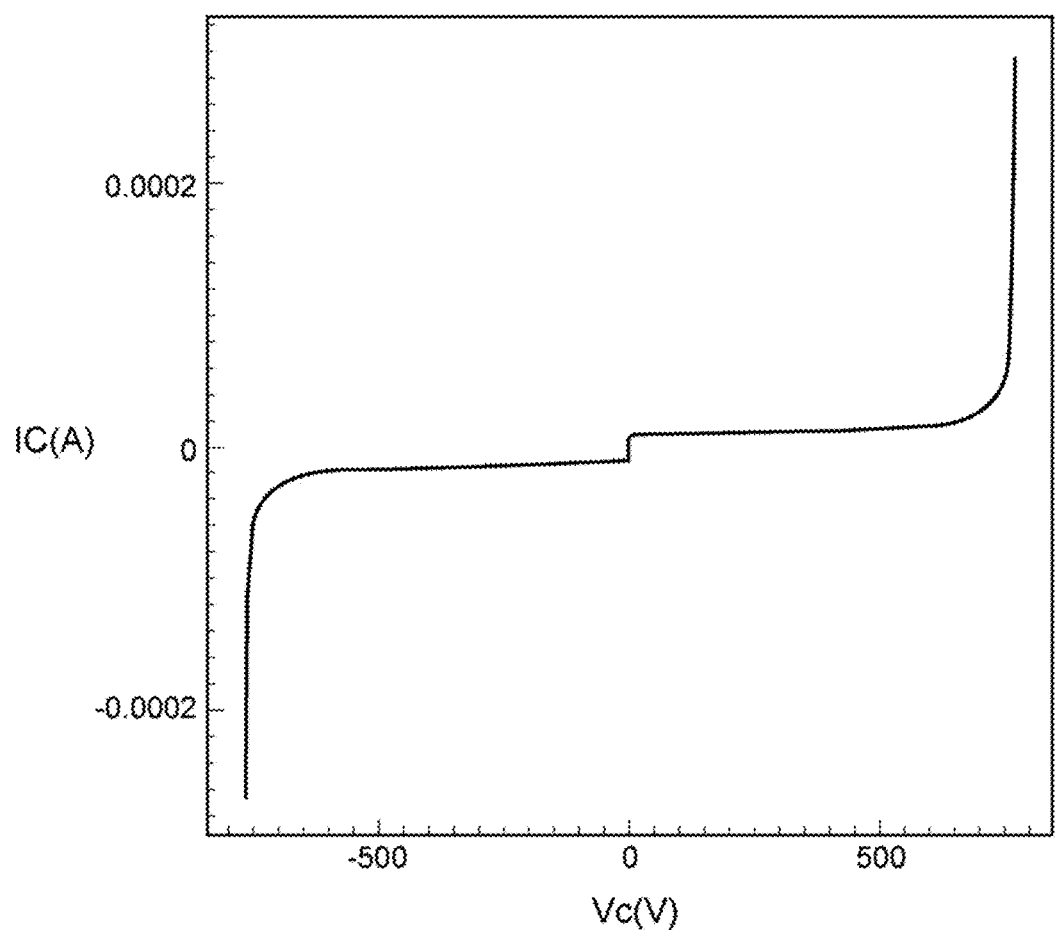
FIG. 50 is a simulation result that illustrates the waveform of a breakdown voltage of the semiconductor device according to some embodiments.

FIG. 50 is a simulation result that illustrates the waveform (e.g., I-V characteristics) of a breakdown voltage of the semiconductor device 440 according to some embodiments.

In FIG. 50, an example of a calculation result in a case where the semiconductor device is configured to secure a breakdown voltage of 700 V with the n-type impurity concentration in the n⁻ type semiconductor region 3 set to $1.0 \times 10^{13}$ cm⁻³ and the thickness of the n⁻ type semiconductor region 3 in the Z direction set to 48 μm is illustrated.

From the result illustrated in FIG. 50, it can be understood that a breakdown voltage of 700 V or higher can be acquired regardless of the breakdown voltage maintaining direction.

Figure 51:
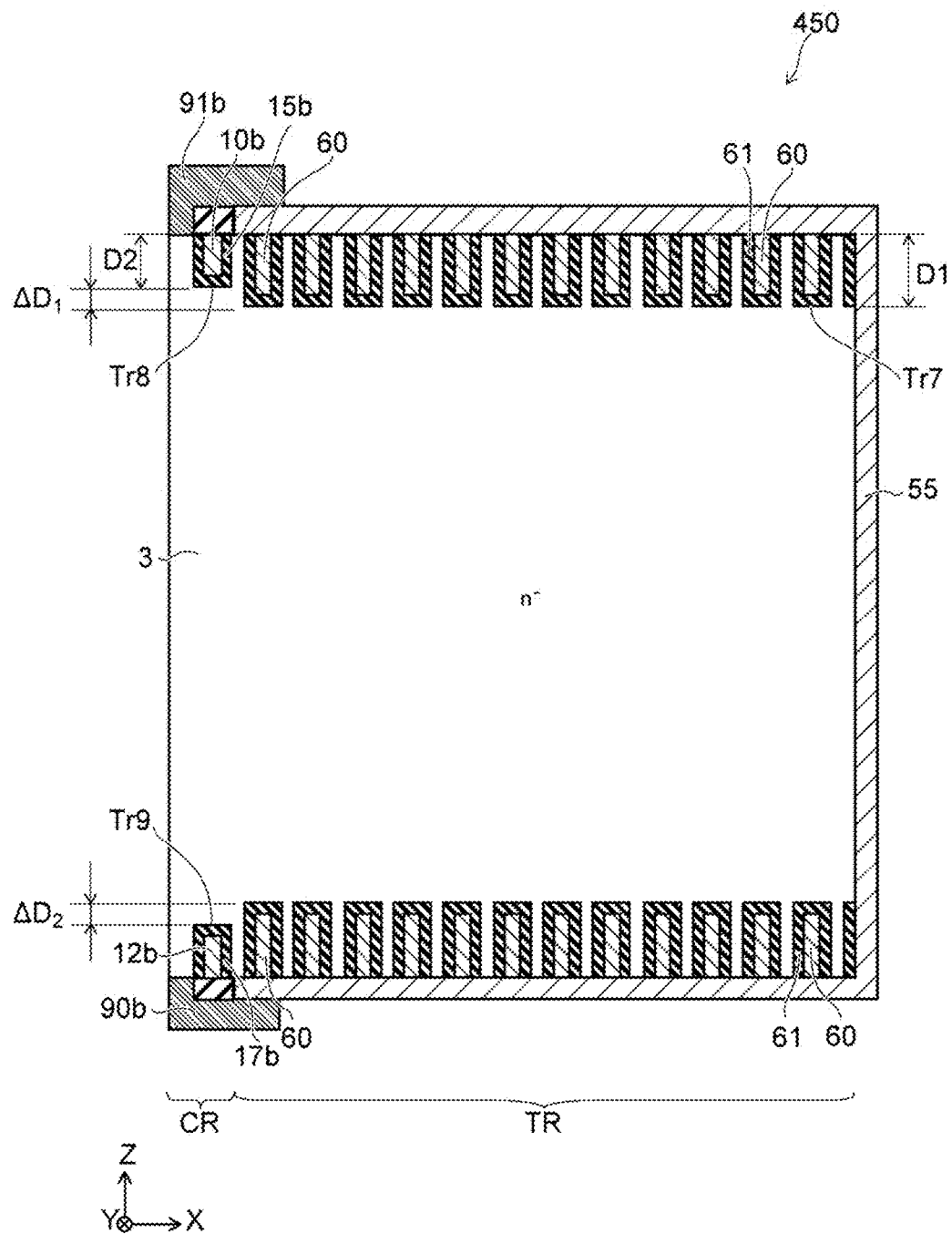
FIG. 51 is a cross-sectional view that illustrates a part of a semiconductor device according to some embodiments.

FIG. 51 is a cross-sectional view that illustrates a part of a semiconductor device 450 according to some embodiments.

In FIG. 51, semiconductor regions other than the n⁻ type semiconductor region 3 disposed in the element region CR are not illustrated.

In some embodiments, in the semiconductor device 450, the depth (e.g., a dimension in the Z direction) D1 of a trench Tr7 in which the conduction part 60 is disposed is larger than the depth D2 of a trench Tr8 in which the gate electrode 10b is disposed and the depth D3 (not shown) of a trench Tr9 in which the gate electrode 12b is disposed, which is difference from the semiconductor device 440.

In some embodiments, the depth D1 of the trench Tr7 is larger than each of the depths D2 and D3 of the trenches Tr8 and Tr9 formed most to the termination region TR side of the element region CR.

The relation among the depths of the trenches, for example, is illustrated to be similar to a relation among the dimensions of the conduction part 60, the gate electrode 10b, and the gate electrode 12b in the Z direction. In some embodiments, in the semiconductor device 450, the length of the conduction part 60 in the Z direction is longer than each of the length of the gate electrode 10b in the Z direction and the length of the gate electrode 12b in the Z direction.

Since the trench Tr7 is disposed to be deeper than the trenches Tr8 and Tr9, the concentration of the electric field on the outer periphery (e.g., a boundary region of the element region CR and the termination region TR) of the element region CR is alleviated, and the breakdown voltage of the semiconductor device can be further increased.

In some embodiments, all the trenches Tr7 do not need to be formed to be deeper than the trenches Tr8 and Tr9. For example, among a plurality of trenches Tr7 formed in the termination region TR, only a trench Tr7 positioned most to the element region CR side may be formed to be deeper than the trenches Tr8 and Tr9. In addition, the trenches Tr7 may be different from each other in depth.

In some embodiments, a difference $\Delta D_1$ between the depths D1 and D2 may be ⅕ times the width (e.g., a dimension in the X direction) of the trench Tr8 or more. In some embodiments, a difference $\Delta D_2$ between the depths D1 and D3 may be ⅕ times the width of the trench Tr9 or more.

According to such a structure, the breakdown voltage of the semiconductor device can be further increased.

Figure 52:
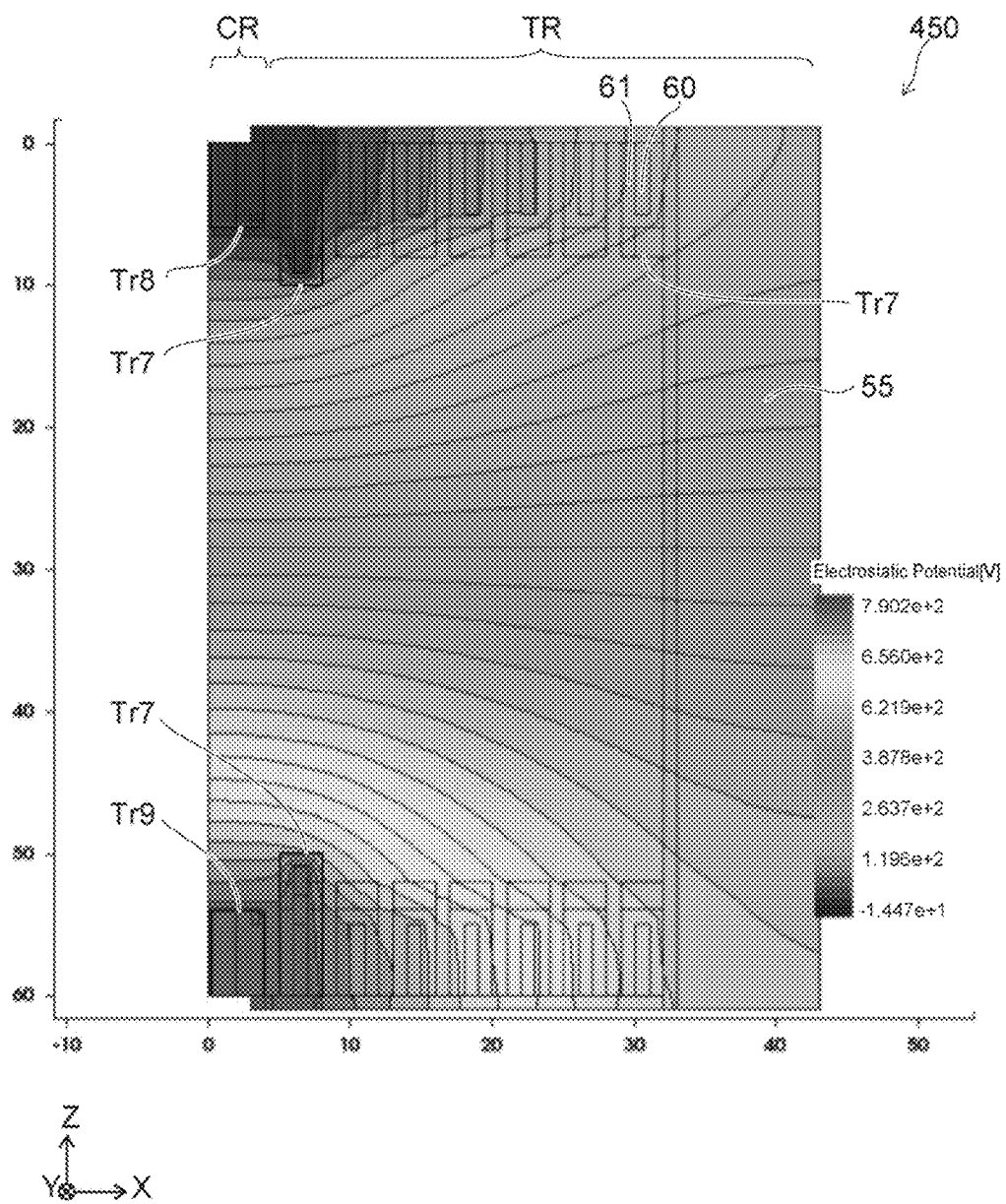
FIG. 52 is a simulation result of the semiconductor device according to some embodiments.

FIG. 52 is a simulation result of the semiconductor device 450 according to some embodiments.

In some embodiments, in the semiconductor device used for the simulation illustrated in FIG. 52, all the tranches Tr7 disposed in the termination region TR are formed to be deeper than the trenches Tr8 and Tr9. In some embodiments, the trench Tr7 closest to the element region CR side of the termination region TR is formed to be further deeper than the other trenches Tr7.

From the simulation result illustrated in FIG. 52, the appearance in which the equipotential lines are raised to the center side of the n⁻ type semiconductor region 3 in the Z direction by the trench Tr7 closest to the element region CR side of the termination region TR can be acquired. From this result, it can be understood that, according to some embodiments (e.g., the embodiment illustrated in FIG. 51), the concentration of the electric field on the outer periphery of the element region CR is alleviated, and the breakdown voltage of the semiconductor device can be improved.

In each example described above, while a case where the semiconductor device according to some embodiments (e.g., the embodiments illustrated in FIGS. 1-35) is disposed in the element region CR has been described, the semiconductor device according to some embodiments is not limited thereto. For example, in the element region CR, an element having a single function such as a diode, a MOSFET, or an IGBT may be disposed. Also in such a case, by disposing each configuration described above in the termination region TR, deviations in the distribution of the electric field on the outer periphery of the semiconductor device are alleviated, and accordingly, the breakdown voltage of the semiconductor device can be increased.

Figure 53:
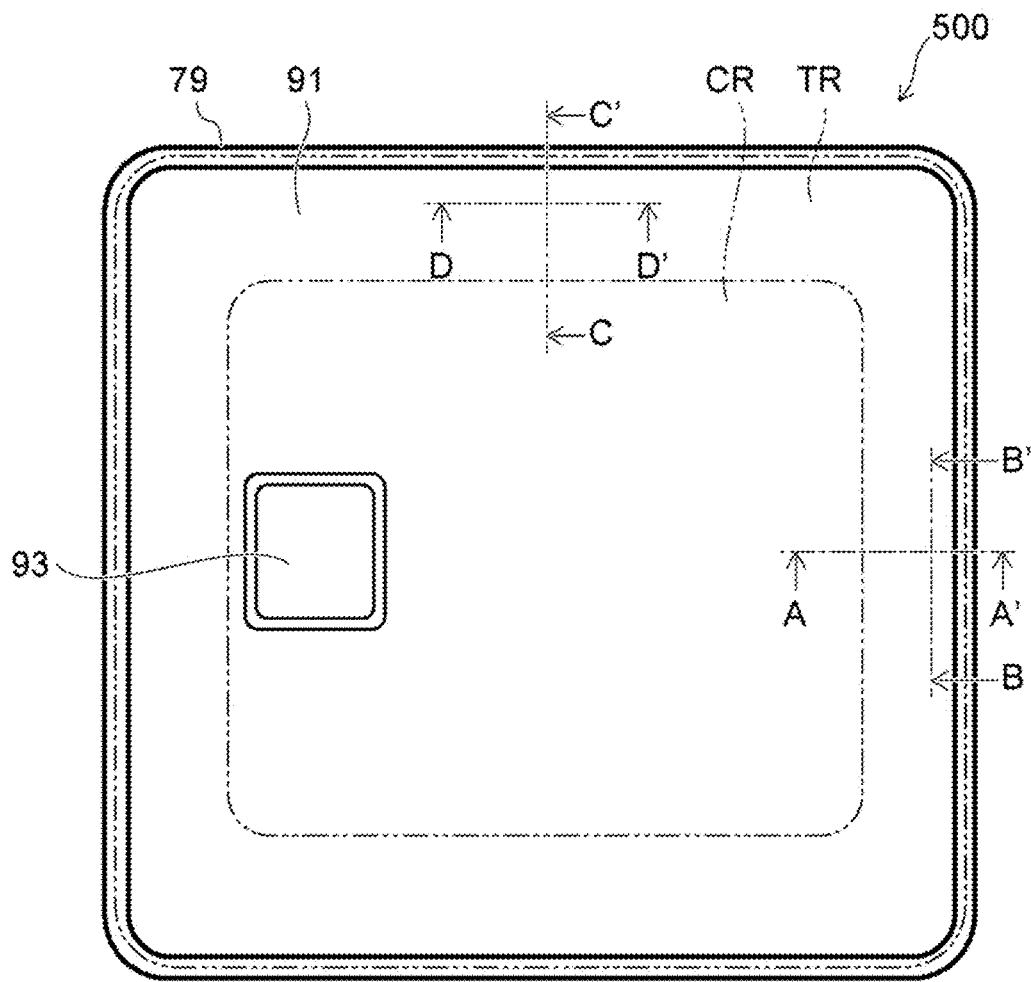
FIG. 53 is a plan view that illustrates a semiconductor device according to some embodiments.

FIG. 53 is a plan view that illustrates a semiconductor device 500 according to some embodiments.

Figure 54A:
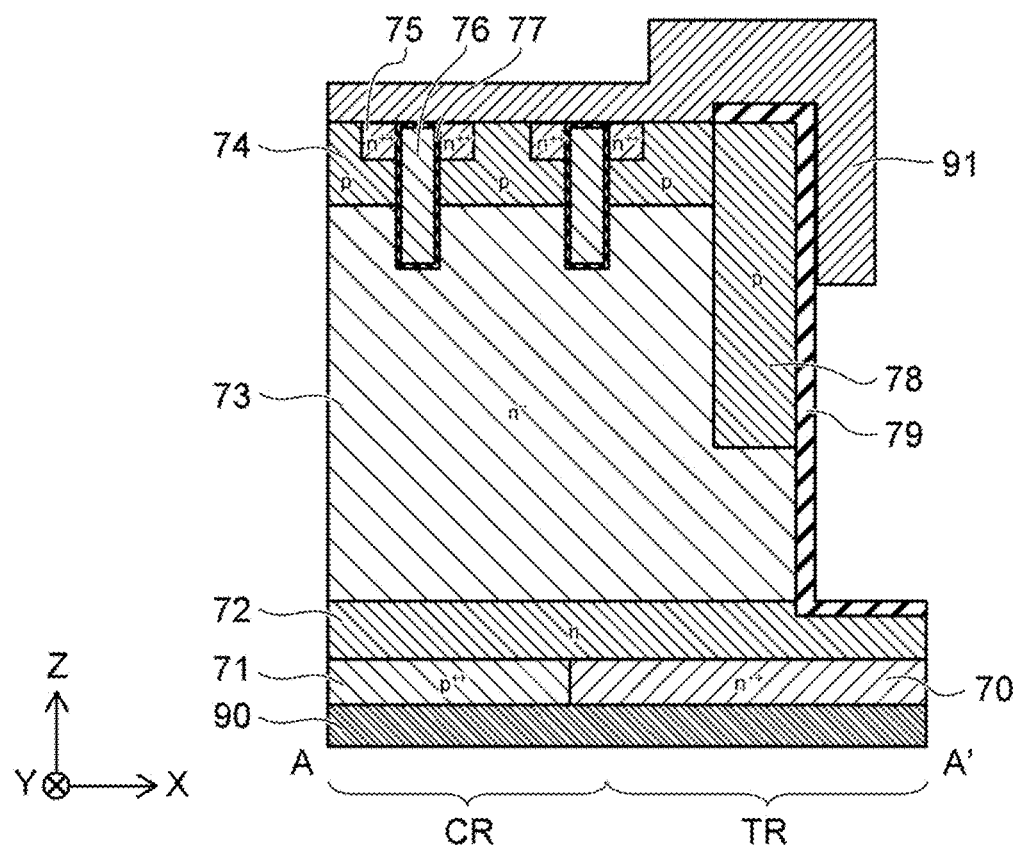
FIG. 54A is a cross-sectional view taken along line A-A' illustrated in FIG. 53.
Figure 54B:
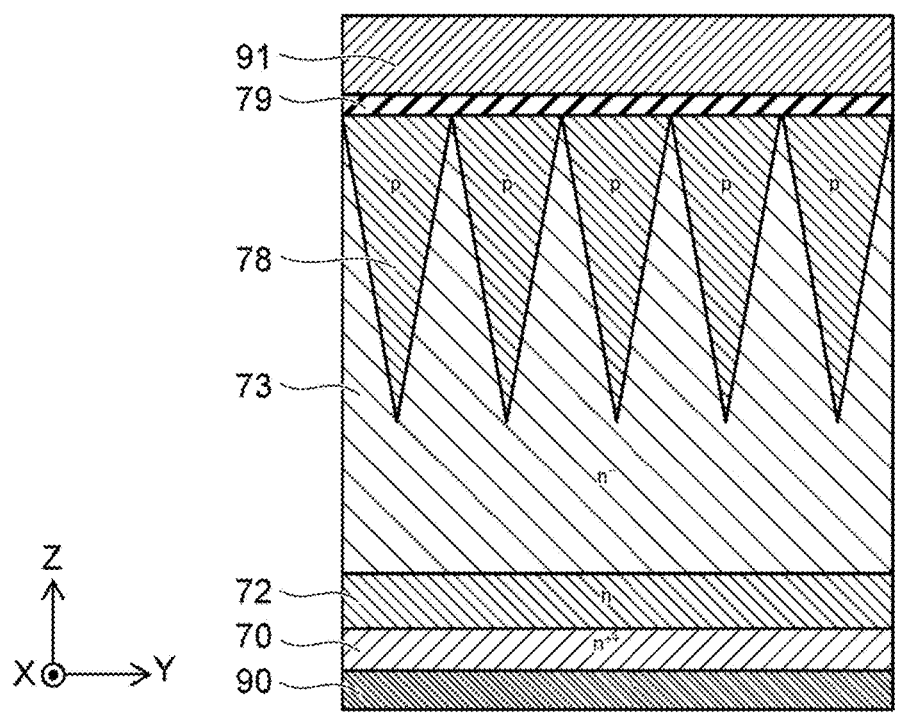
FIG. 54B is a cross-sectional view taken along line B-B' illustrated in FIG. 53.

FIG. 54A is a cross-sectional view taken along line A-A' illustrated in FIG. 53, and FIG. 54B is a cross-sectional view taken along line B-B' illustrated in FIG. 53.

Figure 55A:
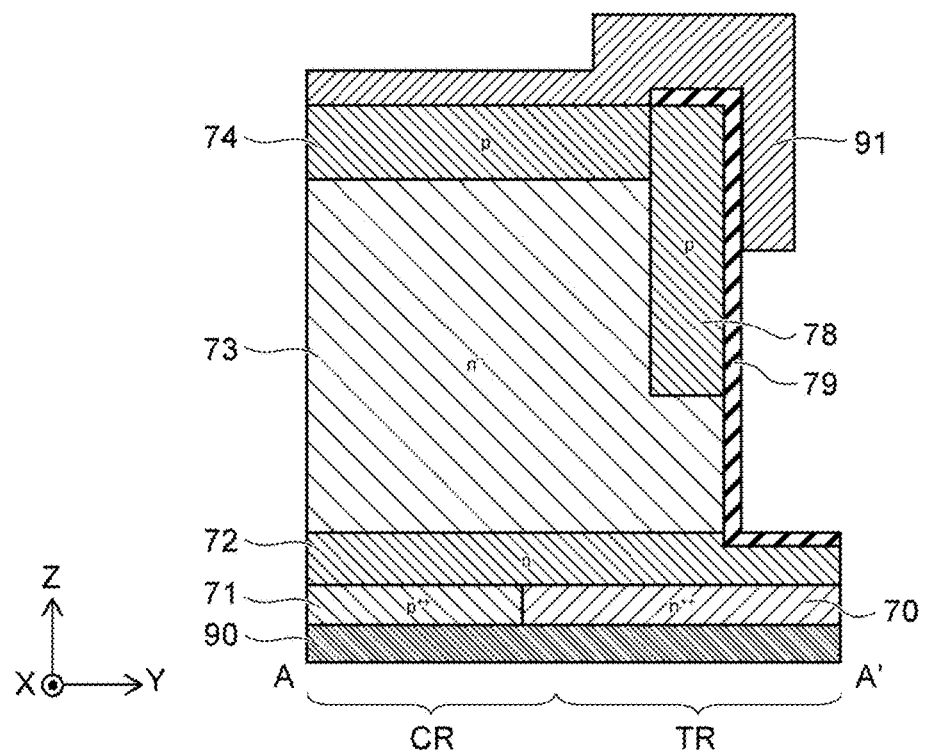
FIG. 55A is a cross-sectional view taken along line C-C' illustrated in FIG. 53.
Figure 55B:
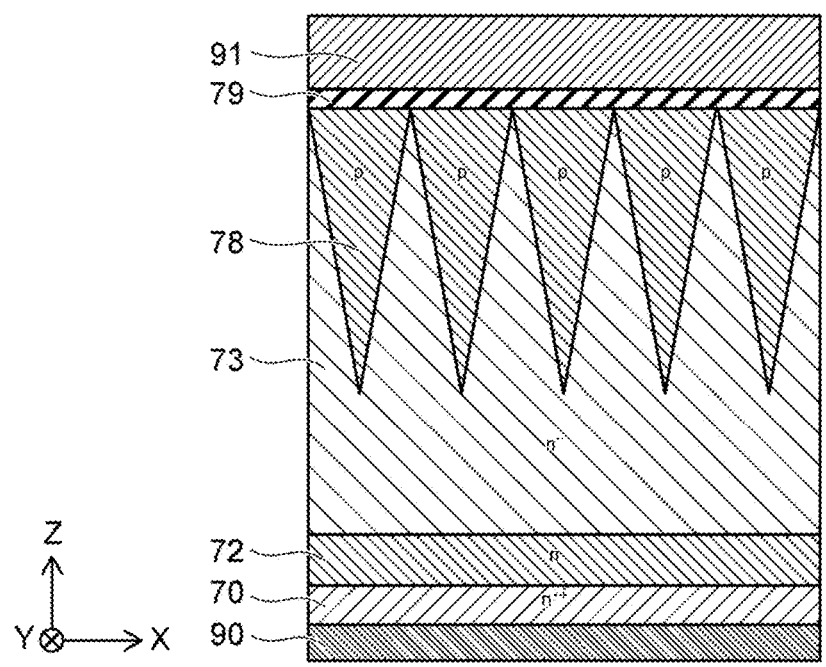
FIG. 55B is a cross-sectional view taken along line D-D' illustrated in FIG. 53.

FIG. 55A is a cross-sectional view taken along line C-C' illustrated in FIG. 53, and FIG. 55B is a cross-sectional view taken along line D-D' illustrated in FIG. 53.

The semiconductor device 500, for example, is an IGBT.

In some embodiments, as illustrated in FIGS. 53 to 55B, the semiconductor device 500 includes an n⁺⁺ type contact region 70, a p⁺⁺ type collector region 71, an n-type buffer region 72; an n⁻ type semiconductor region 73, a p-type base region 74; an n⁺⁺ type emitter region 75, a gate electrode 76; a gate insulating layer 77, a p-type semiconductor region 78; an insulating layer 79, a collector electrode 90, an emitter electrode 91, and a gate pad 93.

In some embodiments, as illustrated in FIG. 53, an element region CR is surrounded by a termination region TR.

In some embodiments, the emitter electrode 91 and the gate pad 93 are disposed on the upper surface of the semiconductor device 500 to be separated from each other.

In some embodiments, as illustrated in FIG. 54 and FIG. 55, the collector electrode 90 is disposed on the lower surface of the semiconductor device 500.

In some embodiments, the n⁺⁺ type contact region 70 is disposed on the collector electrode 90 in the termination region TR.

In some embodiments, the p⁺⁺ type collector region 71 is disposed on the collector electrode 90 in the element region CR.

In some embodiments, the n⁺⁺ type contact region 70 and the p⁺⁺ type collector region 71 are electrically connected to the collector electrode 90.

In some embodiments, the n-type buffer region 72 is disposed on the n⁺⁺ type contact region 70 and the p⁺⁺ type collector region 71.

In some embodiments, the n⁻ type semiconductor region 73 is disposed on the n-type buffer region 72.

In some embodiments, the p-type base region 74 is disposed on the n⁻ type semiconductor region 73.

In some embodiments, the n⁺⁺ type emitter region 75 is selectively disposed on the p-type base region 74.

In some embodiments, the gate electrode 76 is disposed in the n⁻ type semiconductor region 73 and the p-type base region 74 via the gate insulating layer 77. The p-type base region 74 and the n⁺⁺ type emitter region 75 face the gate electrode 76 via the gate insulating layer 77 in the X direction.

In some embodiments, a plurality of the p-type base regions 74, a plurality of the n⁺⁺ type emitter regions 75, and a plurality of the gate electrodes 76 are disposed in the X direction and extend in the Y direction.

In some embodiments, the p-type semiconductor region 78 is disposed on the n⁻ type semiconductor region 73 in the termination region TR and surrounds the p-type base region 74, the n⁺⁺ type emitter region 75, and the gate electrode 76. In some embodiments, the p-type semiconductor region 78 is disposed to be deeper than the p-type base region 74.

In some embodiments, the insulating layer 79 is disposed on the outer periphery of the n-type buffer region 72, on the periphery of the n⁻ type semiconductor region 73 and the p-type semiconductor region 78, and on the p-type semiconductor region 78.

In some embodiments, the emitter electrode 91 is disposed on the p-type base region 74 and the n⁺⁺ type emitter region 75 and is electrically connected to such semiconductor regions. In some embodiments, between the gate electrode 76 and the emitter electrode 91, the gate insulating layer 77 is disposed, and such electrodes are electrically separated from each other.

In some embodiments, a part of the emitter electrode 91 is positioned also in the termination region TR and is disposed on the periphery of the p-type semiconductor region 78 via the insulating layer 79.

In some embodiments, as illustrated in FIG. 54B and FIG. 55B, a part of the n⁻ type semiconductor region 73 and the p-type semiconductor region 78 are alternately disposed on the outer periphery of the semiconductor device 500 along the peripheral direction. In some embodiments, the length of the p-type semiconductor region 78 in a direction from the element region CR toward the termination region TR decreases toward the lower side.

For this reason, the p-type impurity amount included in the p-type semiconductor region 78, at each position in the Z direction, increases toward the upper side and decreases toward the lower side. In addition, the n-type impurity amount included in the n⁻ type semiconductor region 73 positioned between the p-type semiconductor regions 78, at each position in the Z direction, decreases toward the upper side and increases toward the lower side.

In some embodiments, in a case where the semiconductor device 500 is turned off, and a positive voltage with respect to the emitter electrode 91 is applied to the collector electrode 90, depletion layers spread from a pn function surface between the n⁻ type semiconductor region 73 and the p-type base region 74 and a pn junction surface between the n⁻ semiconductor region 73 and the p-type semiconductor region 78.

At this time, from the pn junction surface between the n⁻ type semiconductor region 73 and the p-type semiconductor region 78, the depletion layer spreads also in the horizontal direction.

As described above, in some embodiments, the p-type impurity amount included in the p-type semiconductor region 78 decreases toward the lower side, and the n-type impurity amount of the n⁻ type semiconductor region 73 between the p-type semiconductor regions 78 decreases toward the lower side.

For this reason, the electric potential at each point between the n⁻ type semiconductor region 73 and the p-type semiconductor region 78 is gradually lowered from the upper side toward the lower side. Conventionally, the concentration of the electric field in the termination region TR is alleviated toward the in-plane direction by increasing the area of the termination region TR. According to the semiconductor device of some embodiments (e.g., the embodiments illustrated in FIGS. 53-55B), the concentration of the electric field in the termination region TR can be alleviated in the vertical direction by using the p-type semiconductor region 78.

Therefore, according to some embodiments (e.g., the embodiments illustrated in FIGS. 53-55B), the area of the termination region of the semiconductor device is decreased, and the size of the semiconductor device can be decreased.

In each example described above, while a case where the semiconductor device according to some embodiments is the IGBT has been described, the semiconductor device according to some embodiments (e.g., the embodiments illustrated in FIGS. 53-55B) may be a diode, a MOSFET, or the like in the element region CR. Also in such a semiconductor device, by disposing the p-type semiconductor region 78 in the termination region TR, the concentration of the electric field on the outer periphery of the semiconductor device is alleviated in the vertical direction, whereby the size of the semiconductor device can be decreased.

In each embodiment described above, the relative impurity concentrations of the semiconductor regions can be checked, for example, using a scanning capacitance microscopy (SCM). The carrier concentration in each semiconductor region may be regarded to be the same as the impurity concentration of impurities activated in each semiconductor region. Thus, the relative carrier concentrations of the semiconductor regions can be checked using the SCM.

In some embodiments, the impurity concentration in each semiconductor region can be measured, for example, using secondary ion mass spectrometry (SIMS).

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. For example, a specific configuration of each element such as the n⁺⁺ type collector region 1, the n-type barrier region 2, the n⁻ type semiconductor region 3, the n-type barrier region 4, the p-type base region 5, the n⁺⁺ type contact region 6, the p⁺⁺ type contact region 7, the gate electrodes 10 to 13 and 40 to 45, the gate insulating layers 15 to 18 and 40S to 45S, the n⁻ type semiconductor region 30, the p-type base region 31, the n⁺⁺ type contact region 32, the n-type barrier region 33, the p⁺⁺ type contact region 34, the n⁺⁺ type contact region 35, the p-type semiconductor region 50, the p⁺ type semiconductor region 51, the p⁺⁺ type semiconductor region 52, the insulating layer 54, the semi-insulating layer 55, the n-type semiconductor region 56, the n⁺ type semiconductor region 57, the n⁺⁺ type semiconductor region 58, the conduction part 60, the insulating layer 61, the n⁺⁺ type contact region 70, the p⁺⁺ type collector region 71, the n-type buffer region 72, the n⁻ type semiconductor region 73, the p-type base region 74, the n⁺⁺ type emitter region 75, the gate electrode 76, the gate insulating layer 77, the p-type semiconductor region 78, the insulating layer 79, the collector electrode 90, the emitter electrode 91, the metal layer 92, the gate pad 93, or the like may be appropriately selected from technologies by a person skilled in the art. Such embodiments and modifications thereof belong to the scope and spirit of the present disclosure and belong to the scope of the present disclosure described in the claims and the equivalents thereof. In addition, the embodiments described above may be combined together.

What is claimed is:

1. A semiconductor device comprising:
a first electrode;
a first semiconductor region of a first conductivity type that is disposed on the first electrode and is electrically connected to the first electrode;
a second semiconductor region of the first conductivity type that is disposed on the first semiconductor region and has a carrier concentration of the first conductivity type lower than a carrier concentration of the first semiconductor region;
a third semiconductor region of a second conductivity type that is disposed on the second semiconductor region;
a fourth semiconductor region of the first conductivity type that is disposed on the third semiconductor region;
a second electrode that is disposed on the fourth semiconductor region and is electrically connected to the fourth semiconductor region;
a fifth semiconductor region of the second conductivity type that is disposed on the second semiconductor region and is separated from the third semiconductor region in a first direction;
a third electrode that is disposed on the fifth semiconductor region, is separated from the second electrode, and is electrically connected to the fifth semiconductor region;
a first gate insulating layer;
a first gate electrode that is disposed on the second semiconductor region, faces the third semiconductor region via the first gate insulating layer in the first direction, and is positioned between the third semiconductor region and the fifth semiconductor region;
a sixth semiconductor region of the first conductivity type that is disposed between the second semiconductor region and the third semiconductor region and has a carrier concentration of the first conductivity type higher than the carrier concentration of the second semiconductor region; and
a seventh semiconductor region of the first conductivity type that is disposed between the second semiconductor region and the fifth semiconductor region and has a carrier concentration of the first conductivity type higher than the carrier concentration of the second semiconductor region.

2. The semiconductor device according to claim 1, further comprising:
a second gate insulating layer; and
a second gate electrode that is disposed between the fifth semiconductor region and the first gate electrode and faces the fifth semiconductor region via the second gate insulating layer.

3. The semiconductor device according to claim 1, wherein a voltage different from a voltage of the second electrode is applied to the third electrode.

4. A semiconductor device comprising:
a first electrode;
a first semiconductor region of a first conductivity type that is disposed on the first electrode and is electrically connected to the first electrode;
a second semiconductor region of the first conductivity type that is disposed on the first semiconductor region and has a carrier concentration of the first conductivity type lower than a carrier concentration of the first semiconductor region;
a third semiconductor region of a second conductivity type that is disposed on the second semiconductor region;
a fourth semiconductor region of the first conductivity type that is disposed on the third semiconductor region;
a second electrode that is disposed on the fourth semiconductor region and is electrically connected to the fourth semiconductor region;
a fifth semiconductor region of the second conductivity type that is disposed on the second semiconductor region and is separated from the third semiconductor region in a first direction;
a third electrode that is disposed on the fifth semiconductor region, is separated from the second electrode, and is electrically connected to the fifth semiconductor region;
a first gate insulating layer;
a first gate electrode that is disposed on the second semiconductor region, faces the third semiconductor region via the first gate insulating layer in the first direction, and is positioned between the third semiconductor region and the fifth semiconductor region;
a first insulating part that is disposed on the second semiconductor region, is positioned between the third semiconductor region and the fifth semiconductor region in the first direction, and includes the first gate insulating layer;
a second insulating part that is disposed on the second semiconductor region, the third semiconductor region being positioned between the first insulating part and the second insulating part in the first direction; and
a third insulating part that is disposed on the second semiconductor region, the fifth semiconductor region being positioned between the first insulating part and the third insulating part in the first direction,
wherein a distance between at least a part of the first insulating part and at least a part of the second insulating part in the first direction is 1.0 μm or less, and
a distance between at least a part of the first insulating part and at least a part of the third insulating part in the first direction is 1.0 μm or less.

5. A semiconductor device comprising:
first electrode;
a first semiconductor region of a first conductivity type that is disposed on the first electrode and is electrically connected to the first electrode;
a second semiconductor region of the first conductivity type that is disposed on the first semiconductor region and has a carrier concentration of the first conductivity type lower than a carrier concentration of the first semiconductor region;
a third semiconductor region of a second conductivity type that is disposed on the second semiconductor region;
a fourth semiconductor region of the first conductivity type that is disposed on the third semiconductor region;
a second electrode that is disposed on the fourth semiconductor region and is electrically connected to the fourth semiconductor region;
a fifth semiconductor region of the second conductivity type that is disposed on the second semiconductor region and is separated from the third semiconductor region in a first direction;
a third electrode that is disposed on the fifth semiconductor region, is separated from the second electrode, and is electrically connected to the fifth semiconductor region;

a first gate insulating layer;

a first gate electrode that is disposed on the second semiconductor region, faces the third semiconductor region via the first gate insulating layer in the first direction, and is positioned between the third semiconductor region and the fifth semiconductor region;

second insulating part that is disposed on the second semiconductor region, the third semiconductor region being positioned between the first insulating part and the second insulating part in the first direction; and a third insulating part that is disposed on the second semiconductor region, the fifth semiconductor region being positioned between the first insulating part and the third insulating part in the first direction, wherein a distance between at least a part of the first insulating part and at least a part of the second insulating part in the first direction is 1.0 µm or less, and a distance between at least a part of the first insulating part and at least a part of the third insulating part in the first direction is 1.0 µm or less, wherein a length of the first insulating part in the first direction is two times the distance between the part of the first insulating part and the part of the second insulating part or more and is twice the distance between the part of the first insulating part and the part of the third insulating part or more.

* * * * *